(12) United States Patent
Choi et al.

(10) Patent No.: US 7,952,048 B2
(45) Date of Patent: May 31, 2011

(54) PLASMA SOURCE WITH DISCHARGE INDUCING BRIDGE AND PLASMA PROCESSING SYSTEM USING THE SAME

(75) Inventors: Dae-Kyu Choi, Suwon-si (KR); Soon-Im Wi, Suwon-si (KR)

(73) Assignee: New Power Plasma Co., Ltd., Suwon-si (KR)

( * ) Notice: Subject to any disclaimer, the term of this patent is extended or adjusted under 35 U.S.C. 154(b) by 1407 days.

(21) Appl. No.: 11/438,691

(22) Filed: May 23, 2006

(65) Prior Publication Data

US 2006/0289409 A1 Dec. 28, 2006

(30) Foreign Application Priority Data

May 23, 2005 (KR) .................. 10-2005-0043232
Jun. 15, 2005 (KR) .................. 10-2005-0051638
Feb. 16, 2006 (KR) .................. 10-2006-0015143
May 10, 2006 (KR) .................. 10-2006-0042062
May 10, 2006 (KR) .................. 10-2006-0042073

(51) Int. Cl.
*H05B 10/00* (2006.01)

(52) U.S. Cl. ......... 219/121.57; 219/121.36; 219/121.54; 219/121.43; 118/723 I

(58) Field of Classification Search ............. 219/121.48, 219/121.54, 121.57, 121.4, 121.41, 121.59; 118/723 R, 723 I; 315/111.21, 111.51; 313/298.31, 313/298.41

See application file for complete search history.

(56) References Cited

U.S. PATENT DOCUMENTS

| | | | | |
|---|---|---|---|---|
| 6,724,148 B1 * | 4/2004 | Gonzalez et al. | ........ | 315/111.21 |
| 7,430,984 B2 * | 10/2008 | Hanawa et al. | ............. | 118/723 I |
| 2002/0088776 A1 * | 7/2002 | Nakano et al. | ........... | 219/121.43 |
| 2002/0101167 A1 * | 8/2002 | Shan et al. | ................ | 315/111.11 |
| 2004/0226658 A1 * | 11/2004 | Lai et al. | .................. | 156/345.48 |
| 2004/0237897 A1 * | 12/2004 | Hanawa et al. | ............. | 118/723 I |
| 2008/0042591 A1 * | 2/2008 | Smith et al. | ................... | 315/248 |

* cited by examiner

*Primary Examiner* — Mark H Paschall
(74) *Attorney, Agent, or Firm* — NSIP Law

(57) ABSTRACT

A plasma source with discharge inducing bridges and a plasma processing system using the same. The plasma source may be constructed with a number of discharge inducing bridges, each discharge inducing bridge containing a magnetic core with a primary winding of a transformer. The discharge inducing bridges are positioned so as to face a susceptor. Each discharge inducing bridge is a hollow tube. When the electrical current of the primary winding of the transformer is driven, magnetic flux is induced to the magnetic core, so that inductive coupled plasma is formed around the discharge inducing bridges, and a plasma discharge is evenly induced horizontally/vertically along the discharge inducing bridges, so that uniform large-area high-density plasma is generated.

22 Claims, 44 Drawing Sheets

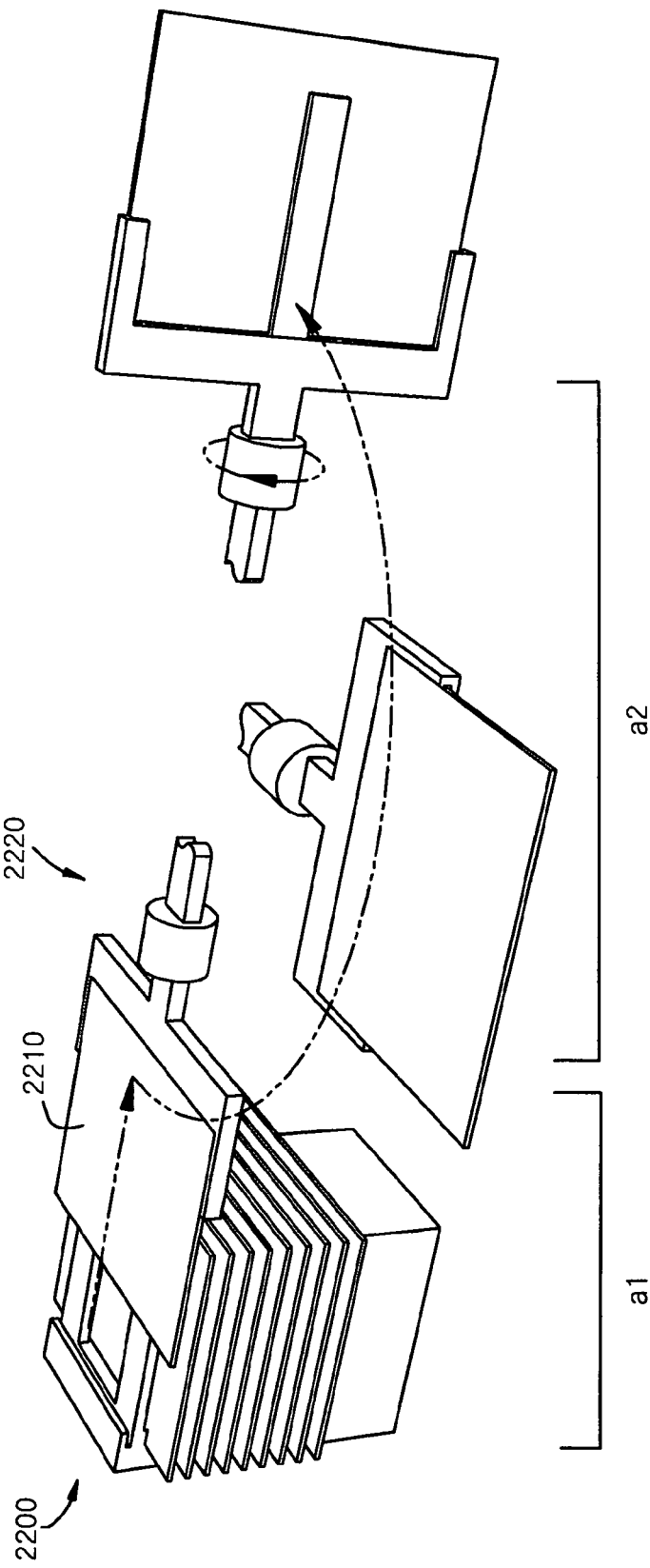

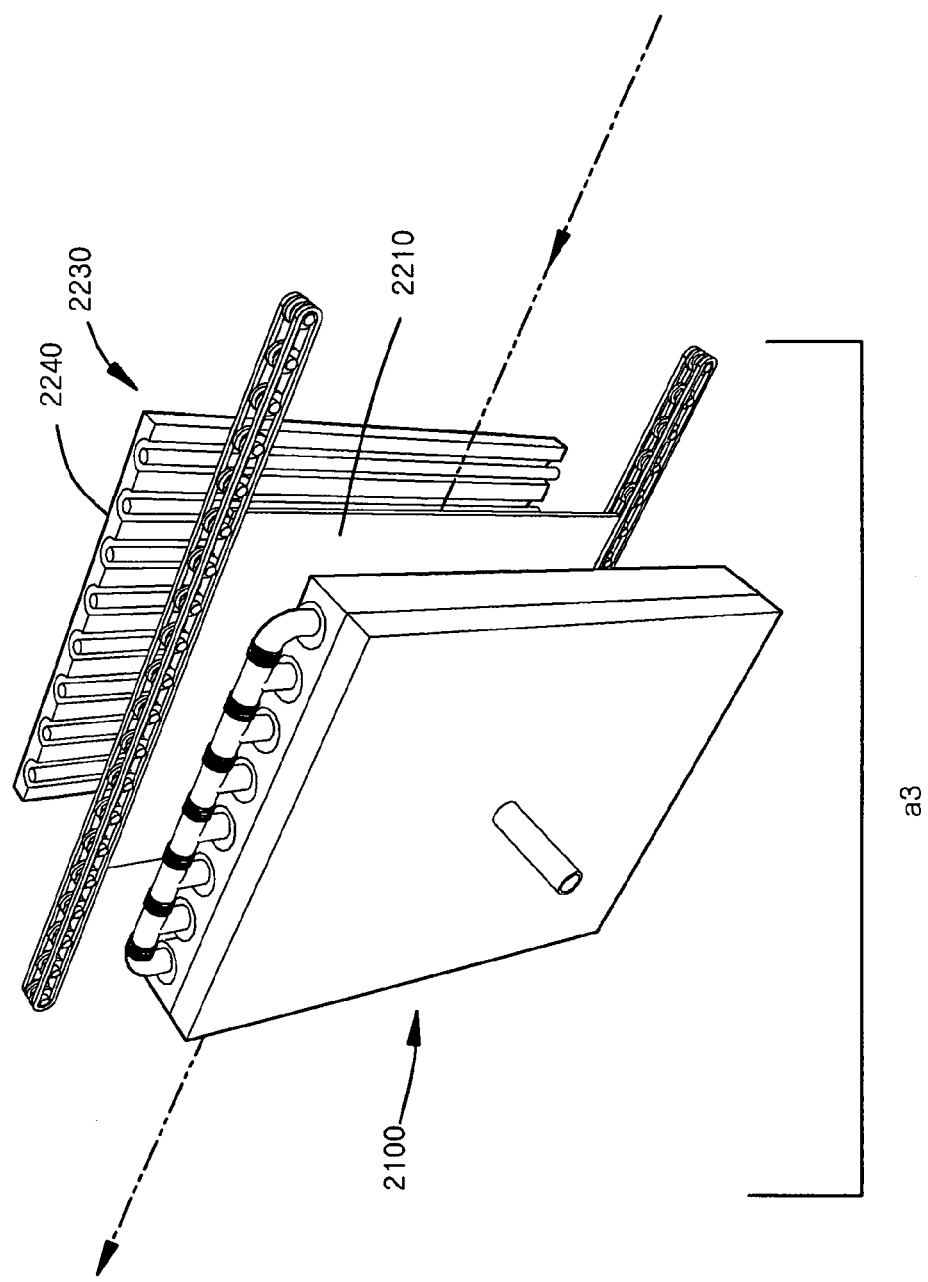

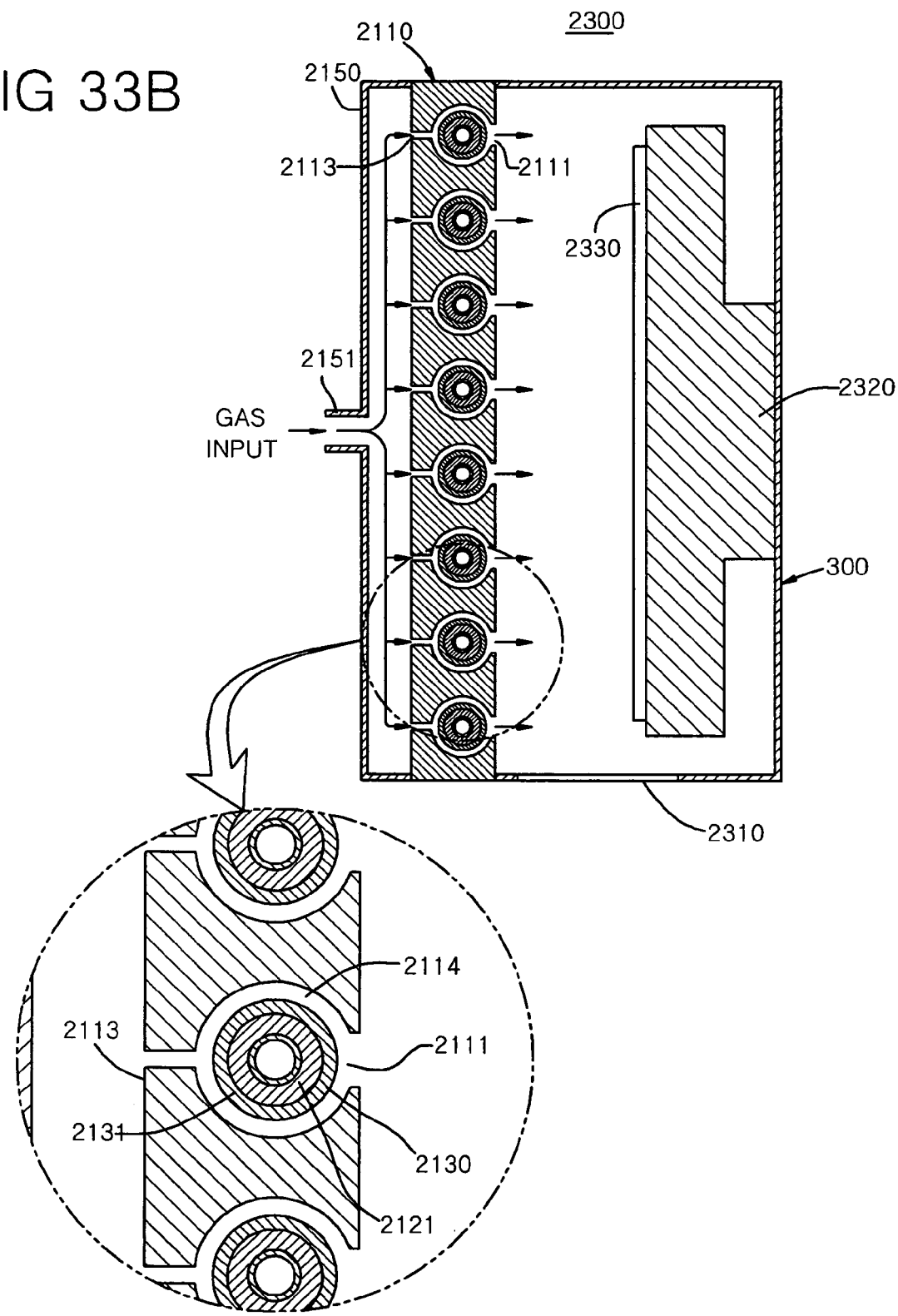

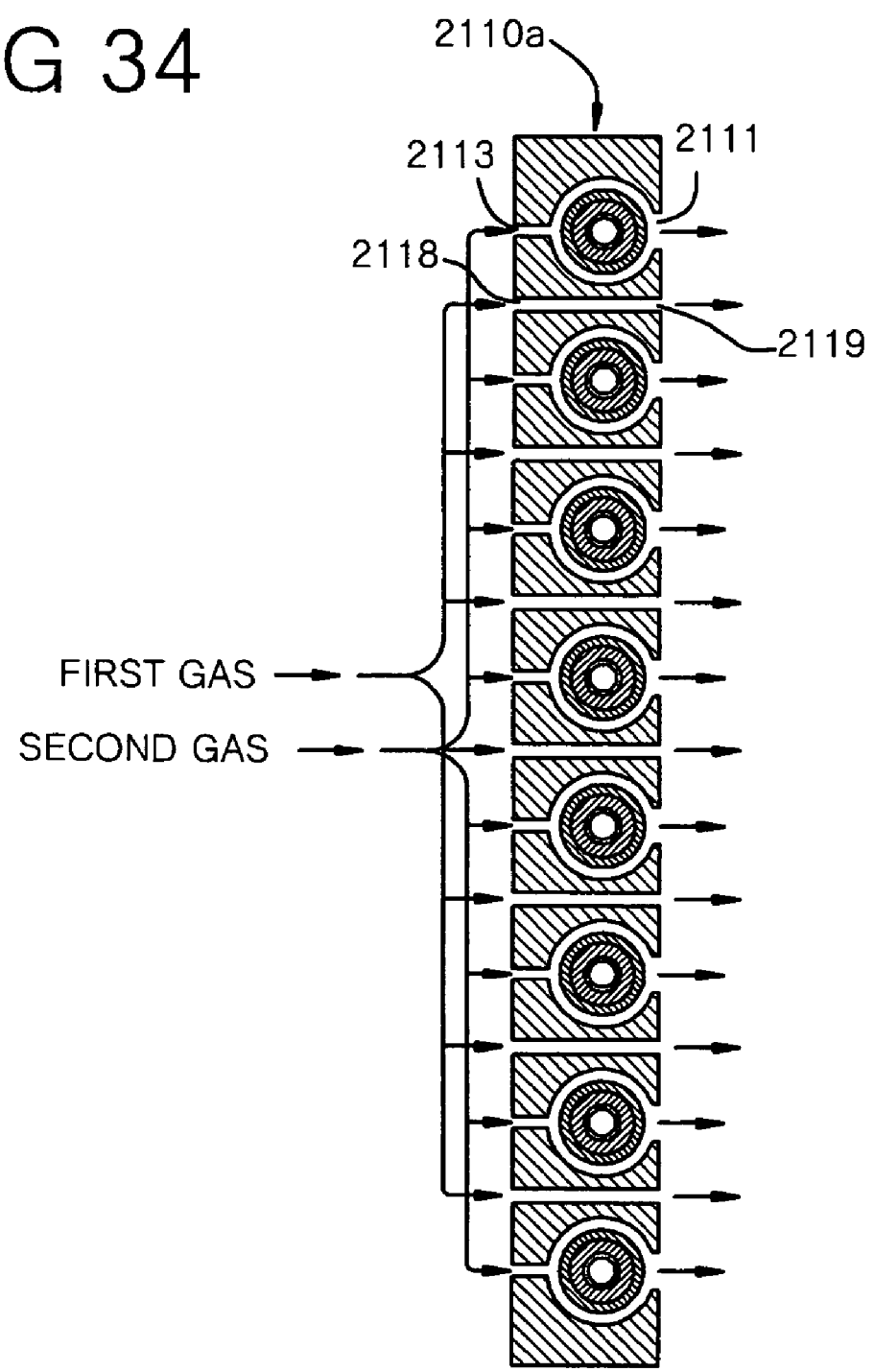

PLASMA SOURCE WITH DISCHARGE INDUCING BRIDGE AND PLASMA PROCESSING SYSTEM USING THE SAME

CLAIM OF PRIORITY

This application makes reference to, incorporates the same herein, and claims all benefits accruing under 35 U.S.C. §119 from five applications earlier filed in the Korean Intellectual Property Office on the 23 of May 2005 and there duly assigned Serial No. 10-2005-0043232, filed on the 15 of Jun. 2005 and assigned Serial No. 10-2005-0051638, filed on the 16 of Feb. 2006 and assigned Serial No. 10-2006-0015143, and filed on the 10 of May 2006 and assigned Serial Nos. 10-2006-0042062 and 10-2006-42073, copies of which are annexed to this application.

BACKGROUND OF THE INVENTION

1. Field of the Invention

The present invention relates generally to a radio frequency plasma source and, more particularly, to a plasma processing system using a radio frequency plasma source.

2. Discussion of the Related Art

Plasma is a highly ionized gas which contains equal numbers of positive ions and electrons. Plasma discharge is used for gas excitation of active gas containing ions, free radicals, atoms and molecules. The active gas is generally used in various fields, and typically, during the semiconductor fabrication processes, such as etching, deposition, cleaning and ashing.

There are various plasma sources for generating plasma, and typical examples are a capacitively coupled plasma source and an inductively coupled plasma source, and both sources use a radio frequency.

The capacitively coupled plasma source accurately controls the capacity and ion, and has high processing productivity in comparison to other plasma sources. Since the energy of the radio frequency power is almost exclusively connected to plasma by capacitive coupling, the plasma ion density increases or decreases based solely upon the increase or decrease of the capacitively-coupled radio frequency power. Any increase in the radio frequency power, however, increases ion impact energy. Consequently, the radio frequency power must be limited to prevent damage caused by ion impact.

The inductive coupled plasma source readily increases the ion density as the radio frequency power increases. In the inductive coupled plasma source, the ion impact caused by an increase in the radio frequency power will be relatively low. Thus, the inductive coupled plasma source is suitable to generate high-density plasma. One technique for inductive coupled plasma source has used a RF antenna and a transformer, and is generally referred to as transformer coupled plasma. In an effort to improve the characteristics of the plasma and to enhance the reproductability and control performance of this technique, the method of using an RF antenna or a transformer has further endeavored to additionally use either an electromagnet or a permanent magnet, or a capacitive coupled electrode.

Generally, either a spiral type antenna or a cylinder type antenna is used as an RF antenna. The RF antenna is positioned outside a plasma reactor, and transfers an inductive electromotive force into the plasma reactor through a dielectric window such as quartz. The inductively coupled plasma source using an RF antenna easily generates high-density plasma. The structural feature of the antenna however, affects the plasma uniformity in the inductive coupled plasma source. Thus, further research efforts have been conducted to an attempt improve the structure of an RF antenna so as to produce uniformly high-density plasma.

There is a limit to the enlargement of the structure of the antenna and to an increase in the power supplied to the antenna in an attempt to obtain large-area plasma. For example, it is known that non-uniform plasma is radially generated by a standing wave effect. Furthermore, when high power is applied to the antenna, the thickness of the dielectric window should be thick because the capacitive coupling of the RF antenna increases. Thus, since the distance between the RF antenna and plasma is increased, the power transfer efficiency is reduced.

In an inductive coupled plasma source using a transformer, i.e., a transformer coupled plasma source, plasma is induced in a plasma reactor by using the transformer, and the inductive coupled plasma completes a second circuit of the transformer. Techniques for transformer coupled plasma sources have been developed by either including an outer discharge tube in a plasma reactor, mounting a closed core in a toroidal chamber, or including a transformer core inside the plasma reactor.

One transformer coupled plasma source has been developed to improve characteristics of plasma and the energy transfer characteristics thereof by improving the plasma reactor structure and using a transformer coupling structure. Specifically, in order to obtain large-area plasma, the coupling structure of the transformer and the plasma reactor is improved, a number of outer discharge tubes are included, or alternatively, the number of transformer cores mounted inside the plasma reactor is increased. It is not easy however, to uniformly produce large-area high-density plasma by merely increasing the number of outer discharge tubes or the number of transformer cores.

As semiconductor devices becomes super-miniaturized, silicon wafer substrates for fabricating a semiconductor circuits become larger, the glass substrate for manufacturing liquid crystal displays becomes bigger, and as new materials to be processed appear, plasma processing techniques must be improved in order to update semiconductor fabrication industry. Specifically, a plasma source and a plasma processing technique must have excellent processing performance to enable large-area workpieces to be processed.

Furthermore, as the substrate to be processed becomes larger, the whole of the manufacturing equipment also becomes larger, thereby increasing the required equipment area and, concomitantly increasing manufacturing costs. Thus, if possible, a plasma source and a plasma processing system must minimize the equipment area.

SUMMARY OF THE INVENTION

It is therefore, one object of the present invention to provide an improved plasma source and plasma processing system.

It is another object to provide a plasma source and plasma processing system able to generate a large-area plasma, readily enlarged to a large-area, and that minimizes equipment area.

These and other object may be attained with an exemplary embodiment constructed according to the principles of the present invention as a plasma processing chamber using a chamber housing having at least one susceptor on which a workpiece substrate may be placed; a number of discharge inducing bridges positioned within the chamber housing; a number of holes formed in the chamber housing for receiving both ends of each discharge inducing bridge; a transformer having a magnetic core mounted in each discharge inducing bridge, and a primary winding; and a first power supply source electrically connected to the primary winding. In use, an electrical current from the primary winding of the first power supply source forms an inductive coupled plasma around the discharge inducing bridges, and induces an AC potential inside the chamber housing, thereby complete a secondary circuit of the transformer.

The plasma processing chamber is preferably equipped with a first impedance matching box electrically connected between the first power supply source and the primary winding.

The plasma processing chamber is preferably equipped with a second power supply source supplying bias power to the susceptor, and a second impedance matching box electrically connected between the second power supply source and the susceptor.

The discharge inducing bridge preferably incorporates an electrically insulating material.

The discharge inducing bridge preferably incorporates a metal material and an electrically insulating material to form an electrical discontinuity.

The plasma processing chamber preferably incorporates at least one gas entrance formed in the ceiling of the chamber housing above the discharge inducing bridges.

The chamber housing preferably may be constructed with an upper housing, a lower housing, and a middle housing connecting the upper housing and the lower housing and including the discharge inducing bridges.

The magnetic core preferably has two separate cores, each being a horseshoe shape, and the two separate cores may be movable to variably control a distance therebetween.

The plasma processing chamber preferably comprises: a first susceptor and a second susceptor vertically positioned at two inside sidewalls of the chamber housing so as to face each other, with the discharge inducing bridges being horizontally positioned in a vertical plane and equally spaced apart from the first and second susceptors.

The plasma processing chamber preferably includes at least one gas entrance formed in the ceiling of the chamber housing above the discharge inducing bridges; and gas exits formed in the two sidewalls of the chamber housing where the first and second susceptors are positioned, respectively.

The plasma processing chamber preferably comprises a gas supply unit in a separate gas supply structure including a first gas supply channel for flowing a first gas to just above the discharge inducing bridges, and a second gas supply channel for flowing a second gas to between the discharge inducing bridges.

The magnetic core preferably includes a closed core with one or more single loops.

The magnetic core preferably includes a closed core with one or more multiple loops.

The susceptor preferably receives one or more bias power in use.

The plasma processing chamber preferably comprises one or more discharge separating partitions dividing a plasma formation region formed by the discharge inducing bridges into a number of regions.

The plasma processing chamber preferably comprises a ground electrode operatively positioned inside the discharge inducing bridge, to face the susceptor.

The plasma processing chamber preferably comprises a discharge shade electrically grounded and operatively positioned above the discharge inducing bridges.

The discharge shade preferably includes a first gas supply channel for flowing a first gas to just above the discharge inducing bridges, and a second gas supply channel for flowing a second gas to between the discharge inducing bridges.

The discharge shade preferably includes one or more discharge separating partitions dividing the plasma formation region formed by the discharge inducing bridges into one or more regions.

In another aspect of the present invention, the present invention provides a plasma reactor comprising: a reactor body having a number of discharge chambers; a number of plasma jet slits formed in the reactor body, along the discharge chambers; a transformer having a magnetic core connected to the discharge chambers, and a primary winding; a core protecting tube surrounding and protecting the magnetic core positioned inside the discharge chamber; and a first power supply source electrically connected to thereby, in use, driving the current of the primary winding by the first power supply source, forming inductive coupled plasma around the core protecting tubes, and inducing an AC potential inside the discharge chambers, to complete a secondary circuit of the transform.

The reactor body may preferably be made from a metal material.

The reactor body preferably includes an electrically insulating material.

The discharge chambers preferably includes discharge separating partitions positioned inside each discharge chamber and dividing the inside of the discharge chamber into two or more discharge regions.

The magnetic core preferably includes a closed core with one or more single loops.

The magnetic core preferably includes a closed core with a multiple loop.

Each winding coil preferably includes a tube-type conductive member surrounding the magnetic core portion positioned inside each discharge chamber, and the tube-type conductive member partially may include an electrically insulating material.

The reactor body preferably is electrically grounded.

The plasma reactor preferably comprises a capacitive coupled electrode positioned inside each discharge chamber.

The capacitive coupled electrode preferably includes a tube-type conductive member surrounding the magnetic core portion on the whole, and the tube-type conductive member partially includes an insulation region.

The plasma reactor preferably comprises a second power supply source electrically connected to the capacitive coupled electrode.

The plasma reactor preferably comprises a power distributor for dividing the for power input from the first power supply source into the primary winding and the capacitive coupled electrode, to supply the primary winding and the capacitive coupled electrode.

The core protecting tube preferably includes an electrically insulating material.

The core protecting tube preferably includes a metal material and an electrically insulating material to form electrical discontinuity.

The reactor body preferably includes a cooling channel.

The magnetic core preferably has a hollow region formed along its center, with the cooling channel being the hollow region of the magnetic core.

The cooling channel preferably is positioned so as to surround an outside of the magnetic core.

The reactor body preferably includes a number of gas injection openings opened toward the discharge chambers, and a gas supply unit distributing and supplying a gas through a gas entrance.

In another aspect of the present invention, embodiments of the present invention may provide an atmospheric pressure plasma processing system constructed with a plasma reactor that has a reactor body with a number of discharge chambers; a number of plasma jet slits formed in the reactor body, along the discharge chambers; a transformer having a magnetic core connected to the discharge chambers, and a primary winding. The system may have a core protecting tube surrounding and protecting the magnetic core positioned inside the discharge chamber; and a first power supply source electrically connected to the primary winding; an atmospheric pressure processing unit where the plasma reactor is positioned, for performing plasma processing with respect to a workpiece by using plasma being jetted through the plasma jet slits, at atmosphere pressure; a first workpiece standby unit where the workpiece is on standby; and a first transfer unit transferring the workpiece between the workpiece standby unit and the atmospheric pressure processing unit.

The plasma reactor preferably may be vertically positioned so that the plasma jet slits face the workpiece, and the workpiece may be vertically input to the atmospheric pressure processing unit.

The plasma reactor preferably may be horizontally positioned so that the plasma jet slits face the workpiece, and the workpiece may be horizontally input to the atmospheric pressure processing unit.

The first transfer unit preferably transfers the workpiece between the workpiece standby unit and the atmospheric pressure processing unit, and may include a first transfer robot converting a position of the workpiece from the horizontal to the vertical or form the vertical to the horizontal.

The atmospheric pressure processing unit preferably includes a transfer means transferring the workpiece forward and backward.

The atmospheric pressure processing unit preferably includes a preheating means preheating the workpiece.

The atmospheric pressure processing unit preferably includes a fixing means fixing the workpiece to face the plasma reactor.

The plasma processing system preferably may be constructed with a second workpiece standby unit where the workpiece processed in the atmospheric pressure processing unit is on standby, and a second transfer unit transferring the workpiece between the atmospheric pressure processing unit and the second workpiece standby unit.

The second transfer unit preferably transfers the workpiece between the workpiece standby unit and the atmospheric pressure processing unit, and may include a second transfer robot converting a position of the workpiece from the horizontal to the vertical, or alternatively, form the vertical to the horizontal.

In another aspect of the present invention, the present invention may provide a plasma processing chamber constructed with a plasma reactor including a reactor body with a number of discharge chambers; a number of plasma jet slits formed in the reactor body, along the discharge chambers; a transformer having a magnetic core connected to the discharge chambers and a primary winding; a core protecting tube surrounding and protecting the magnetic core positioned inside the discharge chamber; and a first power supply source electrically connected to the primary winding. With this construction, when in use, the electrical current flowing through the primary winding by the first power supply source; completing a secondary circuit of the transformer by the driving current of the primary winding induces an AC potential inside the discharge chamber and forms an inductive coupled plasma around each discharge chamber, thus forming an inductive coupled plasma that surrounds the outside of the core protecting tube in each discharge chamber. A chamber housing receiving the plasma being output through the plasma jet slits may have a substrate support to which bias power may be applied from inside.

The reactor body preferably includes a number of gas injection nozzles opening toward the discharge chambers, and a gas supply unit that distributes and supplys a gas through the gas injection openings.

The reactor body preferably may have first gas injection nozzles opening toward the plasma discharge chambers, and second gas injection nozzles formed between two adjacent plasma discharge chambers and opening toward the chamber housing. The gas supply unit may separately distribute and supply different gases through the first and second gas injection nozzles.

The substrate support preferably may have a heater that warms the workpiece.

The chamber housing preferably may have a light-heating means heating the workpiece by emitting light.

The substrate support preferably may use a device for fixing the workpiece.

In another aspect of the present invention, embodiments of the present invention may be constructed with a plasma processing chamber which has a plasma reactor that provides a reactor body with a number of discharge chambers; a number of plasma jet slits formed in the reactor body along the discharge chambers; a transformer having a magnetic core connected to the discharge chambers, and a primary winding. A core protecting tube surrounds and protects the magnetic core positioned inside the discharge chamber; a first power supply source is electrically connected to the primary winding; and a chamber housing receives the plasma which is output through the plasma jet slits. A substrate support may receive bias power from a source external to the chamber housing. A loadlock chamber may be connected to the plasma processing chamber; a first transfer robot may be positioned in the loadlock chamber and transfer the workpiece substrate between the plasma processing chamber and the loadlock chamber. A transfer chamber may be connected to the loadlock chamber; a workpiece substrate standby chamber which may be provided to accommodate the workpiece substrate during standby conditions, is connected to the transfer chamber; and a second transfer robot may be positioned to transfer the substrate between the workpiece substrate standby chamber and the loadlock chamber.

The plasma processing chamber may preferably be vertically positioned so that the plasma jet slits of the plasma reactor face the substrate support, and the workpiece substrate may be vertically input to the loadlock chamber and the plasma processing chamber.

The plasma processing chamber may be horizontally positioned so that the plasma jet slits of the plasma reactor face the substrate support, and the workpiece substrate may be horizontally input to the loadlock chamber and the plasma processing chamber.

A second transfer robot may preferably convert a position of the workpiece from the horizontal to the vertical, or alternatively, from vertical to horizontal.

BRIEF DESCRIPTION OF THE DRAWINGS

A more complete appreciation of the invention and many of the attendant advantages thereof, will be readily apparent as the same becomes better understood by reference to the following detailed description when considered in conjunction with the accompanying drawings in which like reference symbols indicate the same or similar components, wherein:

FIGS. 29A, 29B and 29C are a series of projection views sequentially illustrating a process of transferring substrate workpiece in the atmospheric pressure plasma processing system;

FIG. 33B is a cross-sectional view illustrating a plasma processing chamber and a partial enlarged view of a discharge chamber;

FIG. 34 is a cross-sectional view illustrating a reactor body having a separated gas supply structure;

DETAILED DESCRIPTION OF THE INVENTION

Figure 1A:
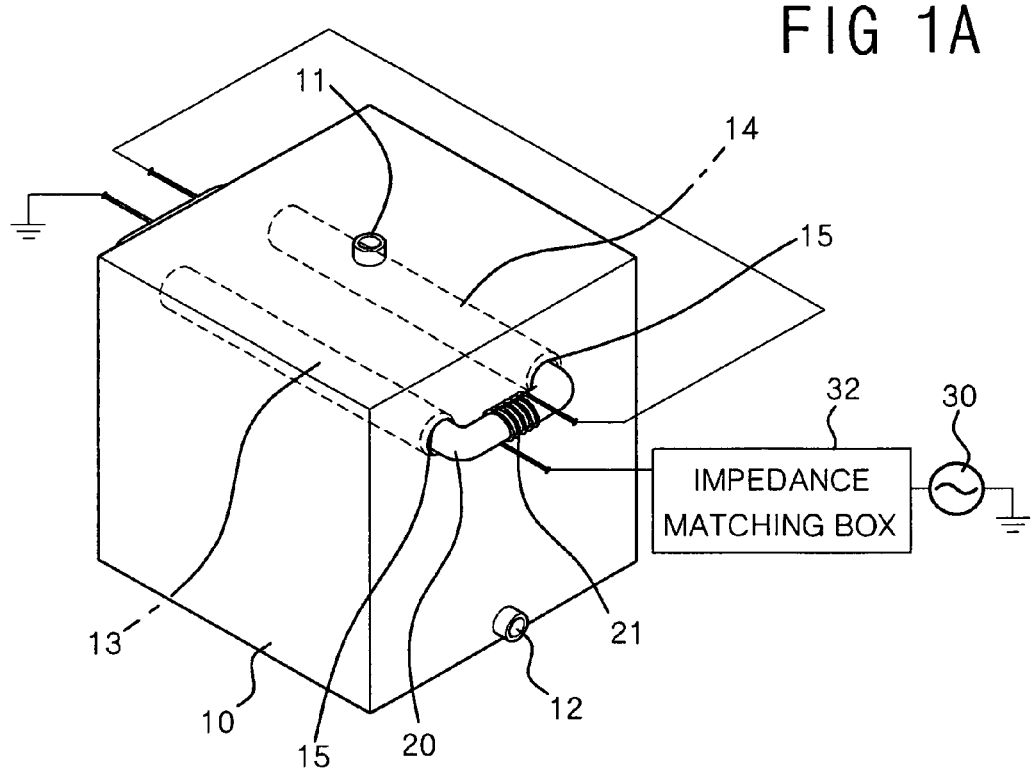
FIGS. 1A and 1B are a projection view and a cross-sectional view, respectively, of a plasma processing chamber according to the first embodiment of the present invention.

A plasma source with a discharge inducing bridge and a plasma processing system using the same of the present invention will now be described more fully with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the shape of components may be exaggerated for clarity. Like numbers refer to like elements throughout the specification. Where the function and structure are well-known in the relevant arts, further discussion will not be presented in the detailed description or illustration of the present invention in order not to unnecessarily make the gist of the present invention unclear.

Embodiment I

Figure 1B:
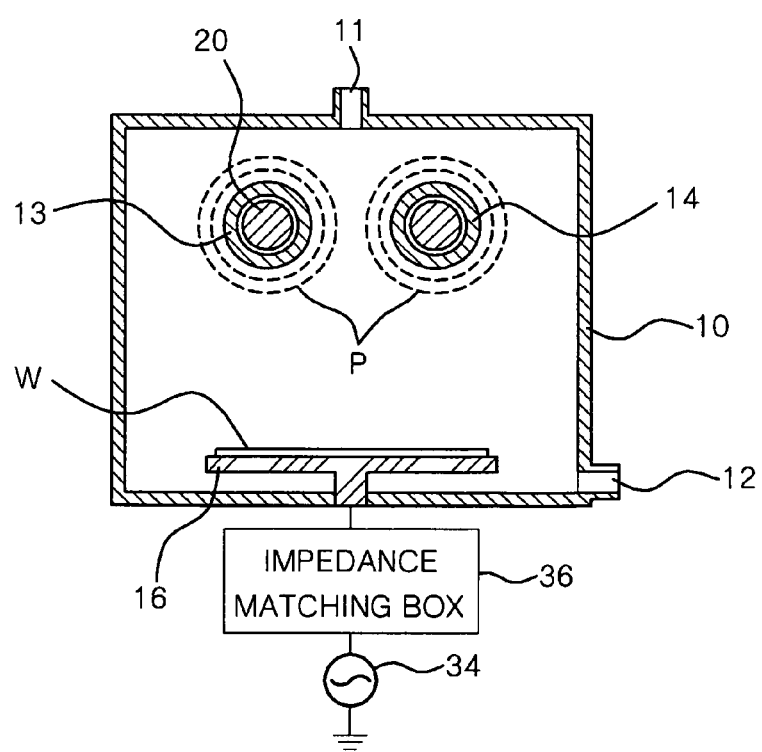

FIGS. 1A and 1B are a perspective view and a cross-sectional view, respectively, of a plasma processing chamber according to the first embodiment of the present invention.

Referring to FIGS. 1A and 1B, the plasma processing chamber includes chamber housing 10 and two discharge inducing bridges 13 and 14 positioned inside chamber housing 10. Discharge inducing bridges 13 and 14 are linear hollow tubes. Toroidal magnetic core 20 is mounted in discharge inducing bridges 13 and 14, and magnetic core 20 with winding coil 21 forms a transformer. Winding coil 21 is electrically connected to power supply source 30 supplying radio frequency to the primary winding of the transformer, through impedance matching box 30.

Chamber housing 10 includes a number of holes 15 formed in two sidewalls opposed to each other. Both ends of each of discharge inducing bridges 13 and 14 are connected to holes 15. A passage within chamber housing 10 from the outside of chamber housing 10 is provided through the hollow regions of discharge inducing bridges 13 and 14 and two pairs of holes 15.

Referring to FIG. 1B, gas entrance 11 is formed in the ceiling of chamber housing 10, and gas exit 12 is formed in a sidewall or bottom thereof. Susceptor 16 on which a work substrate W is placed is positioned inside the chamber housing. Gas entrance, or port 11 preferably is formed above discharge inducing bridges 13 and 14, so that a processing gas input through gas entrance 11 jets above discharge inducing bridges 13 and 14 and evenly spreads and flows downward chamber housing 10. Although not shown in the drawings, gas entrance, or port 11 is connected to a gas supply source supplying the processing gas, and gas exit, or discharge 12 may be connected to a vacuum pump.

Chamber housing 10 is made of a metal material such as aluminum, stainless, or copper. Alternatively, it may be made of a coated metal, for example, anodized aluminum or aluminum coated with nickel. Alternatively, it may be made of a refractory metal. Housing chamber 10 may be made of other materials suitable to process the intended plasma.

Two discharge inducing bridges 13 and 14 are horizontally positioned in a horizontal plane within chamber housing 10, from a first sidewall of chamber housing 10 to a second sidewall opposed to the first sidewall. Discharge inducing bridges 13 and 14 which are the hollow tubes, substantially encase and thereby cover and protect magnetic core 20 positioned inside chamber housing 10.

Discharge inducing bridges 13 and 14 are made of an electrically insulating material such as quartz or ceramic. Alternatively, discharge inducing bridges 13 and 14 may be made of a metal material, such as the material used to construct chamber housing 10. In this case, in order to prevent the occurrence of an eddy current, it is preferable to include an insulation region including the electrically insulating material to have the electrical discontinuity. Although not shown in the drawings, a cooling channel controlling the temperature of discharge inducing bridges 13 and 14 is positioned between discharge inducing bridges 13 and 14 and magnetic core 20.

Magnetic core 20 has a closed core structure of a single loop. Magnetic core 20 is made of a ferrite material but it may be made of other materials such as iron or air. Magnetic core 20 is mounted in two discharge inducing brides 13 and 14. Substantially, most of magnetic core 20 is positioned inside chamber housing 10, and small parts thereof protrudes outward at two sidewalls of chamber housing 10 opposed to each other.

Magnetic core 20 is wound with winding coil 21, thereby forming the transformer. Two winding coils 21 are preferably wound around the two parts of magnetic core 20 protruding outward at two sidewalls of chamber housing 10 opposed to each other, respectively. Alternatively, winding coil 21 may be wound around only any one of the outward protruding parts of magnetic core 20. Alternatively, winding coil 21 may be wound around the portion of magnetic core 20 positioned inside chamber housing 20. Winding coil 21 is electrically connected to power supply source 30 supplying the radio frequency. Winding coils 21 are connected to power supply source 30 in series, but may be connected in parallel.

Power supply source 30 is an alternate current (AC) power supply source supplying the RF power. Impedance matching box 32 for impendence matching is positioned at an output terminal of power supply source 30. An RF power supply source capable of controlling the output voltage without a separate impedance matching box may be used. Susceptor 16 is electrically connected to power supply source 34 supplying the bias power through impedance matching box 36.

When the RF power is supplied to winding coil 21 by power supply source 30, the current is driven at winding coil 21 and the magnetic flux is induced to magnet core 20 in the plasma processing chamber, thereby inducing an AC potential inside chamber housing 20, for forming inductive coupled plasma around discharge inducing bridges 13 and 14, i.e., for completing a secondary circuit of the transformer. The plasma discharge is evenly induced in parallel, along two discharge inducing bridges 13 and 14, thereby generating uniform high-density plasma inside chamber housing 20.

Figure 2A:
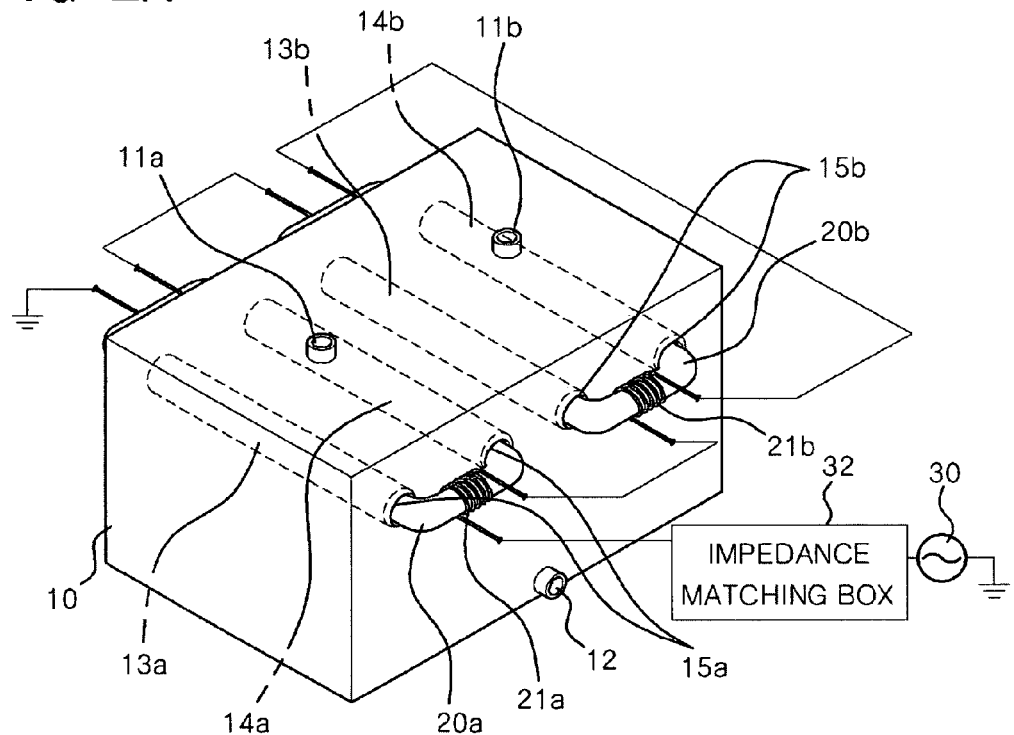
FIGS. 2A and 2B are a projection view and a cross-sectional view, respectively, of a plasma processing chamber constructed with a number of discharge inducing bridges which are horizontally positioned in a horizontal plane.
Figure 2B:
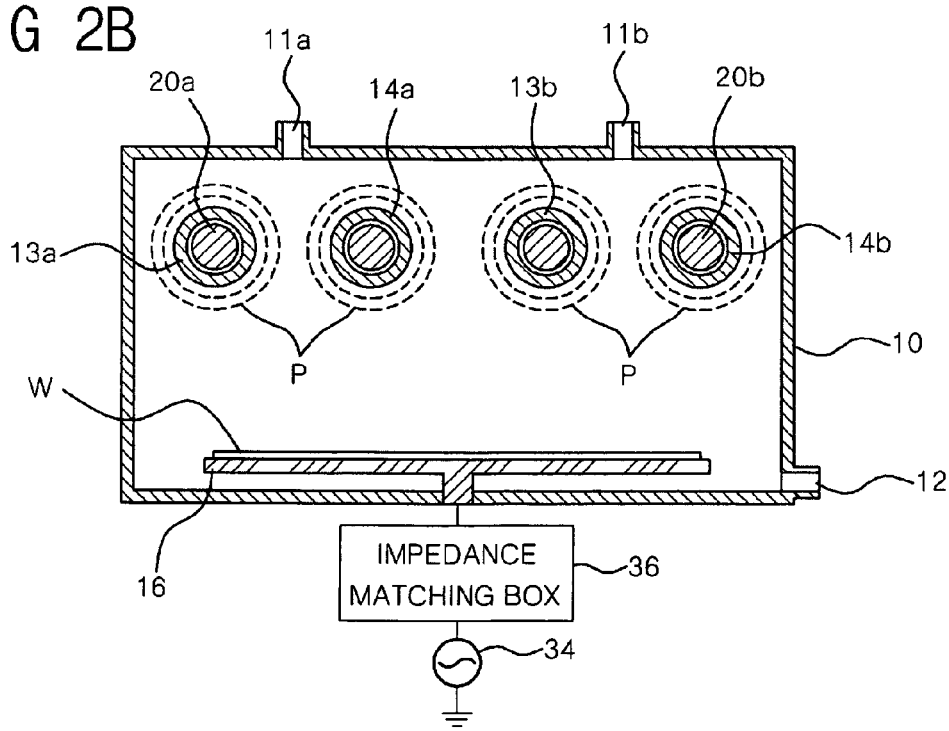

Furthermore, since the surface of discharge inducing bridges 13 and 14 is revealed inside chamber housing 10, equipment cleaning is very easy, thereby increasing the cleaning efficiency and shortening the cleaning time. Consequentially, the productivity is generally improved. Specifically, to obtain a required volume of plasma, a plasma processing chamber may be easily extended and changed by increasing the number of discharge inducing bridges according to the size of a work substrate, as described below:

FIGS. 2A and 2B are a projection view and a cross-sectional view, respectively, of a plasma processing chamber including a number of discharge inducing bridges horizontally positioned in a horizontal plane.

Referring to FIGS. 2A and 2B, the plasma processing chamber includes four discharge inducing bridges 13a, 14a, 13b and 14b inside chamber housing 10. Four discharge inducing bridges 13a, 14a, 13b and 14b are horizontally positioned in a horizontal plane at an upper part in the chamber housing 10. A number of holes 15a and 15b are formed in two sidewalls of chamber housing 10 opposed to each other, and are connected to both ends of each of four discharge inducing bridges 13a, 14a, 13b and 14b.

Two gas entrances 11a and 11b may be formed in the ceiling of chamber housing 10. The gas entrances preferably is positioned above four discharge inducing bridges 13a, 14a, 13b and 14b. A processing gas jets above four discharge inducing bridges 13a, 14a, 13b and 14b, and evenly spreads and flows downward chamber housing 10.

Two magnetic cores 20a and 20b are mounted in four discharge inducing bridges 13a, 14a, 13b and 14b. A number of winding coils 21a and 21b are wounded around two magnetic cores 20a and 20b, respectively, and are electrically connected to power supply source 30 through first impedance matching box 32. Winding coils 21a and 21b preferably are electrically connected to power supply source 30 in series, or in parallel, or in both series and parallel.

Alternatively, winding coils 21a and 21b may be connected to two or more independent power supply source and impedance matching boxes, thereby having the independent power supply structure.

Figure 3A:
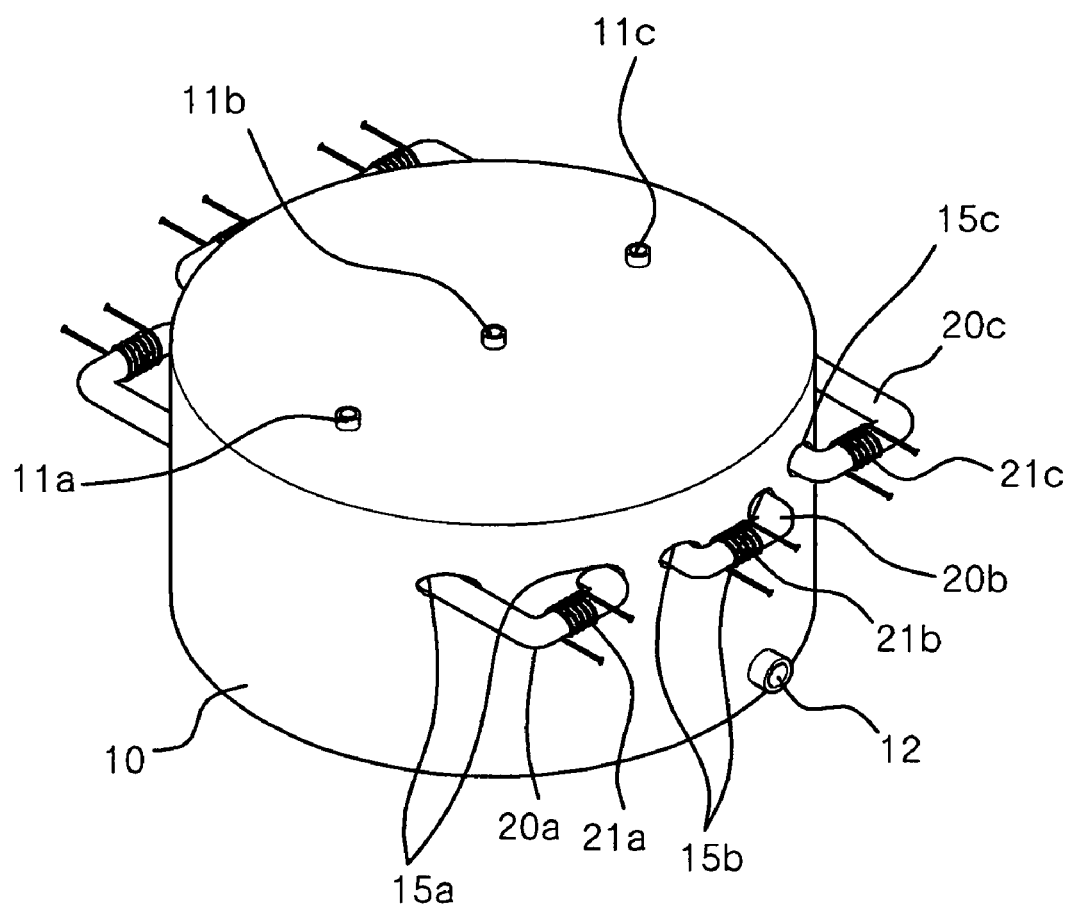
FIGS. 3A and 3B are a projection view and a cross-sectional view, respectively, of a cylinder-type plasma processing chamber constructed with a number of discharge inducing bridges which are horizontally positioned in a horizontal plane.
Figure 3B:
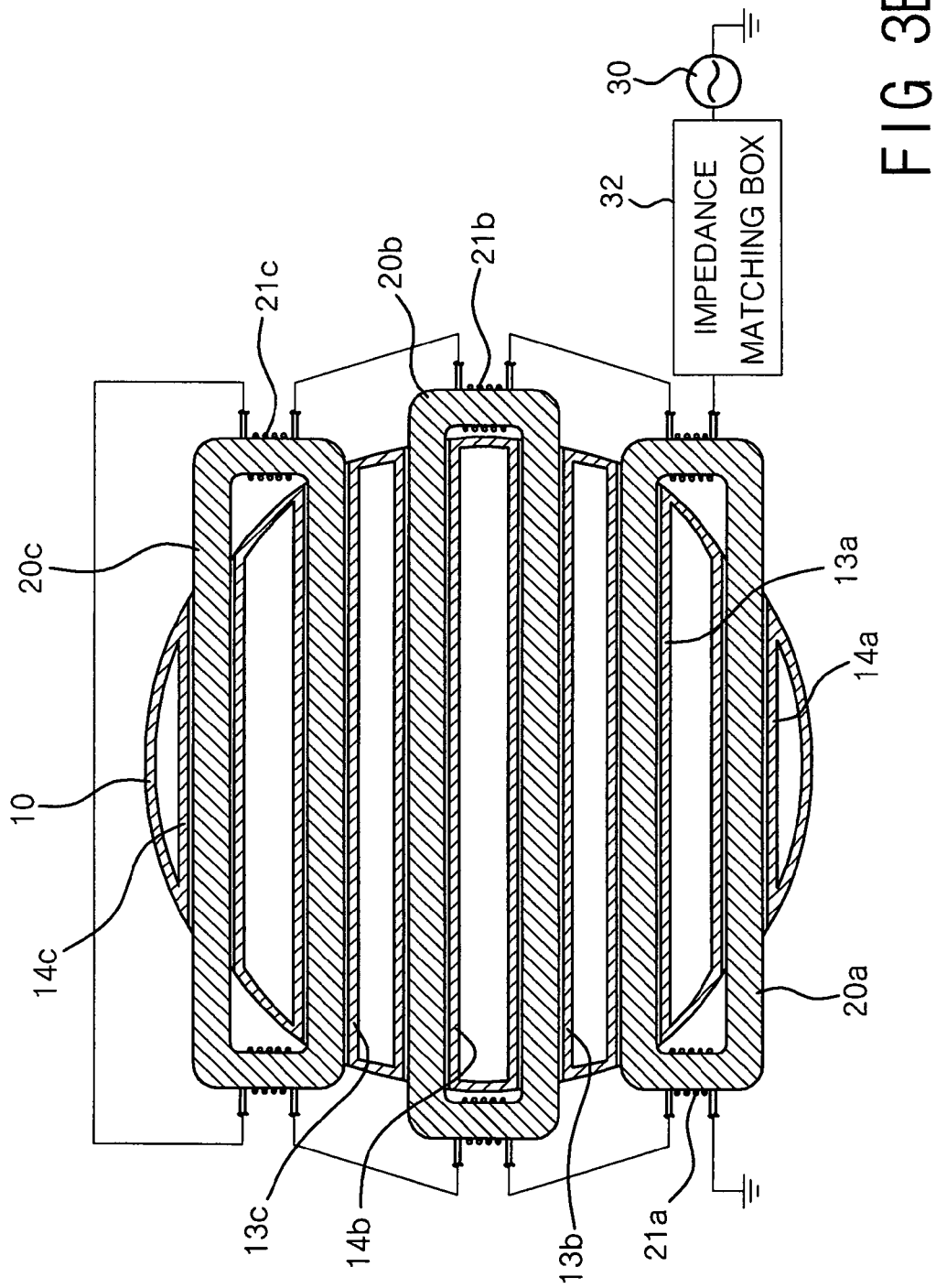

FIGS. 3A and 3B are a projection view and a cross-sectional view of a cylinder-type plasma processing chamber including a number of discharge inducing bridges which are horizontally positioned in a horizontal plane.

Referring to FIGS. 3A and 3B, another modified plasma processing chamber includes six discharge inducing bridges 13a, 14a, 13b, 14b, 13c and 14c. Six discharge inducing bridges 13a, 14a, 13b, 14b, 13c and 14c are horizontally positioned in a horizontal plane at an upper part in chamber housing 10. Chamber housing 10 has a cylinder-type structure, and six discharge inducing bridges 13a, 14a, 13b, 14b, 13c and 14c have their respective different length in accordance with the cylinder-type structure of chamber housing 10. Holes 15a, 15b and 15c are formed in two sides of chamber housing 10 opposed to each other, and are connected to both ends of each of six discharge inducing bridges 13a, 14a, 13b, 14b, 13c and 14c.

Three gas entrances 11a, 11b and 11c may be formed in the ceiling of chamber housing 10. The gas entrances 11a, 11b and 11c preferably are positioned above discharge inducing bridges 13a, 14a, 13b, 14b, 13c and 14c. A processing gas inputting through gas entrances 11a, 11b and 11c jets above each of discharge inducing bridges 13a, 14a, 13b, 14b, 13c and 14c, and evenly spreads and flows downward chamber housing 10.

Three magnetic cores 20a, 20b and 20c are mounted in six discharge inducing bridges 13a, 14a, 13b, 14b, 13c and 14c. Winding coils 21a, 21b and 21c are wound around magnetic cores 20a, 20b and 20c, and are electrically connected to power supply source 30, through first impedance matching box 32. Winding coils 21a, 21b and 21c preferably are connected to power supply source 30 in series, or in parallel, or both in series and parallel. Alternatively, winding coils 21a, 21b and 21c may be connected to two or more independent power supply source and impedance matching boxes, thereby having the independent power supply structure.

As described above, the plasma processing chamber of the present invention is easily changed to generate large-area plasma, by increasing the number of discharge inducing bridges coupled with the transformer and extending the respective length thereof. Further, the length, shape and position structure of the discharge inducing bridges may be modified according to the structural features of the plasma processing chamber. The structure or number of the gas entrances maybe appropriately modified to form uniform plasma. The number of the susceptors positioned inside the chamber housing may be increased to process a multiple substrate.

Figure 4A:
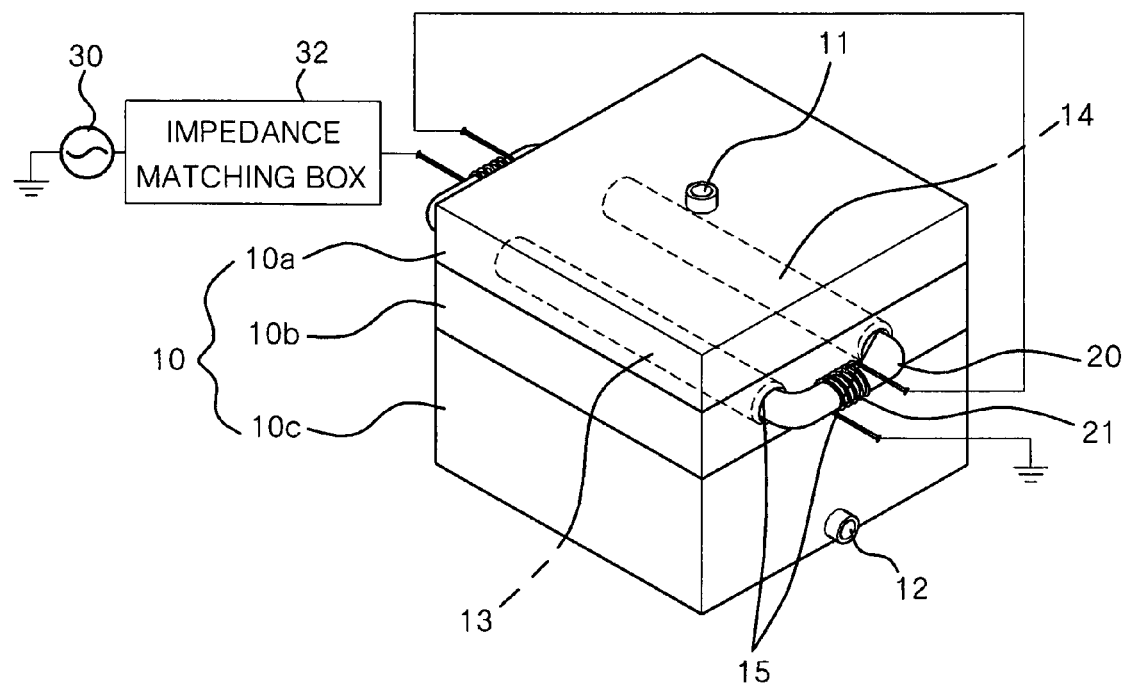
FIGS. 4A and 4B are a projection view and a partially exploded projection view, respectively, of a plasma processing chamber including a separable chamber housing.
Figure 4B:
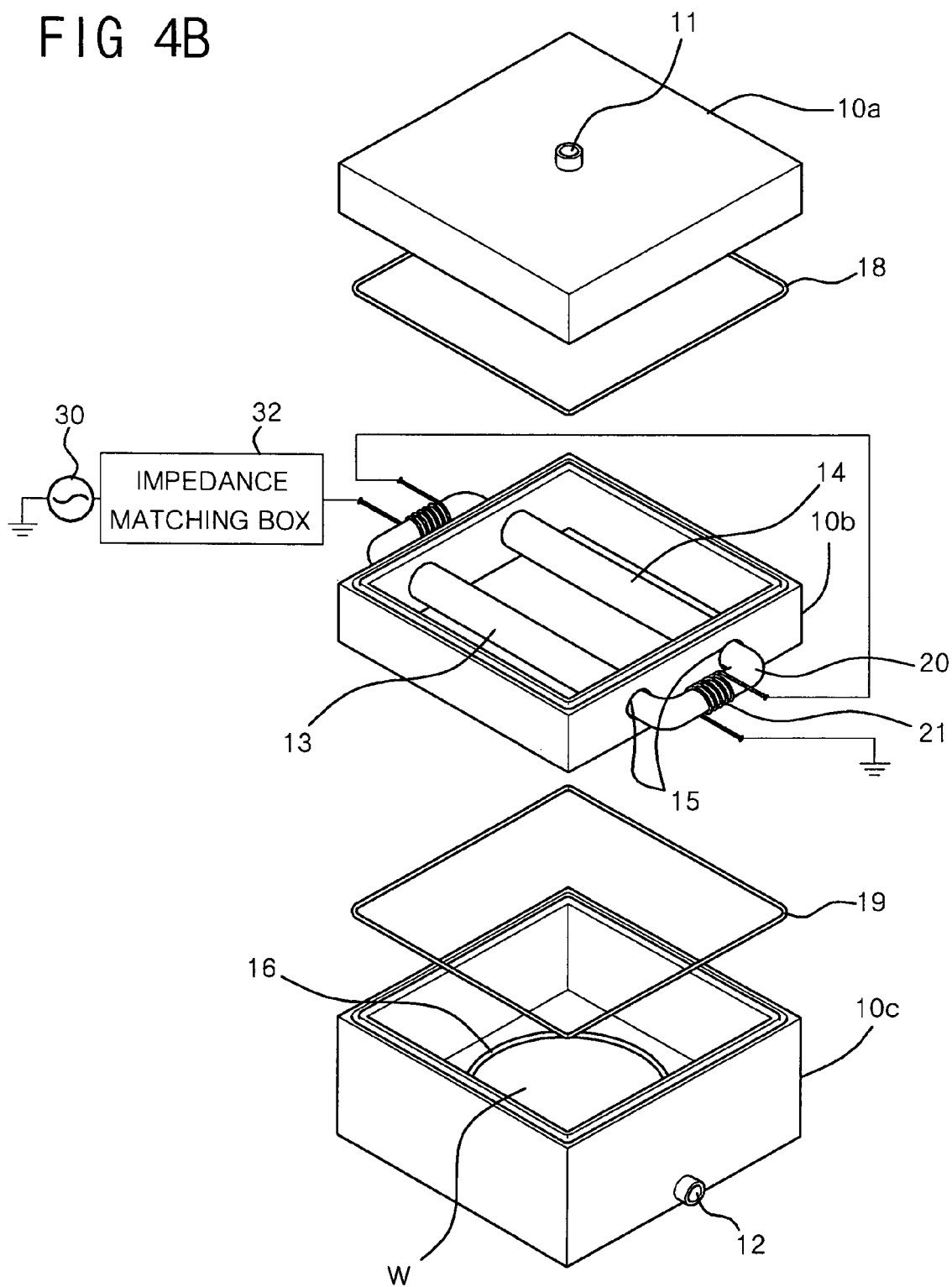

FIGS. 4A and 4B are a projection view and an exploded view, respectively, of a plasma processing chamber including a separable chamber housing.

Referring to FIGS. 4A and 4B, in another modified plasma processing chamber, chamber housing 10 is separable as upper housing 10a, middle housing 10b and lower housing 10c. O-rings 18 and 19 for vacuum-insulation are inserted at each connection portion between two adjacent housings. Discharge inducing bridges 13 and 14 are positioned inside middle housing 10b. The middle housing may be integrally formed with discharge inducing bridges 13 and 14.

Figure 5:
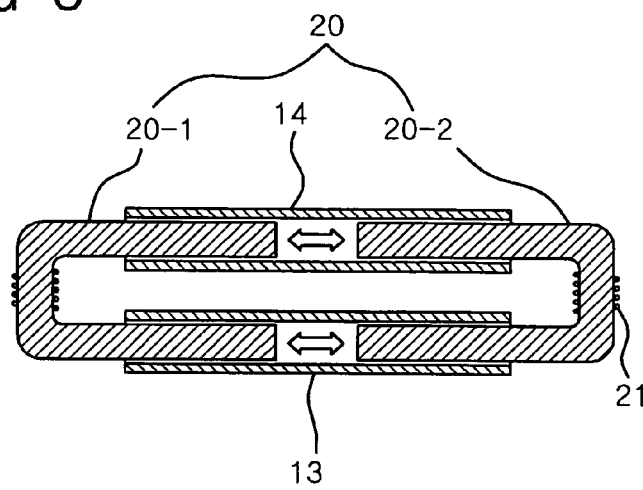
FIG. 5 is a cross-sectional view illustrating an example of discharge inducing bridges in which a separable magnetic core is mounted.

FIG. 5 is an example of discharge inducing bridges in which a separable magnetic core is mounted.

Referring to FIG. 5, magnet core 20 mounted in discharge inducing bridges 13 and 14 has two horseshoe shapes and may include separable first and second magnetic cores 20-1 and 20-2 to control the distance therebetween. As the distance between first and second magnetic cores 20-1 and 20-2 is controlled, the characteristic of an inductive electromotive force transferred to the inside of chamber housing 10 is controlled, thereby controlling the characteristic of the plasma generated inside chamber housing 10.

Embodiment II

Figure 6A:
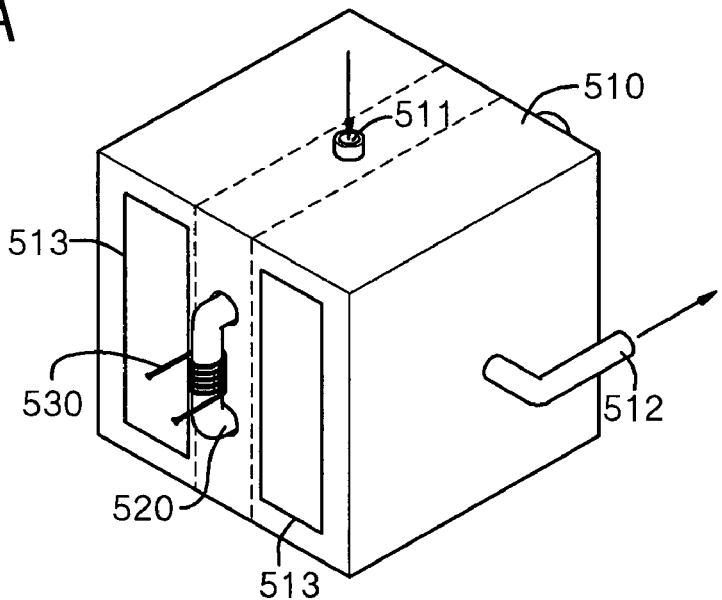
FIGS. 6A and 6B are a projection view and a cross-sectional view, respectively, of a plasma processing chamber according to the second embodiment of the present invention.
Figure 6B:
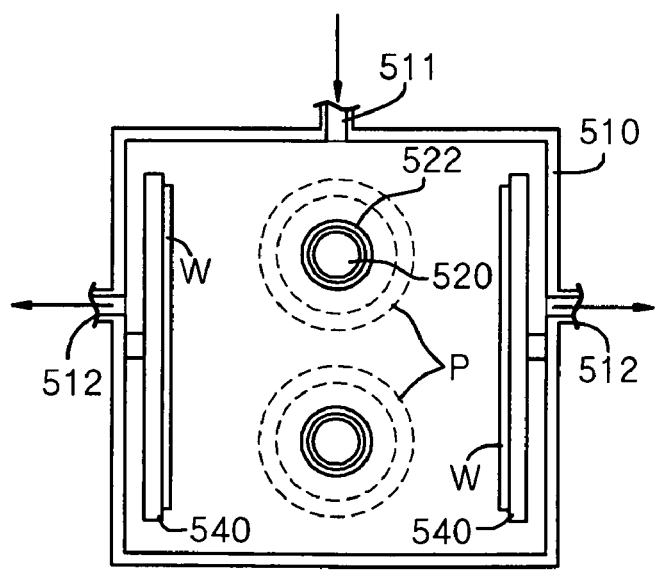

FIGS. 6A and 6B are a projection view and a cross-sectional view, respectively, of a plasma processing chamber according to a second embodiment of the present invention.

Referring to FIGS. 6A and 6B, the plasma processing chamber according to the second embodiment generates the inductive coupled plasma P in the same manner as the plasma processing chamber according to the first embodiment described above. Thus, a repeated description thereof will not be presented.

In the plasma processing chamber, two susceptors 540 are positioned at two sidewalls opposed to each other inside chamber housing 510. Two discharge inducing bridges 522 are horizontally positioned in a vertical plane and equally spaced apart from two susceptors 540. Magnetic core 520 with winding coil 520 is mounted in the discharge inducing bridges 522.

Gas entrance 511 is formed in the ceiling of chamber housing 510. The gas entrance 510 is preferably positioned above discharge inducing bridges 522, so that a processing gas inputting through gas entrance 511 jets above discharge inducing bridges 522, and evenly spreads and flows downward chamber housing 10. Two gas exits 512 are formed in the two sidewalls of the chamber housing, where chamber susceptors 540 are positioned, thereby having a separate exhaust structure.

The plasma processing chamber of the second embodiment has the plasma generating structure described with reference to the first embodiment. The plasma processing chamber according to the second embodiment is effective in reducing the equipment width by its structural features such that discharge inducing bridges 522 are positioned to be perpendicular to the inner center of chamber housing 510, two susceptors are vertically positioned at two sidewalls, so as to be around discharge inducing bridges 522 and to process two sheets of the work substrates W vertically positioned.

Figure 7A:
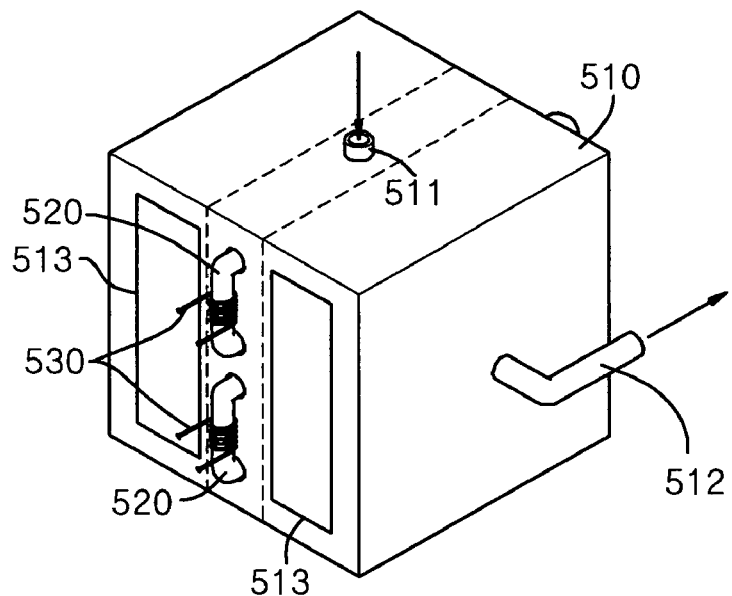
FIGS. 7A and 7B are a projection view and a cross-sectional view, respectively, of a plasma processing chamber including a number of discharge inducing bridges which are horizontally positioned in a vertical plane.
Figure 7B:
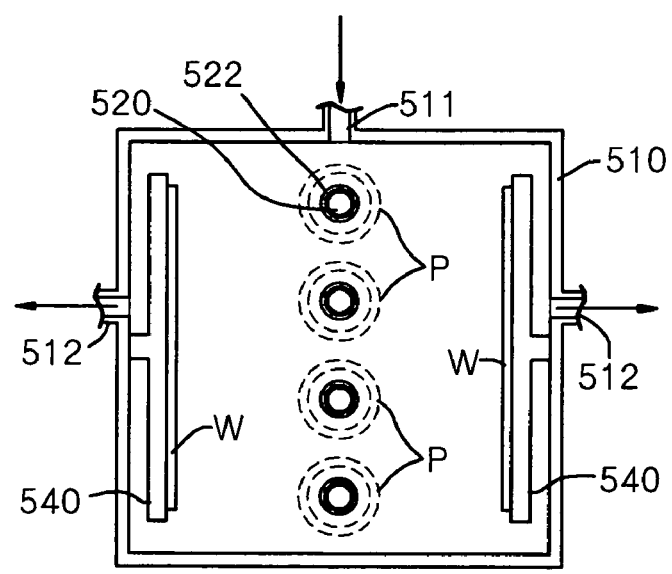

FIGS. 7A and 7B are a projection view and a cross-sectional view, respectively, of a plasma processing chamber including a number of discharge inducing bridges.

Referring to FIGS. 7A and 7B, another modified plasma processing chamber according to the second embodiment includes four discharge inducing bridges 522 which are horizontally positioned in a vertical plane inside chamber housing 510. The number of discharge inducing bridges 522 may be increased to generate the large-area plasma.

Like the plasma processing chamber of the first embodiment, the plasma chamber of the second embodiment may be easily modified by increasing the number of discharge inducing bridges coupled with a transformer and extending the length of the discharge inducing bridges, to generate the large-area plasma. Furthermore, the length, shape and position structure of the discharge inducing bridges may be modified according to the structural features of the plasma processing chamber. The structure or number of the gas entrance may be appropriately modified to form uniform plasma.

Embodiment III

Figure 8A:
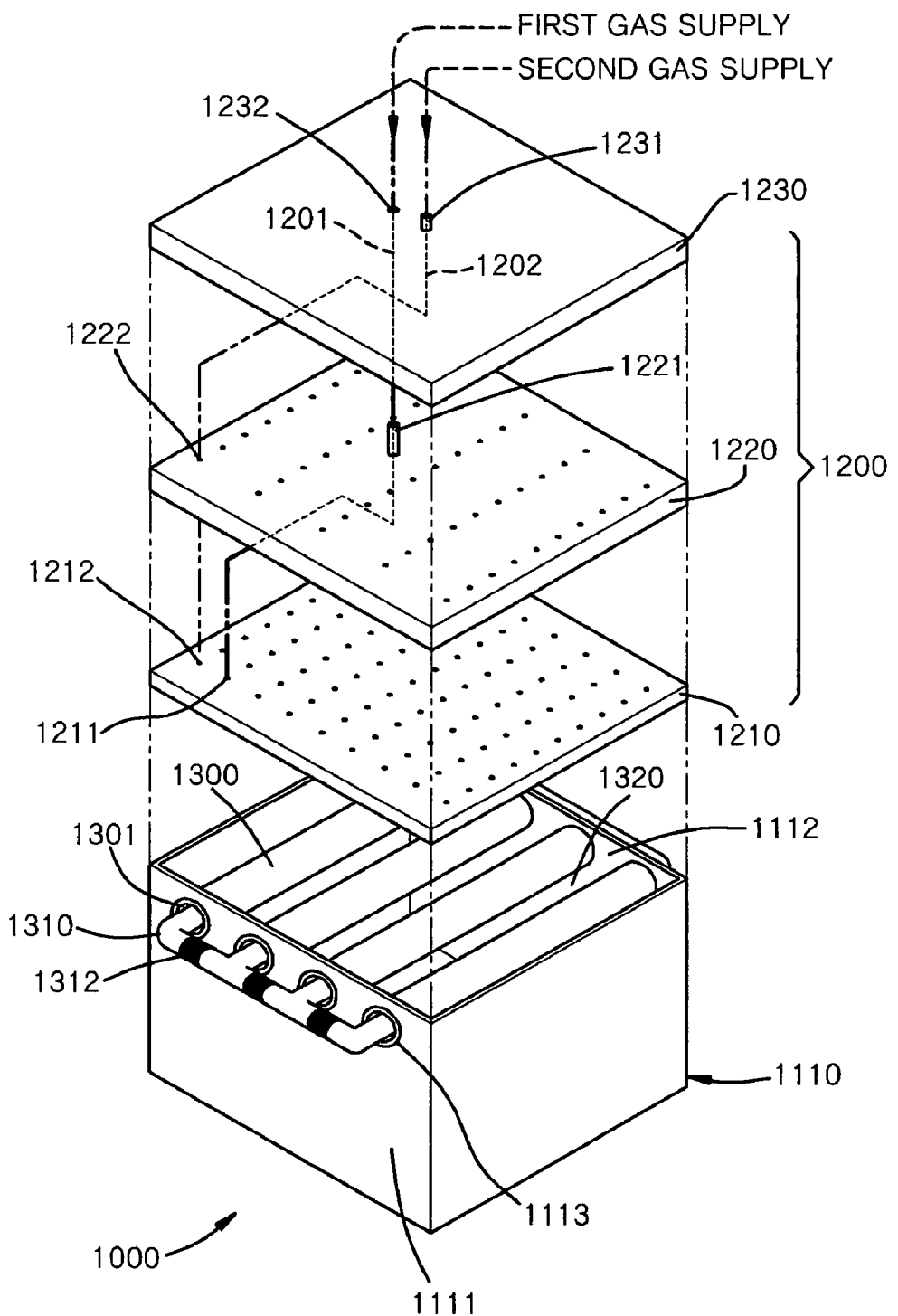
FIGS. 8A, 8B and 8C are a partially exploded view, projection view and a cross-sectional view, respectively, of a plasma processing chamber according to the third embodiment of the present invention.
Figure 8B:
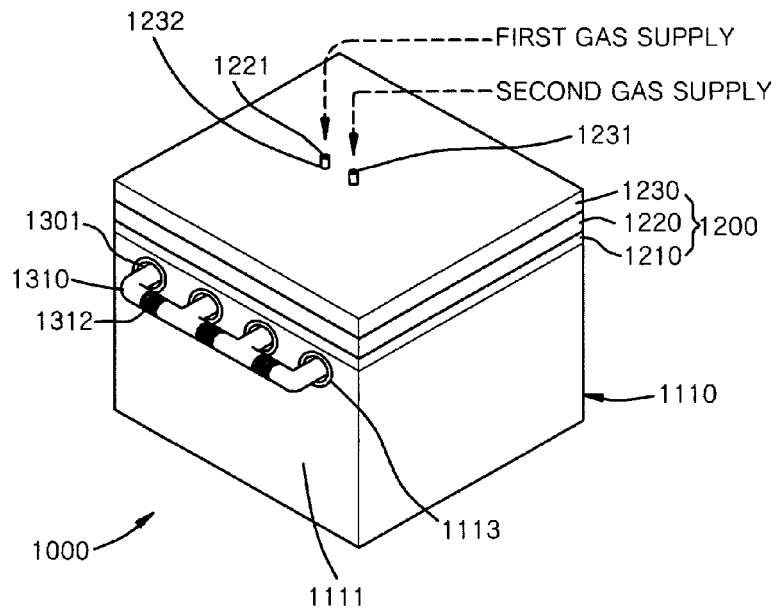
Figure 8C:
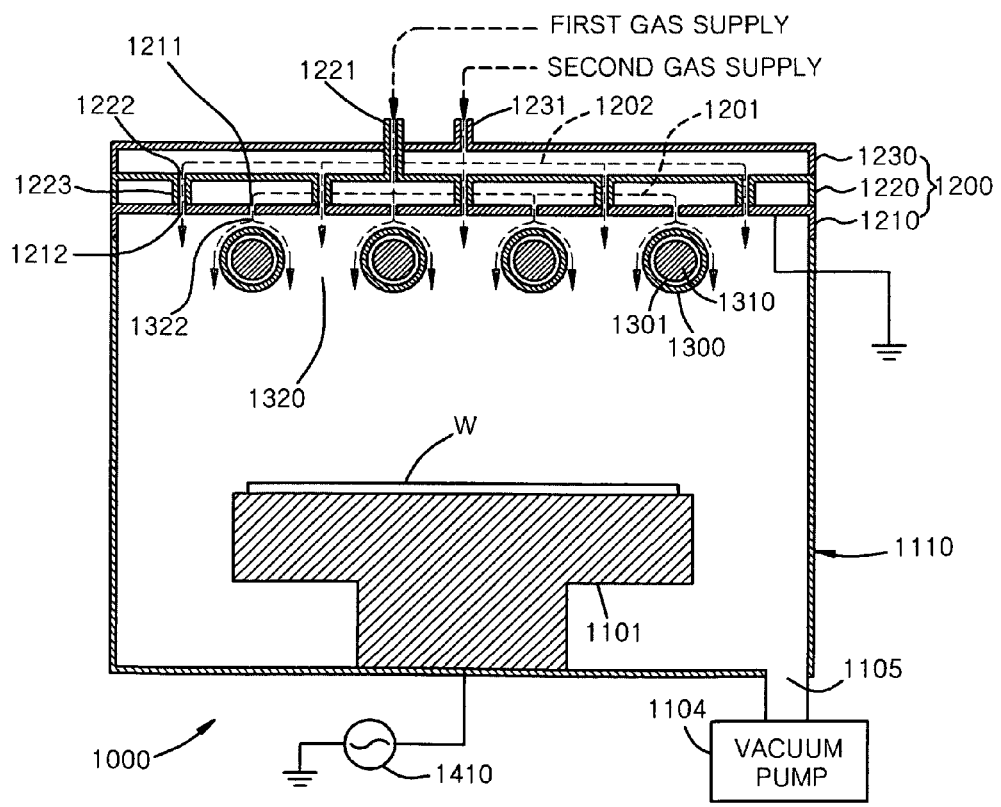

FIGS. 8A, 8B and 8C are a projection view, an exploded view and a cross-sectional view, respectively, of plasma processing chamber 1000 according to a third embodiment of the present invention.

Referring to FIGS. 8A, 8B and 8C, plasma processing chamber 1000 includes chamber housing 1110 having susceptor 1101 on which work substrate W is placed; and gas supply unit 1200 positioned on chamber housing 1110.

A plural number of discharge inducing bridges 1300 are horizontally positioned in a horizontal manner at an upper part of chamber housing 1110, from first sidewall 1111 of chamber housing 1110 to second sidewall 1112 opposed to first sidewall 1111, above susceptor 1101. Gas exit 1105 is positioned at a lower part of chamber housing 1110 and is connected to vacuum pump 1104.

Holes 1113 are formed in two sidewalls 1111 and 1112 of chamber housing 1110, from and to which discharge inducing bridges 1300 are connected. Holes 1113 receive both ends of each discharge inducing bridge 1300. Hollow region 1301 of each discharge inducing bridge forms a passage within chamber housing 1110. Magnetic core 1310 with winding coil 1312 is embedded in hollow region 1301. Magnetic core 1310 with winding coil 1312 forms a transformer.

Figure 9A:
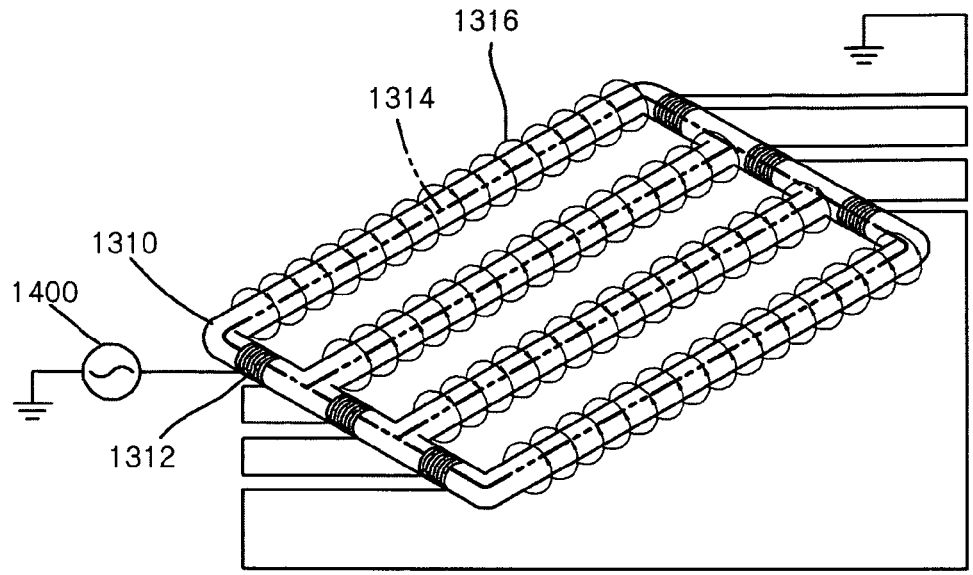
FIGS. 9A and 9B are isometric schematic views illustrating exemplars of transformers formed by using a closed core with a multiple loop or a single loop.
Figure 9B:
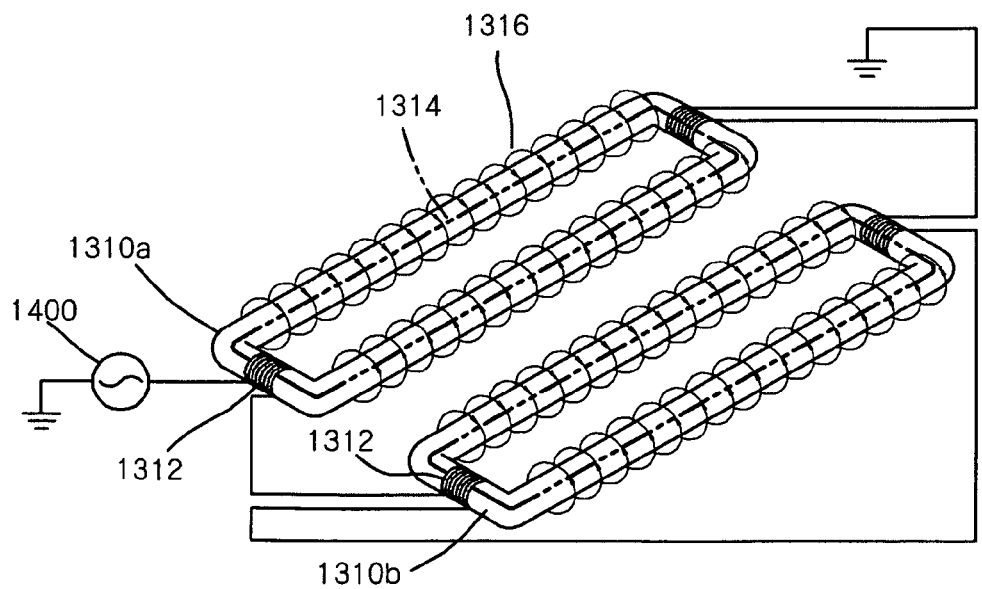
Figure 10:
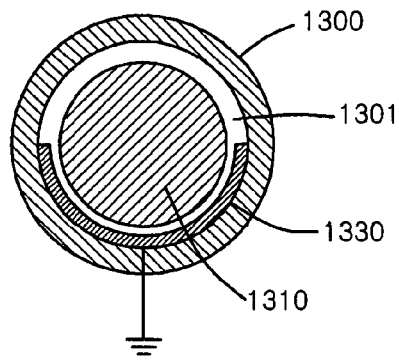
FIG. 10 is a cross-sectional view illustrating one example of a discharge inducing bridge including a ground electrode.

FIGS. 9A and 9B are examples of a transformer formed by using a closed core with a multiple loop or a single loop, while FIG. 10 is an example of a discharge inducing bridge including a ground electrode.

As shown in FIG. 9A, magnetic core 1310 mounted in each discharge inducing bridge 1300 is a closed core structure having the multiple loop. Winding coil 1312 wound around magnetic core 1310 is wound around each loop. As shown in FIG. 9B, magnetic core 1310 may include a number of closed cores 1310a and 1310b, each closed core having a single loop.

A plural number of winding coils 1312 are electrically connected to first power supply source 1400 supplying the RF power. Winding coils 1312 may be electrically connected to first power supply source 1400 in series, or in parallel, or both in series and parallel. Although not shown in the drawings, an impedance matching box is positioned between a number of winding coils 1312 and first power supply source 1400. However, the RF power supply source capable of controlling the output voltage without a separate impedance matching box may be used. Susceptor 1101 is electrically connected to second power supply source 1410 supplying the bias power. For this, the RF power supply source capable of controlling the output voltage without a separate impedance matching box may be also used.

When an alternate current (AC) power of a first frequency is supplied from first power supply source 1400 to winding coil 1312, magnetic flux 1314 is induced along the multiple loop of the magnetic core 1310. Inductive electric field 1316 is formed to cover discharge inducing bridges 1300. Thus, plasma discharge is formed around discharge inducing bridges 1300 inside chamber housing 1110.

Referring again to FIGS. 8A through 8C, gas supply unit 1200 has a separate gas supply structure, thereby enabling more uniform high-density plasma. Gas supply unit 1200 includes gas jet plate 1210, gas distribution plate 1220 and upper cover 1230, which are vacuum-insulated and sequentially stacked on chamber housing 1110. Each interlayer is vacuum-insulated.

Gas jet plate 1210 includes first and second gas supply channels 1211 and 1212, and is electrically grounded. First gas supply channel 1211 includes a number of through holes linearly positioned, along the longitudinal direction of upper region 1322 of discharge inducing bridges 1300. Second gas supply channel 1212 includes a number of through holes linearly positioned, along the longitudinal direction of region 1320 between discharge inducing bridges 1300.

Gas distribution plate 1220 includes a number of through holes 1222. Through hole 1222 are regularly formed above second gas supply channel 1212 and correspond to the through holes of second gas supply channel 1212. Gas distribution plate 1220 includes first gas entrance 1221 receiving a first processing gas and exhausting the first processing gas above gas jet plate 1210.

Upper cover 1230 covers the upper part of gas distribution plate 1220 and includes second gas entrance 1231 receiving a second processing gas. Upper cover 1230 includes through hole 1232 at a position corresponding to first gas entrance 1221.

Gas supply unit 1200 forms one first gas supply passage 1201 from first gas entrance 1221 to first gas supply channel 1211, and one second gas supply passage 1202 from second gas entrance 1231 to second gas supply channel 1212.

The first processing gas flows toward upper region 1322 of discharge inducing bridges 1300, and the second processing gas flows toward region 1320 between the discharge inducing bridges. The first processing gas forms the plasma before the second processing gas, while flowing toward upper region 1322 of discharge inducing bridges 1300. The first processing is mixed with the second processing gas in an ionized state. The first processing gas may be, for example, Ar, $N_2$ or $O_2$ as a carrier gas. The second processing gas may be $SiH_4$, $CH_4$, $CH_3$ or $Cl_2$ as a source gas.

Susceptor 1101 is electrically connected to second power supply source 1410 supplying the bias power of a second frequency. Bias applied to the susceptor 1101 is discharged toward gas jet plate 1210 connected to the ground. Since discharge inducing bridges 1300 are positioned in the discharge path, thereby interrupting the uniform discharge. Discharge inducing bridge 1300 includes ground electrode 1330 positioned longitudinally at a lower part of discharge inducing bridge 1300, to face susceptor 101, as illustrated in FIG. 10.

Figure 11:
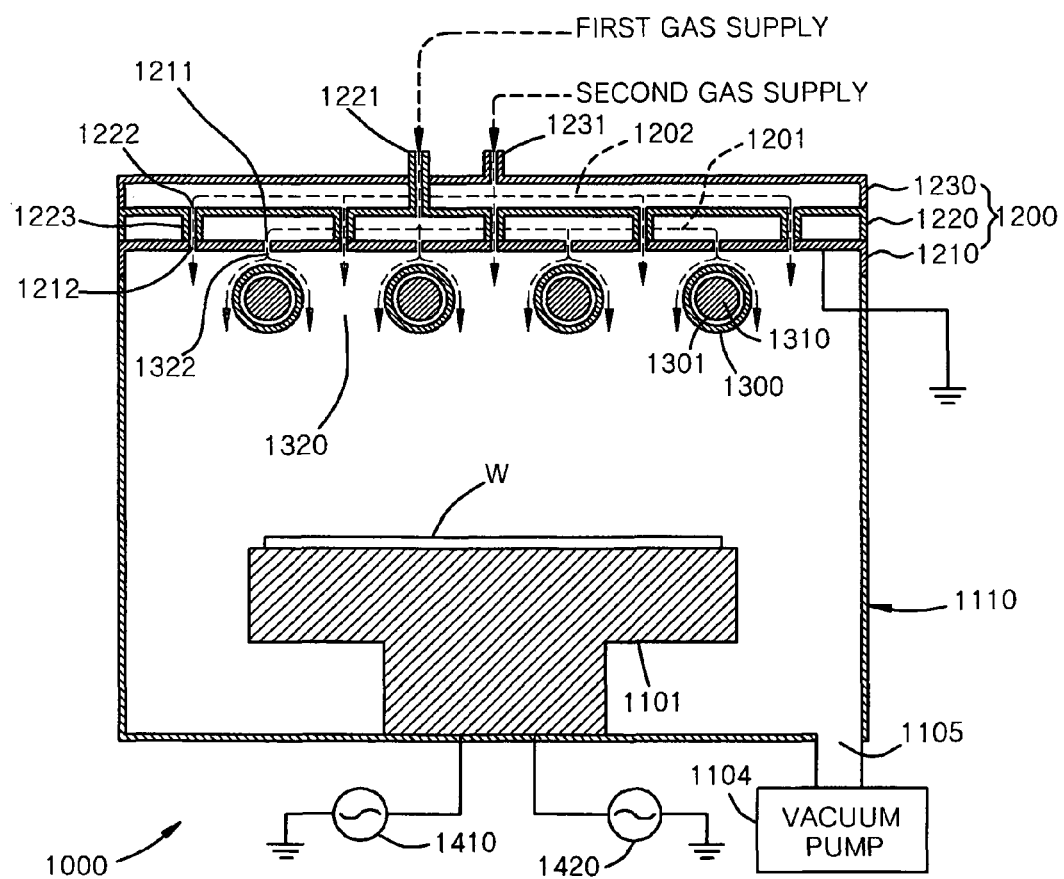
FIG. 11 is a cross-sectional view illustrating a plasma processing chamber including a dual bias power.

FIG. 11 is a cross-sectional view of a plasma processing chamber including a dual bias power.

Referring to FIG. 11, susceptor 1101 is electrically connected to second power supply source 1410 supplying the bias power of a second frequency, and is electrically connected to third power supply source 1420 supplying the bias power of a third frequency. The second frequency is different from the third frequency.

Figure 12A:
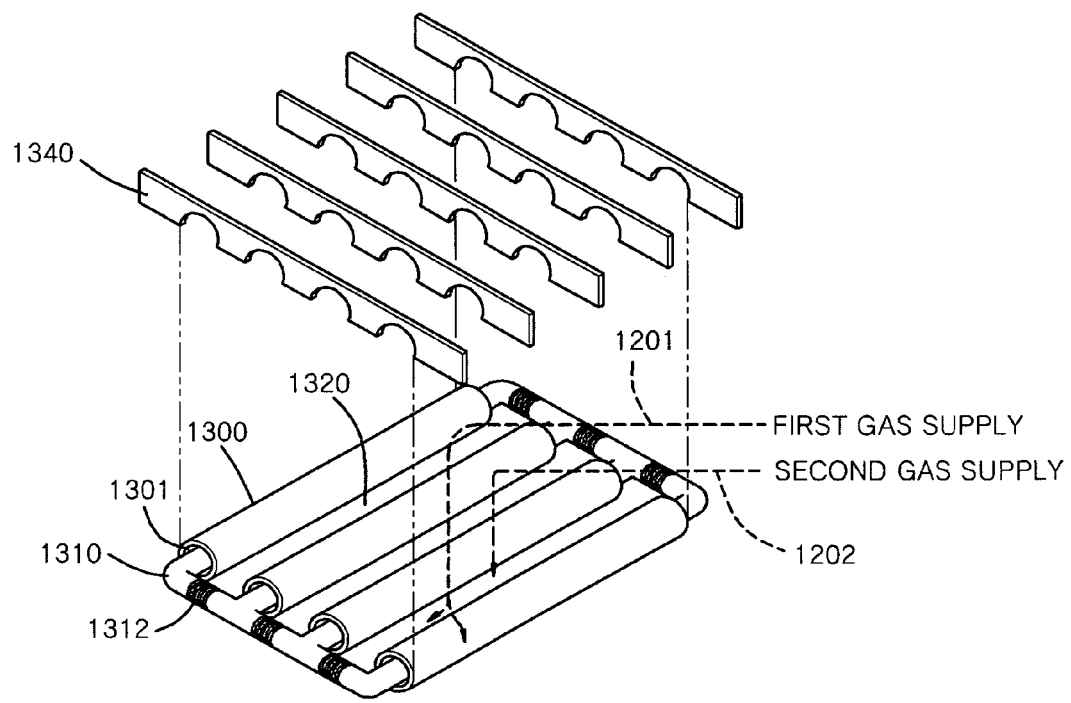
FIGS. 12A and 12B are projection views, respectively illustrating a discharge separating partition in its dissembled state and in an assembled state.
Figure 12B:
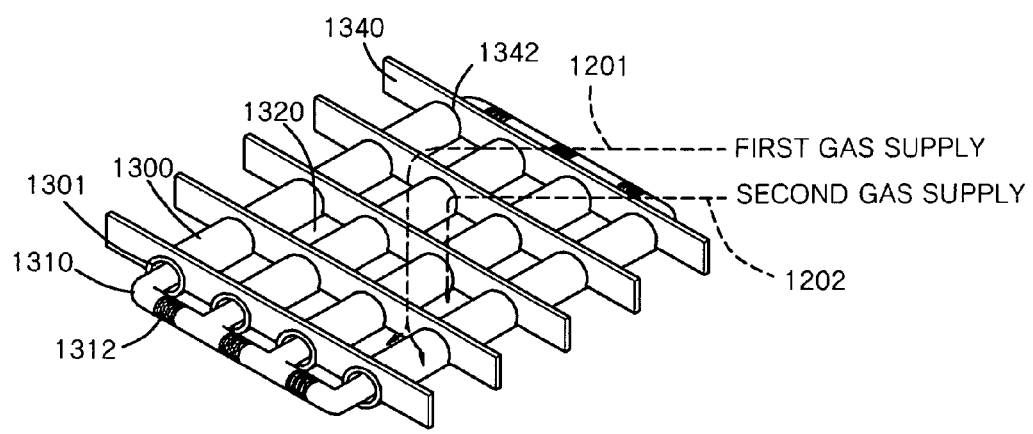

FIGS. 12A and 12B are a dissembled view and an assembled view of a discharge separating partition.

Referring to FIGS. 12A and 12B, in plasma processing chamber 1000, the plasma discharge is formed along discharge inducing bridges 1300. Here, a number of divided discharge separating partitions 1340 may be used to prevent the plasma discharge from biasing. Divided discharge separating partitions 1340 are mounted so as to be at right angles to the longitudinal direction of discharge inducing bridges 1300, so that the plasma formation region is divided into many. As a result, uniform plasma discharge is formed on the whole. Discharge separating partitions 1340 include an insulating material or a metal manterial.

Figure 13A:
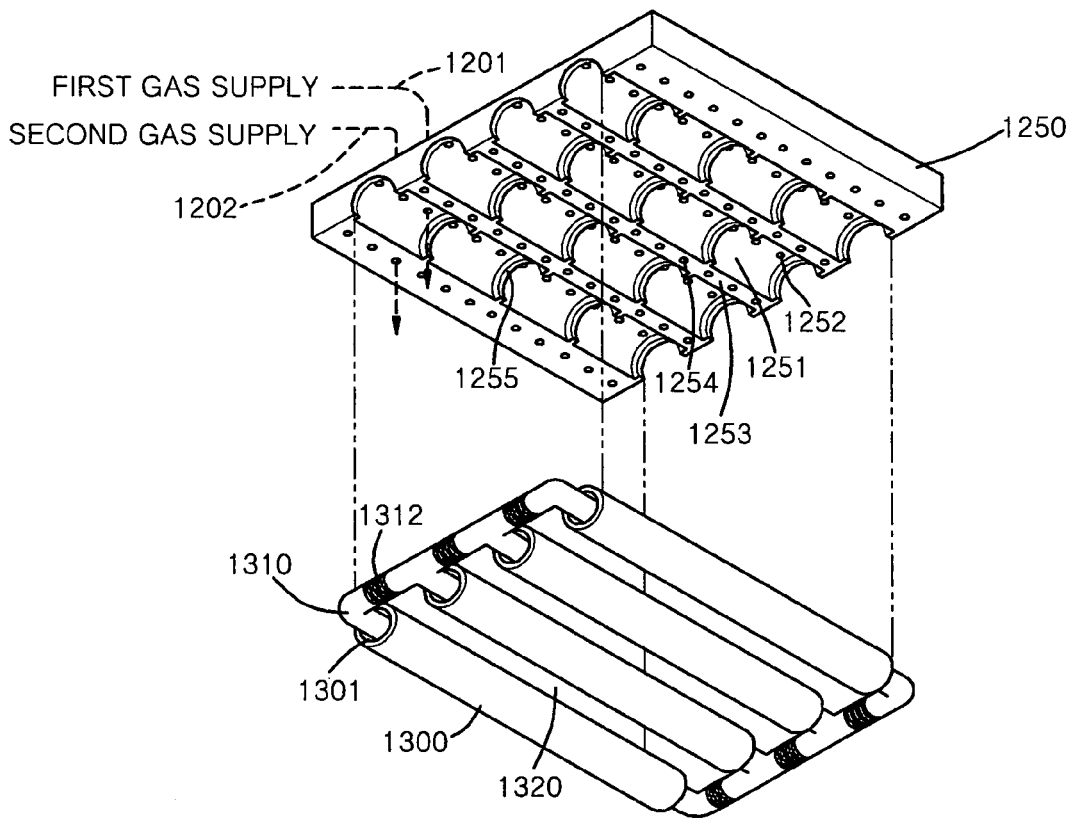
FIGS. 13A and 13B are projection views, respectively illustrating a discharge shade in its dissembled state and in an assembled state.
Figure 13B:
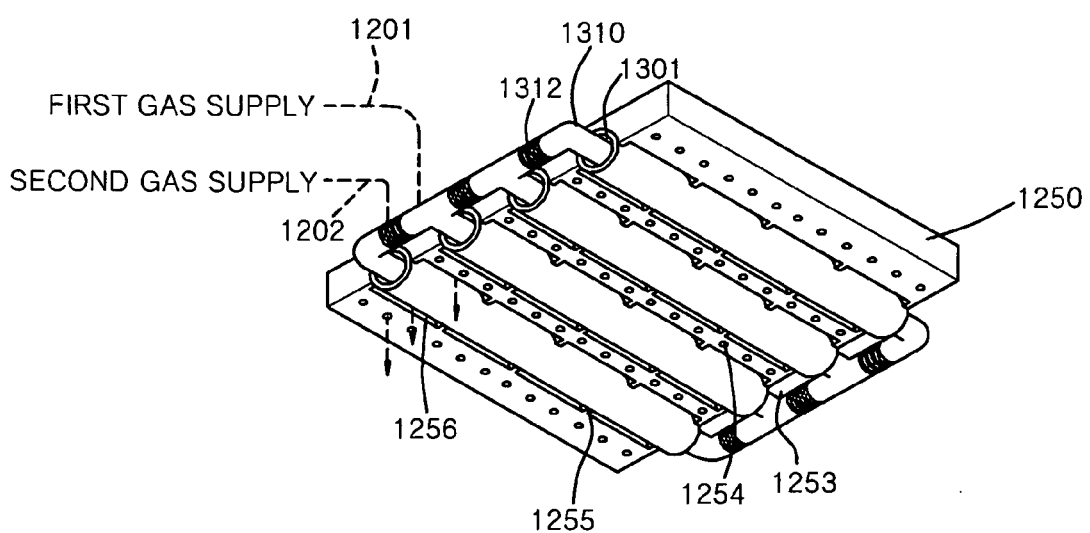
Figure 14:
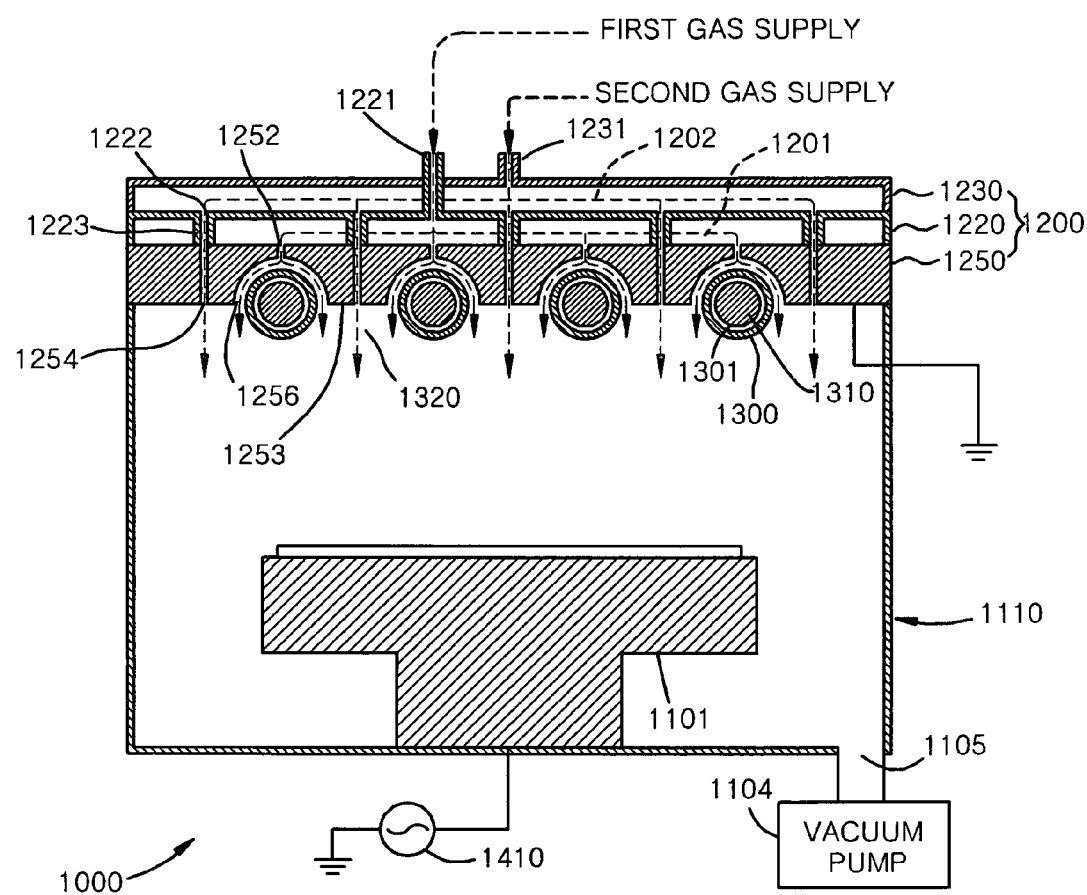
FIG. 14 is a cross-sectional view of a plasma processing chamber including a discharge shade.
Figure 15A:
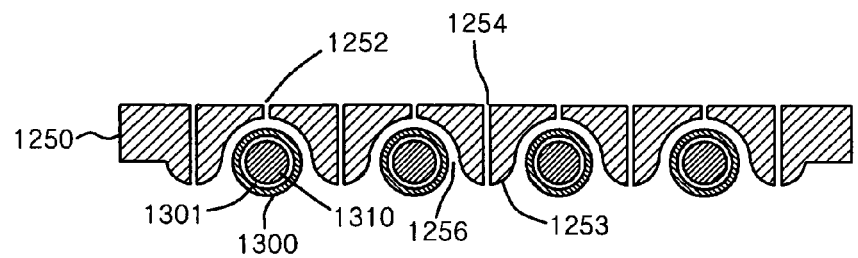
FIGS. 15A, 15B and 15C are cross-sectional views illustrating examples of a protrusion structure of a discharge shade.
Figure 15B:
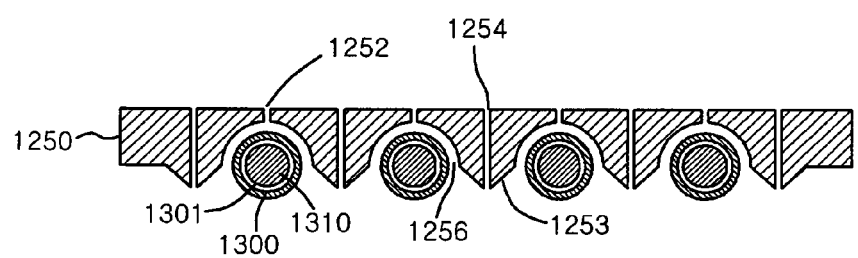
Figure 15C:
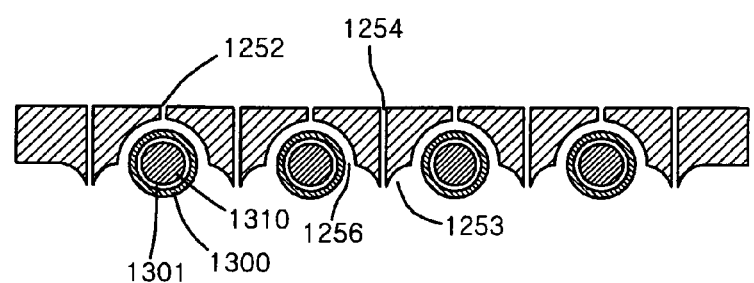

FIGS. 13A and 13B are projection views of a dissembled and assembled discharge shade, FIG. 14 is a cross-sectional view of a plasma processing chamber including a discharge shade, and FIGS. 15A through 15C are examples of a protrusion structure of a discharge shade.

Referring to FIGS. 13A and 13B, another modified plasma processing chamber 1000 includes gas supply unit 1200 with discharge shade 1250 to be positioned on discharge inducing bridges 1300.

Discharge shade 1250 is positioned between gas distribution plate 1220 and chamber housing 1110. Discharge shade 1250 includes first gas supply channel 1252 and second gas supply channel 1254 which are alternately formed, such as gas jet plate 1210 shown in FIG. 11.

Discharge shade 1250 surrounds each discharge inducing bridge 1300 at a predetermined interval, and its portions facing susceptor 1101 is opened along each discharge inducing bridge 1300 and is electrically grounded. Discharge shade 1250 has dome strucutre 1251 at each portion corresponding to each discharge inducing bridge 1300, and protrusion 1253 at each region 1320 between discharge inducing bridges 1300. First gas supply channel 1252 is formed along dome structure 1251, and second gas supply channel 1254 is formed along protrusion 1253. Narrow discharge region 1256 is formed between discharge inducing bridge 1300 and dome structure 1251 of discharge shade 1250. In order to prevent partial discharge and to form more uniform discharge, a number of discharge separating partitions 1255 may be formed in the region of dome structure 1251.

While a first processing gas passes through narrow discharge region 1256, the plasma discharge is formed. Since protrusion 1251 of discharge shade 1250 protrudes toward susceptor 1101, more stable discharge is formed by bias. The shape of protrusion 1251 may be variously modified and carried out, as shown in FIGS. 15A through 15C.

As described above, the plasma processing chamber according to the third embodiment includes the dual gas supply structure which is suitable for the unique discharge structure with a number of discharge inducing bridges. In addition, the large-area high-density plasma is uniformly generated, by providing the electrode grounded to the discharge separating partitions or discharge shade and the discharge inducing bridges.

Embodiment IV

Figure 16A:
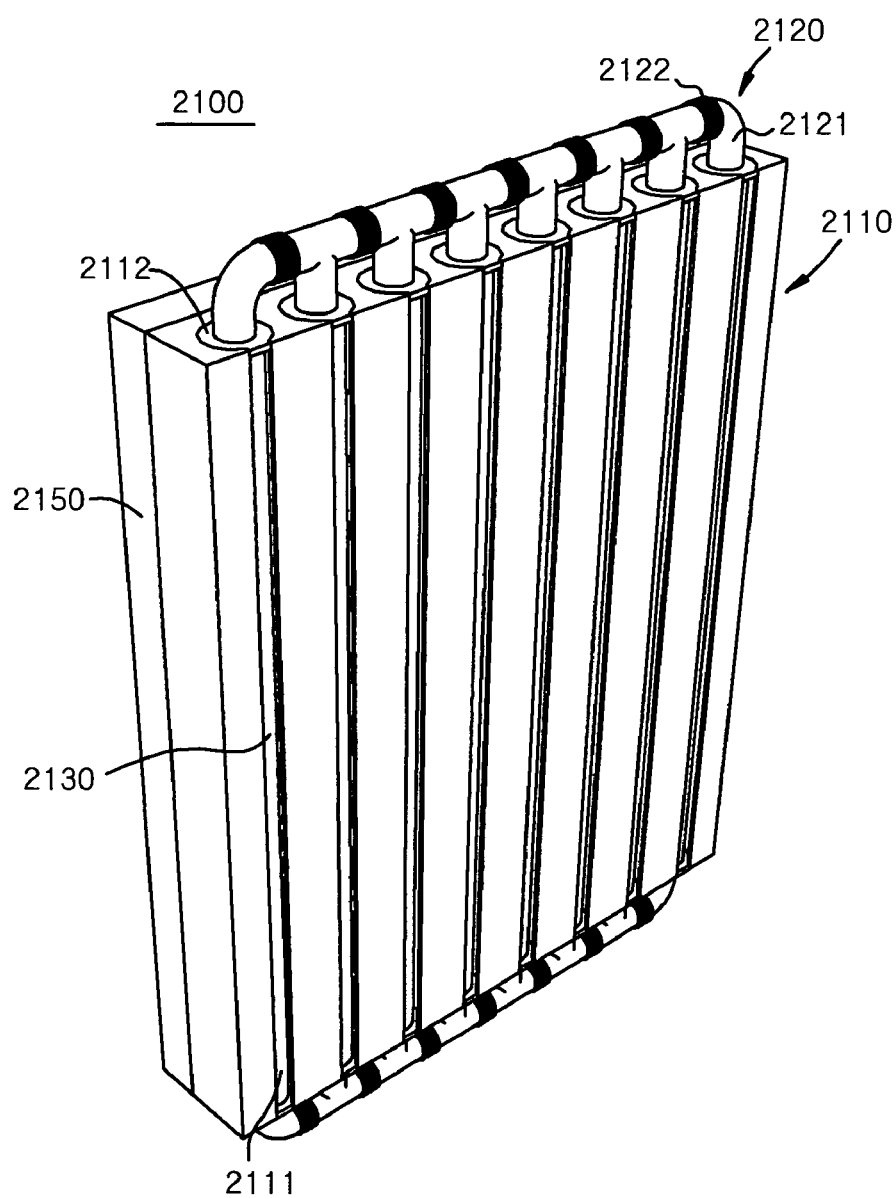
FIGS. 16A and 16B are a front projection view and rear perspective view, respectively, illustrating a plasma reactor according to the fourth embodiment of the present invention.
Figure 16B:
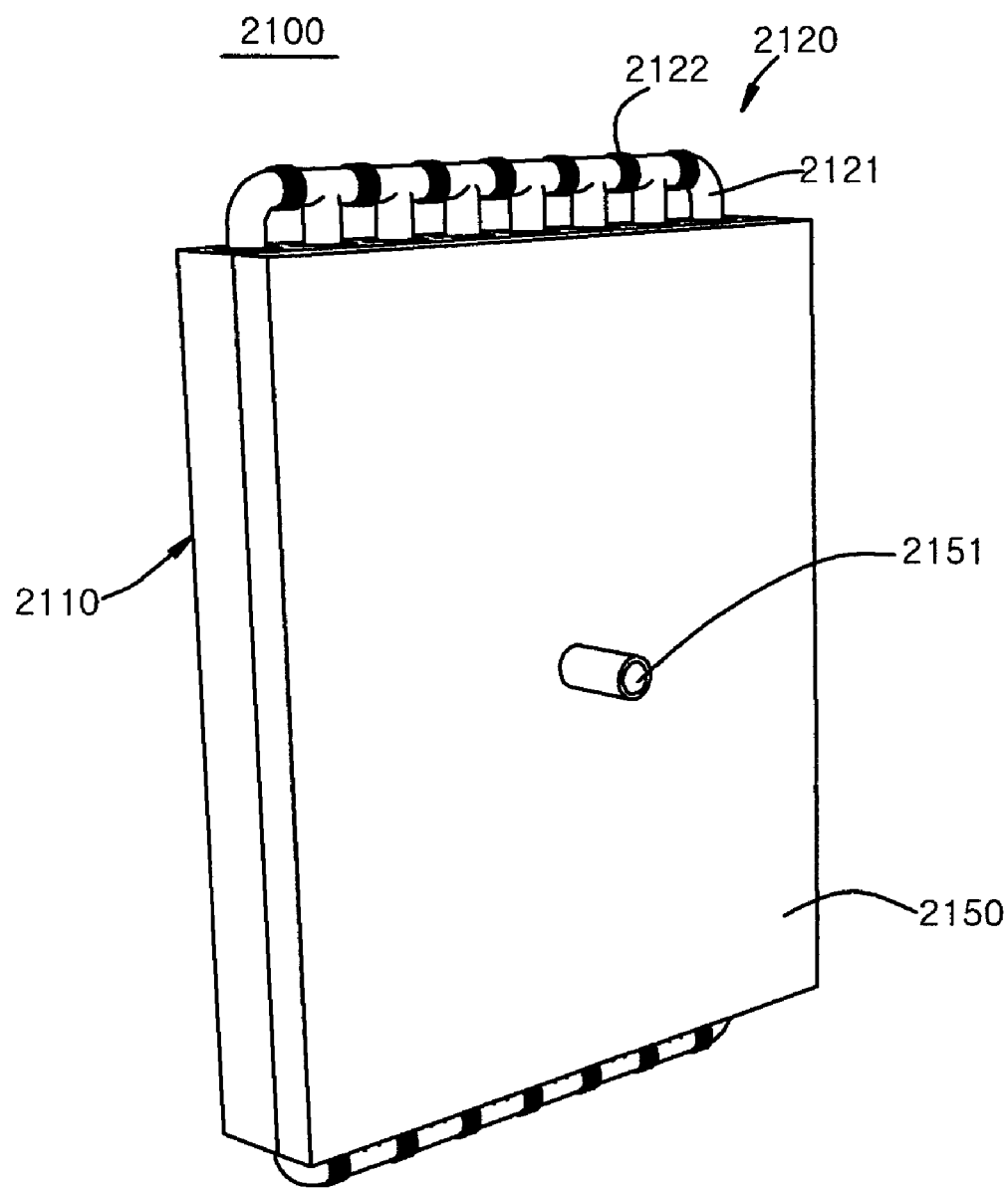

FIGS. 16A and 16B are front projection view and rear projection view, respectively, of plasma reactor 2100 according to the fourth embodiment of the present invention.

Referring to FIGS. 16A and 16B, plasma reactor 2100 includes reactor body 2110 with a number of discharge chambers 2114 which are vertically positioned in a vertical plane. Reactor body 2110 includes a number of plasma jet slits 2111 which are opened, along discharge chambers 2114, at the front side of reactor body 2110, to output plasma. Gas supply unit 2150 supplying a gas to discharge chambers 2114 is positioned at the rear side of reactor body 2110. Gas supply unit 2150 includes gas entrance 2151 connected to a gas source (not shown).

Reactor body 2110 has a vertically standing square block shape. The shape of reactor body 2110 may be various according to the shape of the work to be processed. For example, to process a workpiece in a discus shape, a reactor body may have a round shape on the whole, by forming the length of discharge chambers 2114 so as to be different from one another.

In reactor body 2110, a number of discharge chambers 2114 are vertically positioned in a vertical plane. The fourth embodiment uses eight discharge chambers 2114, but the number of the discharge chambers may be less or more than eight. The length and number of discharge chambers 2114 may decrease or increase according to the area of the workpiece to be processed. Plasma reactor 2100 may include at least one or two discharge chambers 2114.

Reactor body 2110 is made of a metal material such as aluminum, stainless or copper. Alternatively, it may be made of a coated metal, for example, anodized aluminum or aluminum coated with nickel. As another alternative, it may be made of a refractory metal. As a further alternative, whole reactor body 2110 may be made of an electrically insulating material such as quartz and ceramic, or other materials suitable for an intended plasma processing.

Figure 17A:
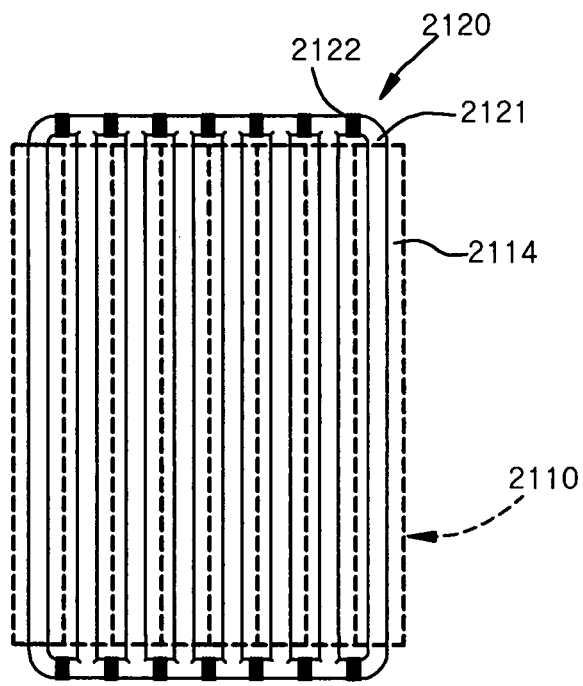
FIGS. 17A and 17B are examples of a multiple loop type closed core and a single loop type closed core.
Figure 17B:
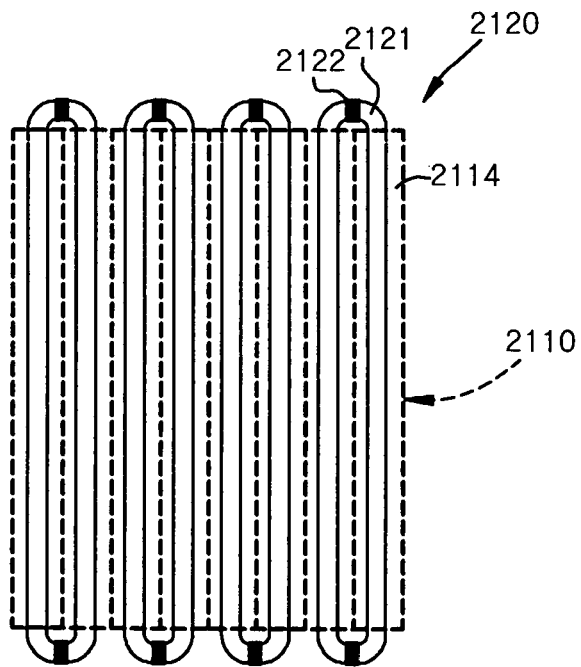

FIGS. 17A and 17B are examples of a multiple loop type closed core and a single loop type closed core.

Referring to FIG. 17A, magnetic core 2121 is longitudinally positioned through a number of discharge chambers 2114. Magnetic core 2121 with primary winding 2122 forms transformer 2120. Magnetic core 2121 is made of a ferrite material, but may be made of other alternative materials such as iron or air. Magnetic core 2121 includes a multiple loop generally shared in a number of discharge chambers 2114. The magnetic core 2121, alternatively, may include a single loop shared in two discharge chambers 2114 as shown in FIG. 17B. In this regard, a single loop type closed core may be mounted in one discharge chamber 2114.

Most of magnetic core 2121 is positioned in discharge chambers 2114, and parts thereof are exposed outside discharge chambers 2114. Primary winding 2122 is wound around the exposed parts. Primary winding 2122 includes a number of winding coils wound around the loops of magnetic core 2121, respectively. The winding coil maybe wound around every other loop. A number of winding coils are wound in the direction not to collide with the direction of the magnetic flux formed along every loop of magnetic core 2122.

Figure 18A:
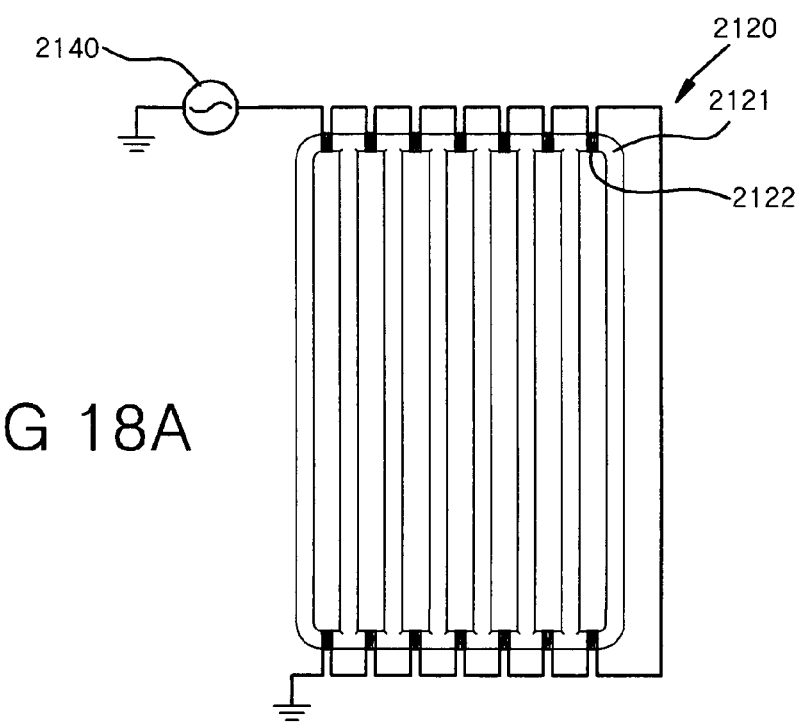
FIGS. 18A and 18B are plan views illustrating the structure of an electrical connection for a first power supply source and a primary winding.
Figure 18B:
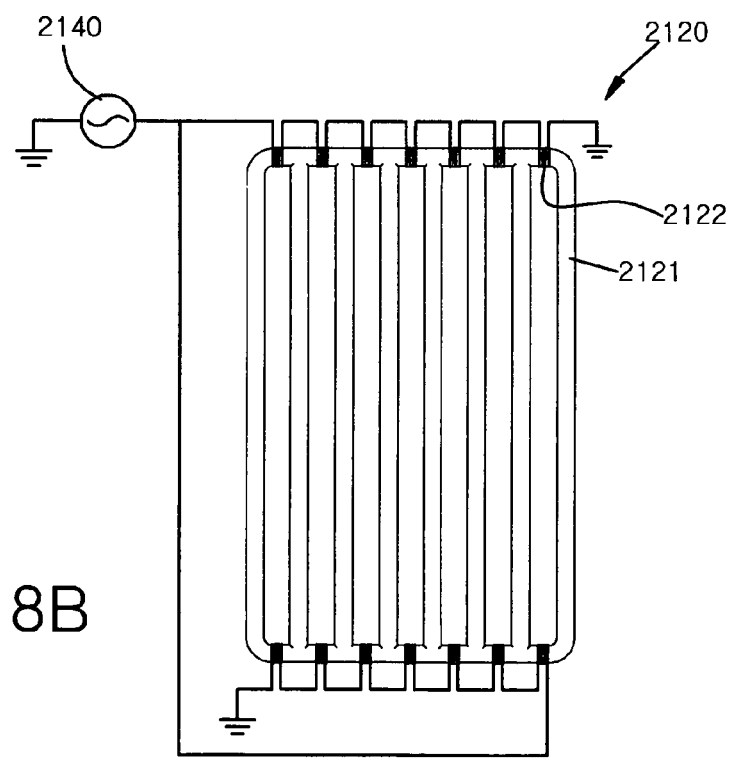

FIGS. 18A and 18B illustrate an electrical connection structure of first power supply source 2140 and primary winding 2122.

Referring to FIG. 18A, a number of winding coils forming primary winding 2122 is connected to first power supply source 2140 in series. As shown in FIG. 18B, a number of winding coils at the upper and lower portions of magnetic core 2121 may be connected in parallel to first power supply source 2140. A number of winding coils may be connected by any one selected from various electrical connection methods such as series, parallel, and a series/parallel combination.

First power supply source 2140 is an alternating current (AC) power supply source supplying the RF power. Although not shown in the drawings, an impedance matching box for impedance matching may be positioned at an output terminal of first power supply source 2140. Those skilled in this art, however, may understand that the RF power supply source capable of controlling the output voltage without a separate impedance matching box may be used.

Figure 19:
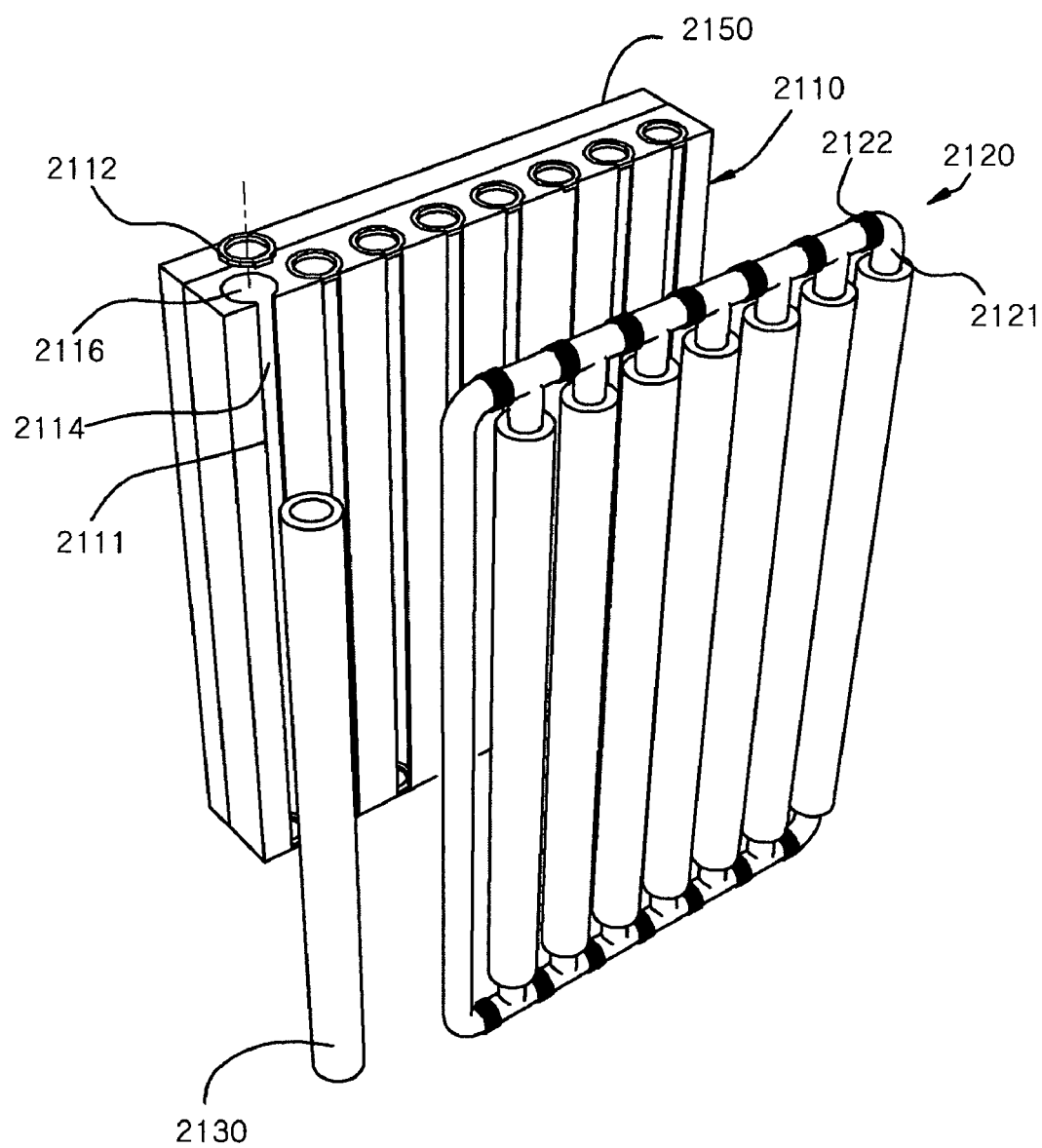
FIG. 19 is a partially exploded perspective view illustrating a reactor body, a magnetic core, and a core protecting tube.

FIG. 19 is an exploded projection view of reactor body 2110, magnetic core 2121 and core protecting tube 2130.

Referring to FIG. 19, a number of discharge chambers 2114 have a respective cylinder shape and are vertically positioned in a vertical plane, from the upper portion of reactor body 2110 to the lower portion thereof. Cover member 2112 covers both ends of each of respective discharge chamber 2114. Cover member 2112 is made of an insulating material such as quartz or ceramic. It may alternatively be made of the same metal material as reactor body 2110. When cover member 2112 is made of the same metal material as reactor body 2110, the cover member 2112 preferably includes an insulation region to have the electrical discontinuity, thereby preventing the eddy current.

Core protecting tube 2130 protectively covers the portion of magnetic core 2121 to be positioned in discharge chambers 2114. Core protecting tube 2130 has the same constitution as the discharge inducing bridges of the first through third embodiments. Core protecting tube 2130 is made of an electrically insulating material such as quarts or ceramic. Alternatively, core protecting tube 2130 may be made of the same metal material as reactor body 2110, and in this case, it includes an insulation region of the electrically insulating material so as to have the electrical discontinuity to prevent the eddy current.

Figure 20:
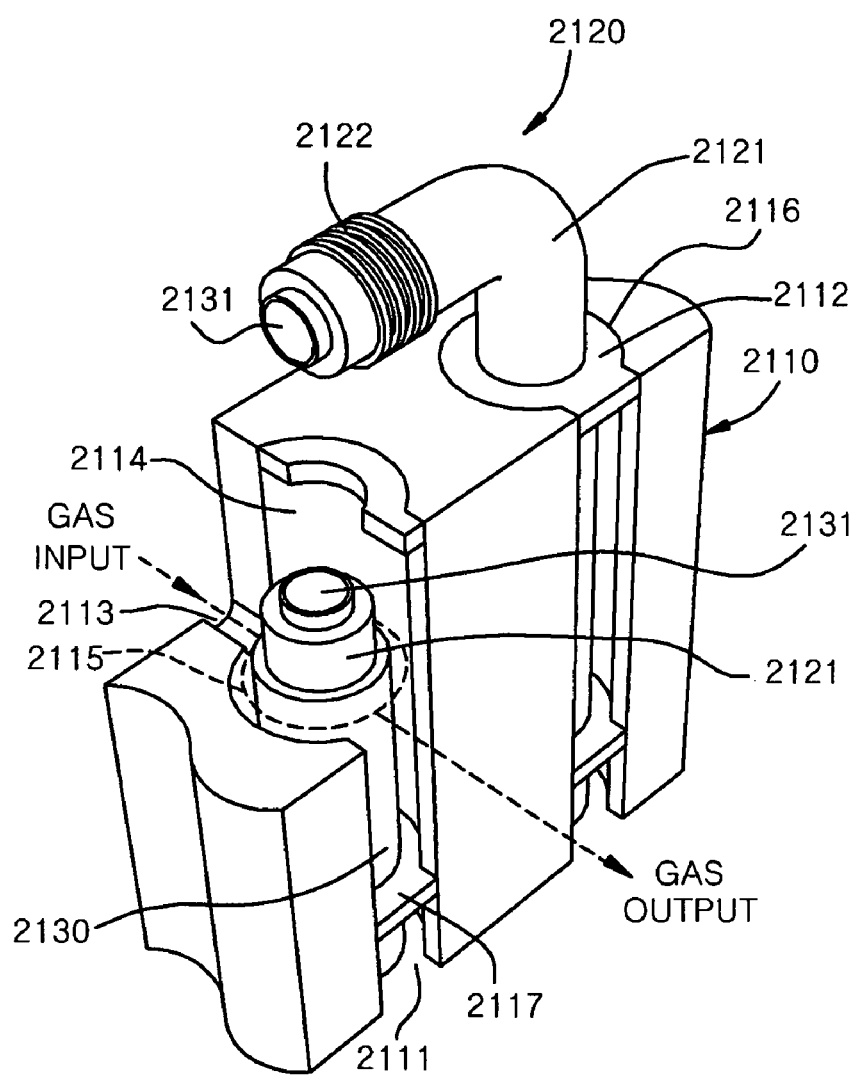
FIG. 20 is a partially cut-away view illustrating a reactor body with a magnetic core, a core protecting tube and a cooling channel mounted in a discharge chamber.
Figure 21:
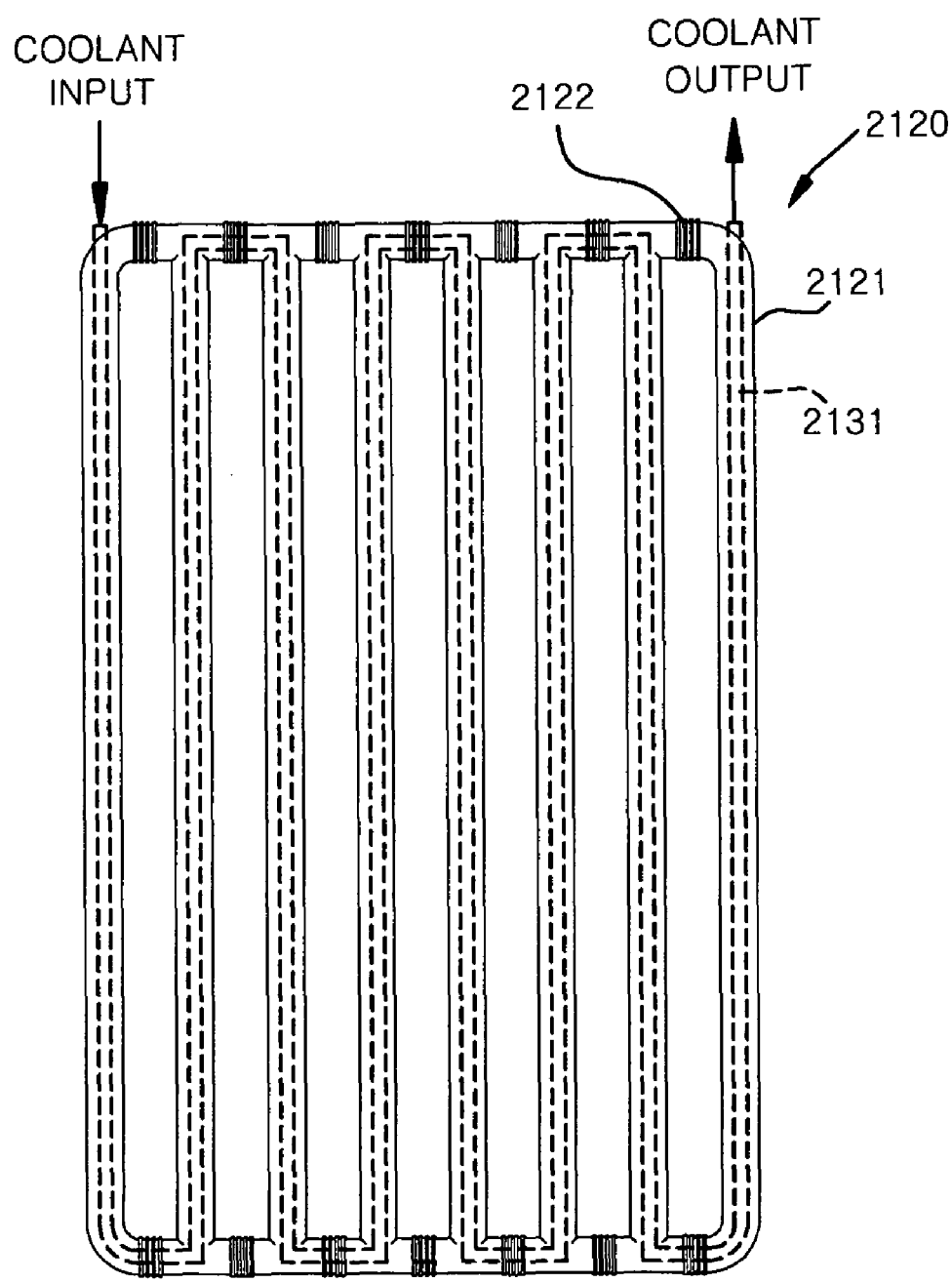
FIG. 21 is a cross-sectional view illustrating an example of a cooling channel positioned along a magnetic core.

FIG. 20 is a partial cut view of reactor body 2110 with magnetic core 2121, core protecting tube 2130 and cooling channel 2131 which are mounted in discharge chamber 2114, while FIG. 21 is an example of cooling channel 2131 positioned along magnetic core 2121.

Referring to FIGS. 20 and 21, the center of magnetic core 2121 is hollow, and cooling channel 2131 is formed along the hollow region of magnetic core 2121. For example, as shown in FIG. 21, cooling channel 2131 may be installed zigzag, along magnetic core 2121.

Although not shown in the drawings, the cooling channel may be formed in reactor body 2110, and the cooling channel may be a tube shape surrounding magnetic core 2121. When the tube-type cooling channel surrounding magnetic core 2121 is made of a metal material, it is preferable to form the insulation region to prevent the eddy current. Cooling channel 2131 may be positioned in magnetic core 2121 or reactor body 2110, or it may be positioned so as to surround the outside of magnetic core 2121. That is, the position of cooling channel 2131 may be selected from any one of the above or a combination thereof. In FIG. 20, reference number '2115' marked in dotted line represents a gas flow path and a plasma discharge path.

When the length of discharge chambers 2114 is long, the discharge region is divided into two or more regions by one or more discharge dividing partitions 2117, so that the plasma discharge is stabilized and the plasma is uniformly generated. Discharge dividing partitions 2117 are made of the electrically insulating material such as quartz or ceramic. Alternatively, discharge dividing partitions 2117 may be made of the same metal material as reactor body 2110, and in this case, it is preferable to include the insulation region of the electrically insulating material for the electrical discontinuity to prevent the eddy current.

Figure 22:
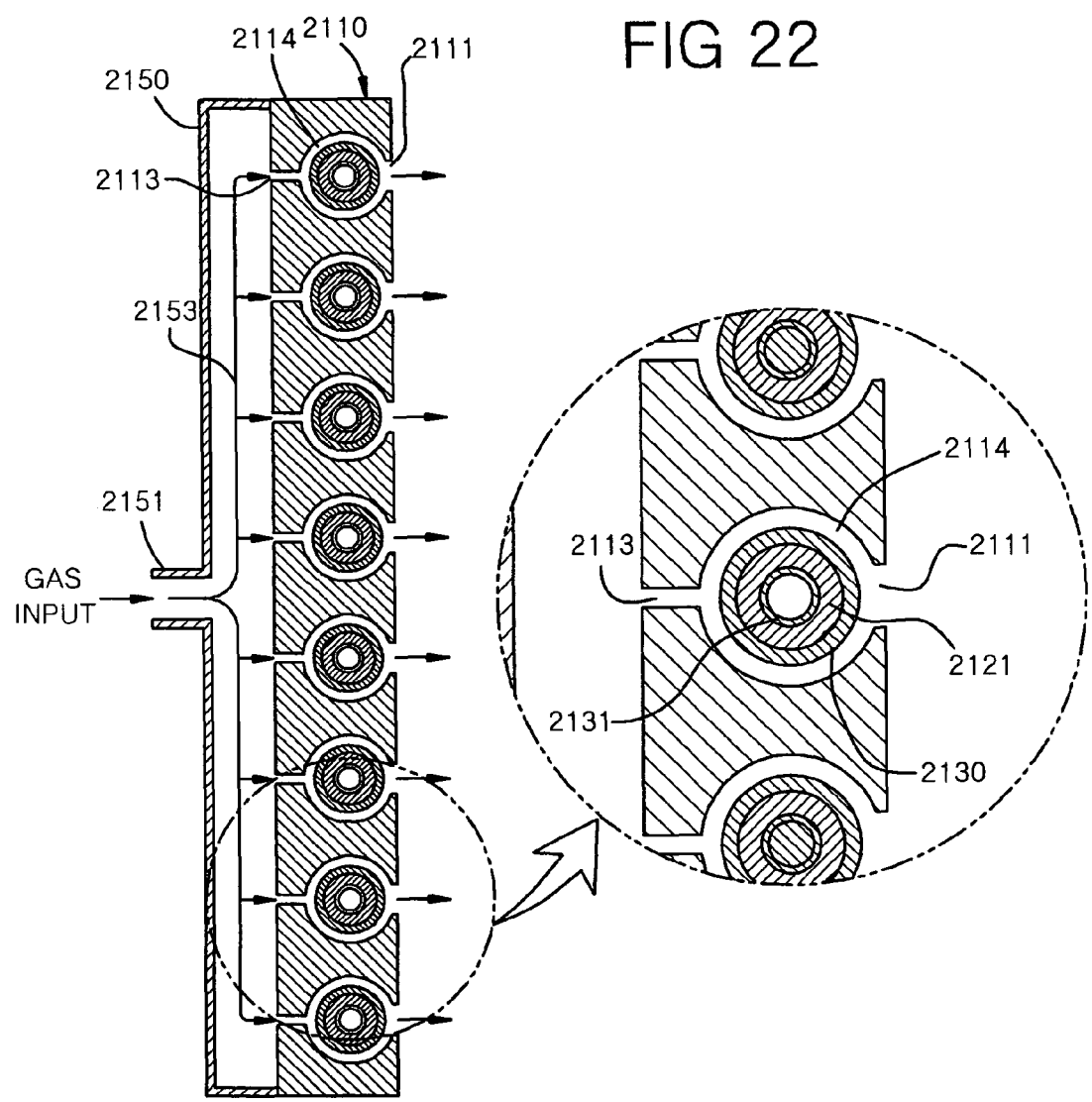
FIG. 22 is a cross-sectional view illustrating a plasma reactor and a partial enlarged view of a discharge chamber.

FIG. 22 is a cross-sectional view of plasma reactor 2100 and a partial enlarged view of discharge chamber 2114.

Referring to FIG. 22, gas supply unit 2150 is positioned at the rear side of reactor body 2110. Each discharge chamber 2114 includes gas injection opening 2113. A number of gas injection openings 2113 are formed, along the longitudinal direction of discharge chambers 2114. The gas inputting to gas entrance 2151 of gas supply unit 2150 is distributed along the distribution path with reference number 2153 marked as the arrows, and is evenly injected into a number of discharge chambers 2114 through gas injection openings 2113. As not specifically shown in the drawing, one or more gas dividing partitions for gas distribution preferably is positioned in gas supply unit 2150.

As described above, in plasma reactor 2100, the current of primary winding 2122 is driven by power supply source 2140, and the driving current of primary winding 2122 completes secondary circuit of transformer 2120, so that an AC potential forming the inductive coupled plasma is formed in discharge chambers 2114. As a result, the inductive coupled plasma surrounding an outside of core protecting tube 2130 is formed in each discharge chamber 2114. The formed plasma is jetted on the whole, through each plasma jet slit 2111.

Plasma reactor 2100 uniformly generates the large-area high-density plasma. Specifically, in order to obtain plasma in a desired form, plasma reactor 2100 is easily expanded by increasing the number and length of discharge chambers 2114. The structure of plasma reactor 2110 is constituted to be very thin, thereby minimizing the equipment area.

Figure 23:
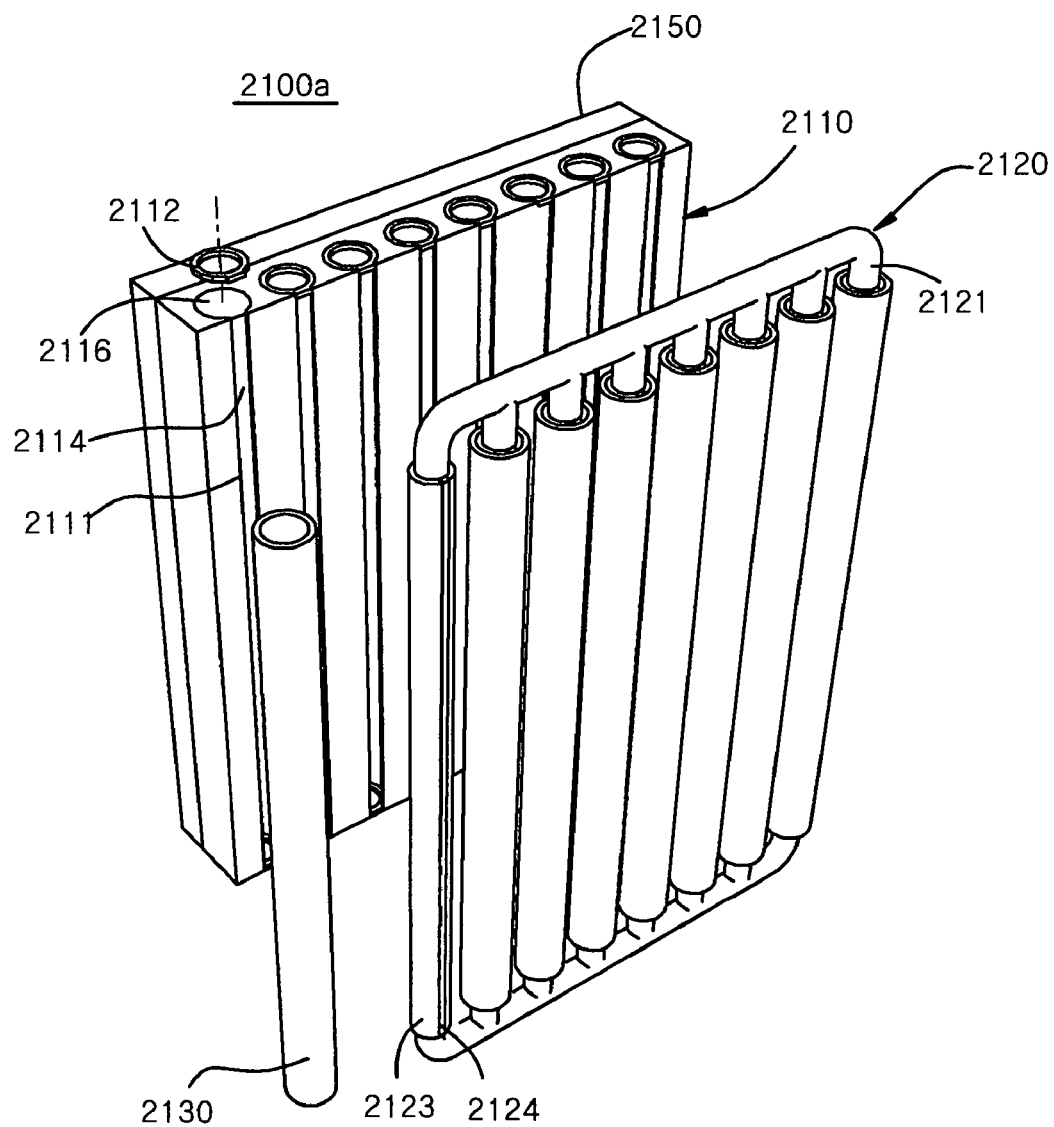
FIG. 23 is an exploded projection view illustrating another modified plasma reactor.
Figure 24A:
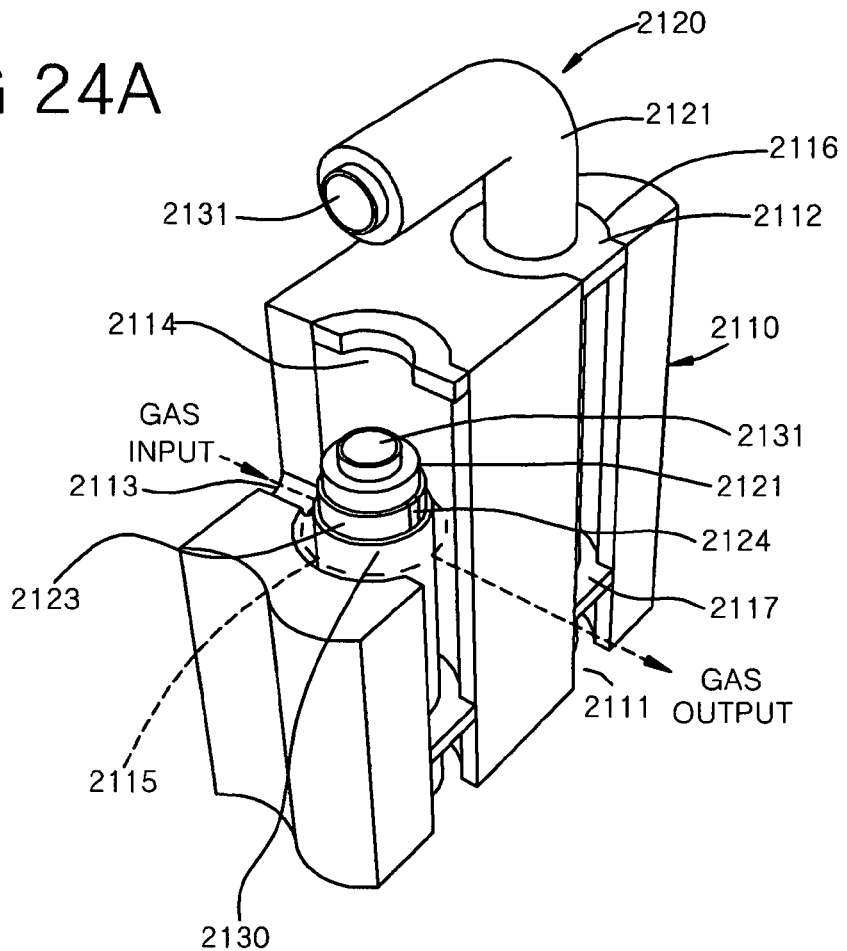
FIGS. 24A and 24B are a partially cut-away view and a partially enlarged cross-sectional view, respectively, illustrating a multiple discharge chamber in which a magnetic core, a core protecting tube, a cooling water supply pipe and a primary winding are mounted.
Figure 24B:
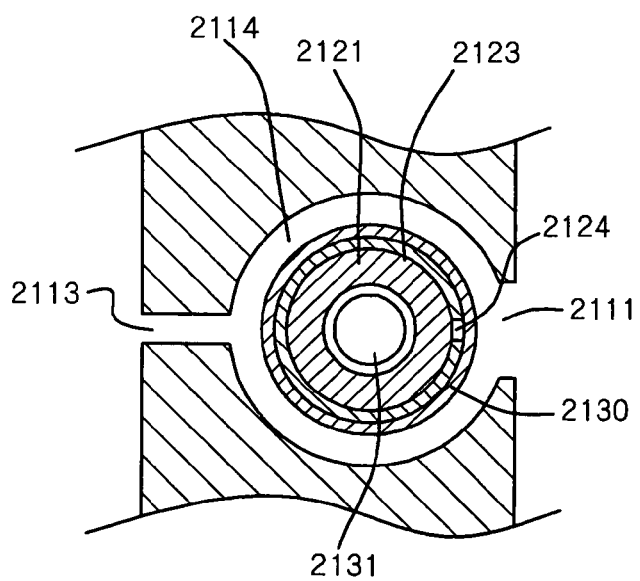

FIG. 23 is an exploded projection view of another modified plasma reactor 2100a, while FIGS. 24A and 24B are a partial cut-view and a partial enlarged cross-sectional view, respectively, of a multiple discharge chamber in which magnetic core 2121, core protecting tube 2130, a coolant supply pipe and primary winding 2123 are mounted.

Referring to the drawings, modified plasma reactor 2100a basically has the same constitution as plasma reactor 2100 described above, except for the following difference: plasma reactor 2100 has the structural feature that primary winding 2122 is wound around parts of magnetic core 2121 exposed outward reactor body 2110. Modified plasma reactor 2100 however, has structural feature that primary winding 2123 is mounted at part of magnetic core 2121 positioned inside core protecting tube 2130. Specifically, primary winding 2123 is a winding coil once wound around each loop of magnetic core 2121, and includes a tube-type conductive member. The tube-type conductive member includes insulation region 2124 with the electrically insulating material formed longitudinally, to prevent the eddy current.

Figure 25A:
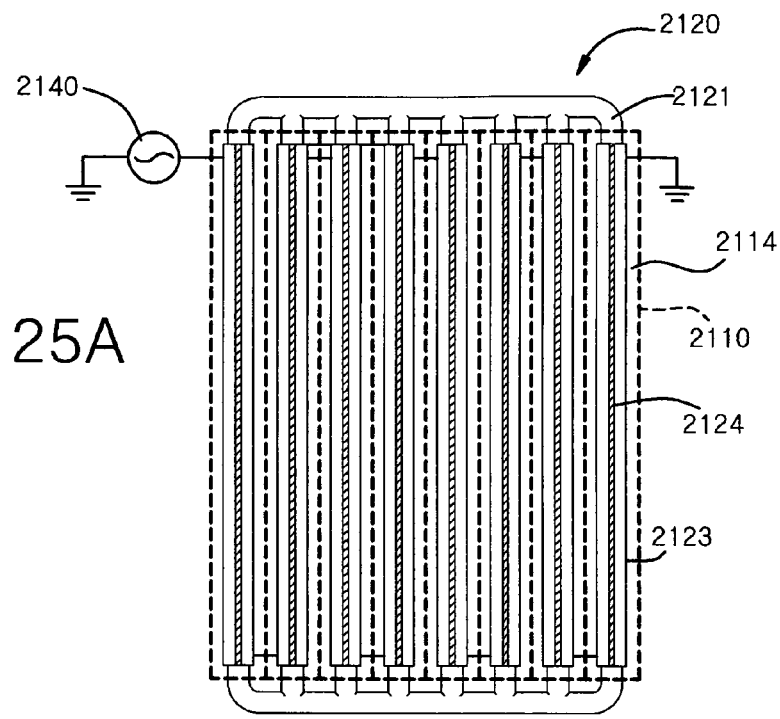
FIGS. 25A, 25B and 25C are schematic views illustrating examples of an electrical connection structure for a first power supply source and a primary winding.
Figure 25B:
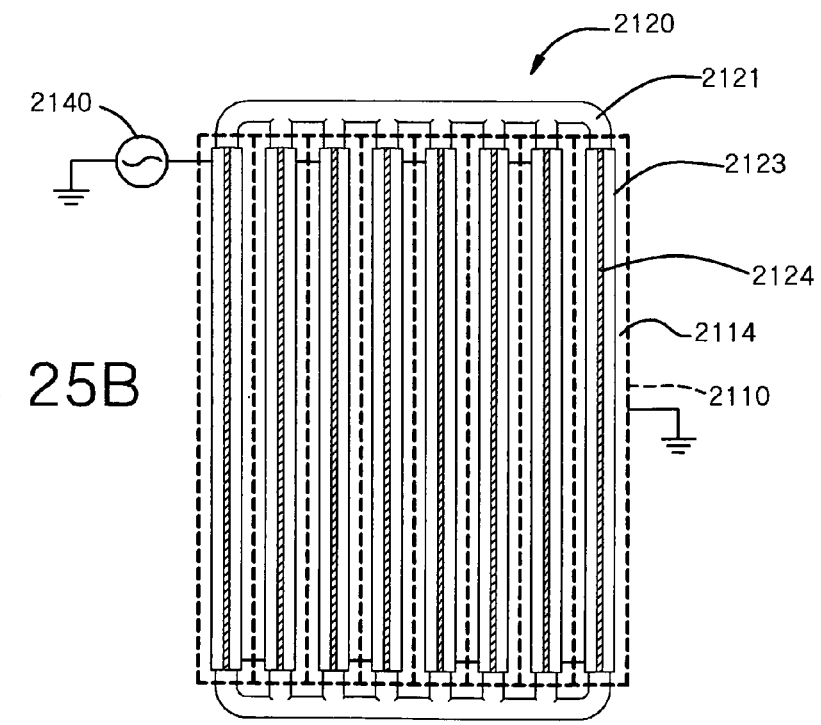
Figure 25C:
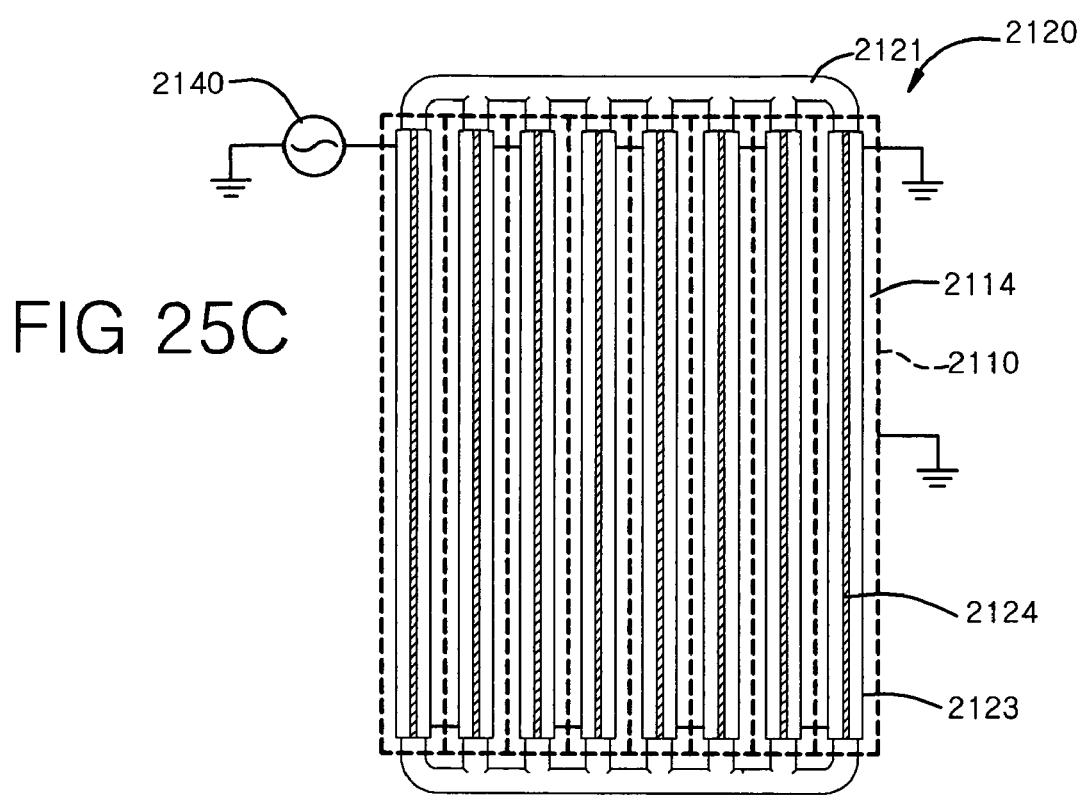

FIGS. 25A through 25C are examples of an electrical connection structure of first power supply source 2140 and primary winding 2123.

Referring to FIG. 25A, each primary winding 2123 of plasma reactor 2100a is positioned in each discharge chamber 2114, and is connected to first power supply source 2140 in series. The electrical connection method of primary winding 2123 and first power supply source 2140 may be selected from a series method, a parallel method, or a series/parallel combination method.

Referring to FIG. 25B, primary winding 2123 in plasma reactor 2100a is capable of a capacitive coupled electrode. For this purpose, reactor body 2110 is connected to ground. Primary winding 2123 is connected to first power supply source 2140 but not connected to ground. As shown in FIG. 25C, primary winding 2123 may be connected to ground.

Modified plasma reactor 2100a and plasma reactor 2100 are basically same as each other but are different with respect to their technical features of primary winding 2123. That is, in modified plasma reactor 2100a, primary winding 2123 acts as the primary winding of transformer 2120 and the electrode capacitively coupled with reactor body 2110. As a result, in modified plasma reactor 2100a, at the same time when the inductive coupled plasma is generated by transformer 2120, the capacitive coupled plasma is generated between plasma reactor 2100a and reactor body 2110.

Figure 26:
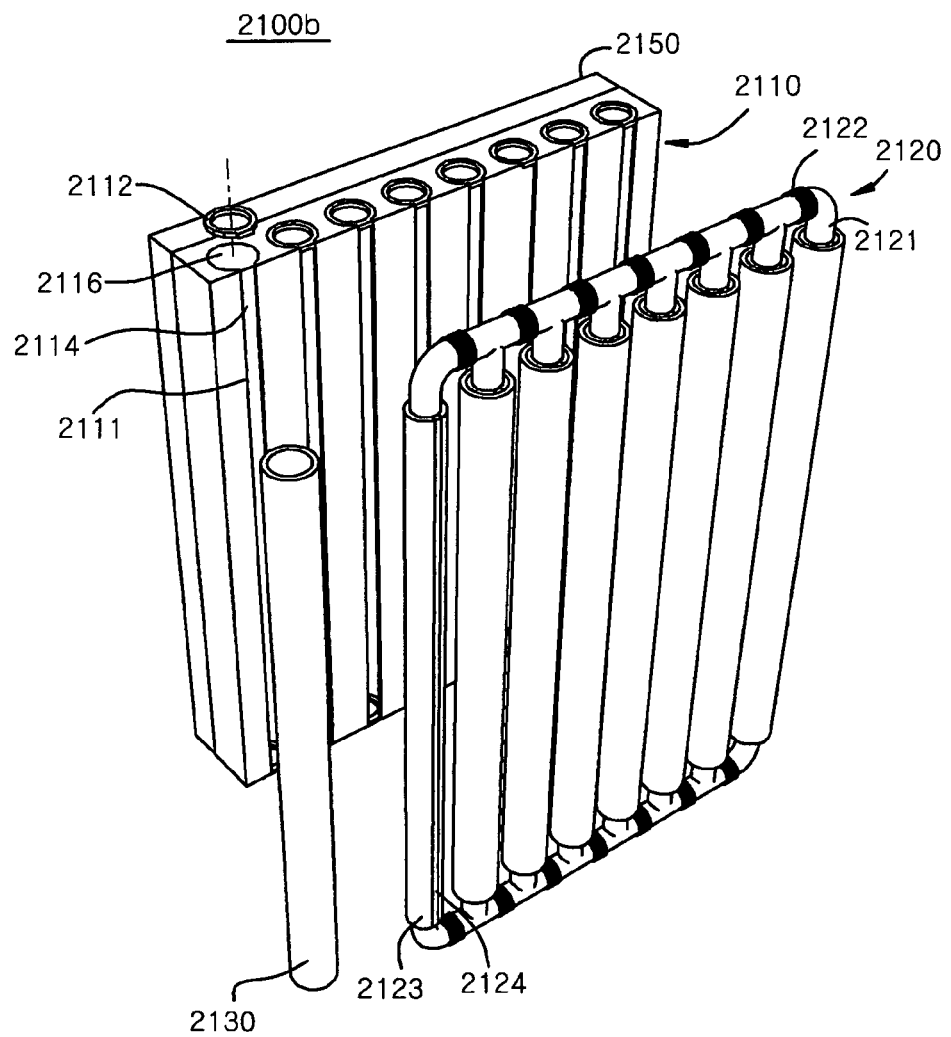
FIG. 26 is an exploded projection view illustrating another modified plasma reactor.

FIG. 26 is an exploded projection view of another modified plasma reactor 2100b.

Referring to FIG. 26, modified plasma reactor 2100b has the basically same constitution as plasma reactor 2100 described above. Modified plasma reactor 2100b, however, includes both primary winding 2122 (hereinafter, referred to as a 'first primary winding') of plasma reactor 2100 and primary winding 2123 (hereinafter, referred to as a 'second primary winding') of modified plasma reactor 2100a.

Figure 27A:
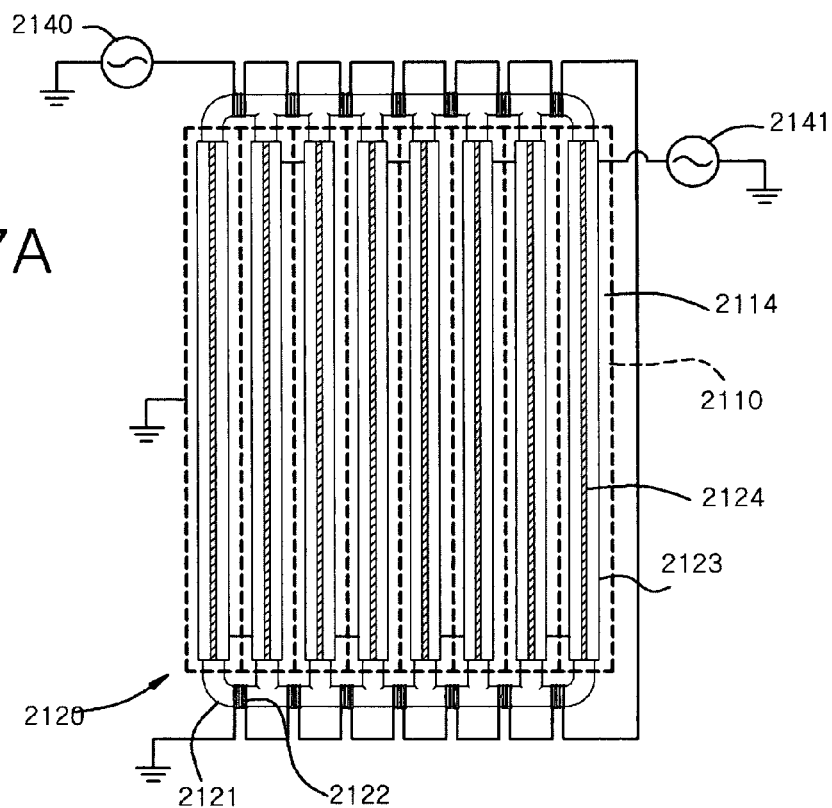
FIGS. 27A, 27B and 27C are schematic views illustrating an electrical connection structure of first and second power supply sources and a primary winding.
Figure 27B:
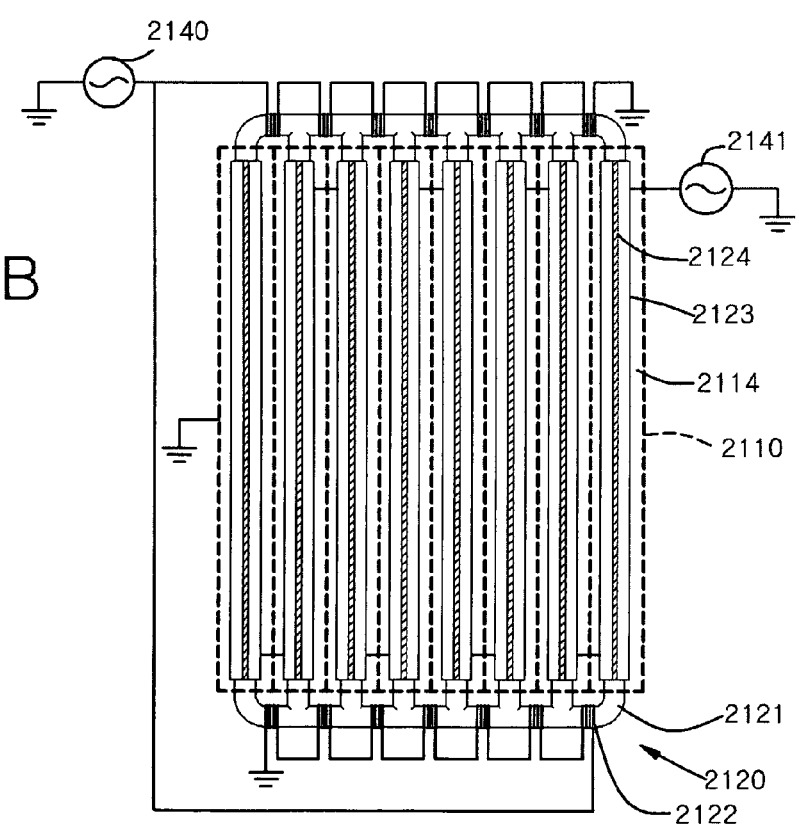

As shown in FIGS. 27A and 27B, second primary winding 2123 is connected to an additional second power supply source 2141. Second power supply source 2141 is an alternating current (AC) power supply source supplying the RF power. Although not shown in the drawings, an impedance matching box may be positioned at an output terminal of second power supply source 2141. Those skilled in this art, however, may understand that the RF power supply source capable of controlling the output voltage without a separate impedance matching box may be used.

Figure 27C:
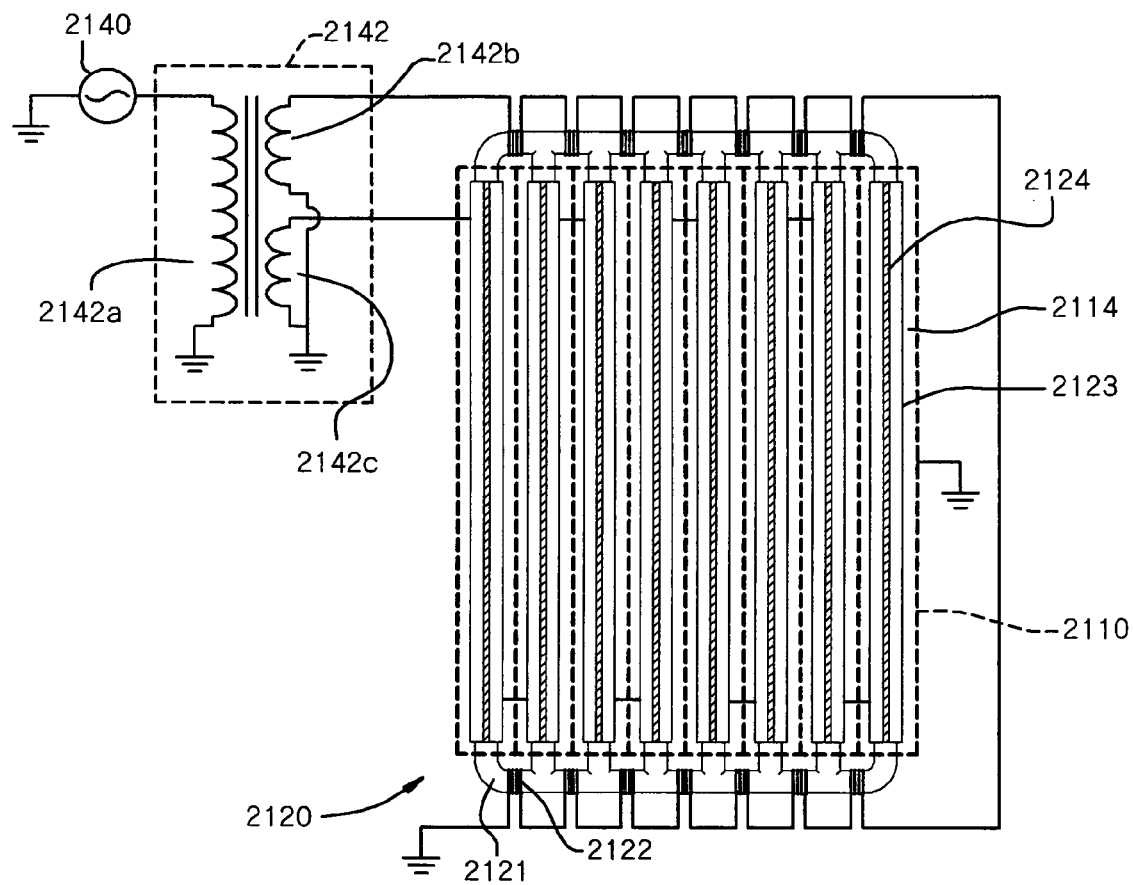

FIGS. 27A through 27C are examples of an electrical connection structure of first power supply source 2140 and second power supply source 2141 and a primary winding.

Referring to FIGS. 27A and 27B, first primary winding 2122 may be connected to first power supply source 2140 in series, or in parallel, or both in series and parallel, as described with respect to the first embodiment. Second primary winding 2123 may be also connected to second power supply sources 2141, 2140, in series, or in parallel, or both in series and parallel, as described with respect to the modified plasma reactor.

Referring to FIG. 27C, first and second primary windings 2122 and 2123 supply power by using first power supply source 2140 and power distributor 2142. Power distributor 2142 is formed by using the transformer. First winding 2142a of the transformer is connected to first power supply source 2140, and a secondary winding is divided into two windings 2142b and 2142c, which are connected to first and second primary windings 2122 and 2123, respectively. The winding ratio of divided secondary windings 2142b and 2142c may be fixed or variable.

In modified plasma reactor 2100b, second primary winding 2123 is capable of the capacitive coupled electrode as described above, and reactor body 2110 is connected to ground. Second primary winding 2123 may be connected to ground or may not be connected to ground.

As described above, the plasma reactor including a multiple discharge chamber according to the fourth embodiment of the present invention is capable of uniformly generating large-area high-density plasma. Specifically, in order to obtain large-area plasma in a desired form, a plasma reactor can be easily expanded by increasing the number and length of the discharge chambers. The plasma reactor can be structured to be very thin, thereby minimizing the equipment area. For example, when the plasma reactor is vertically positioned in a vertical plane or it may be horizontally positioned in a horizontal plane so as to form a multi layer structure, the equipment area does not largely increase and the processing volume per equipment area greatly increases.

Figure 28:
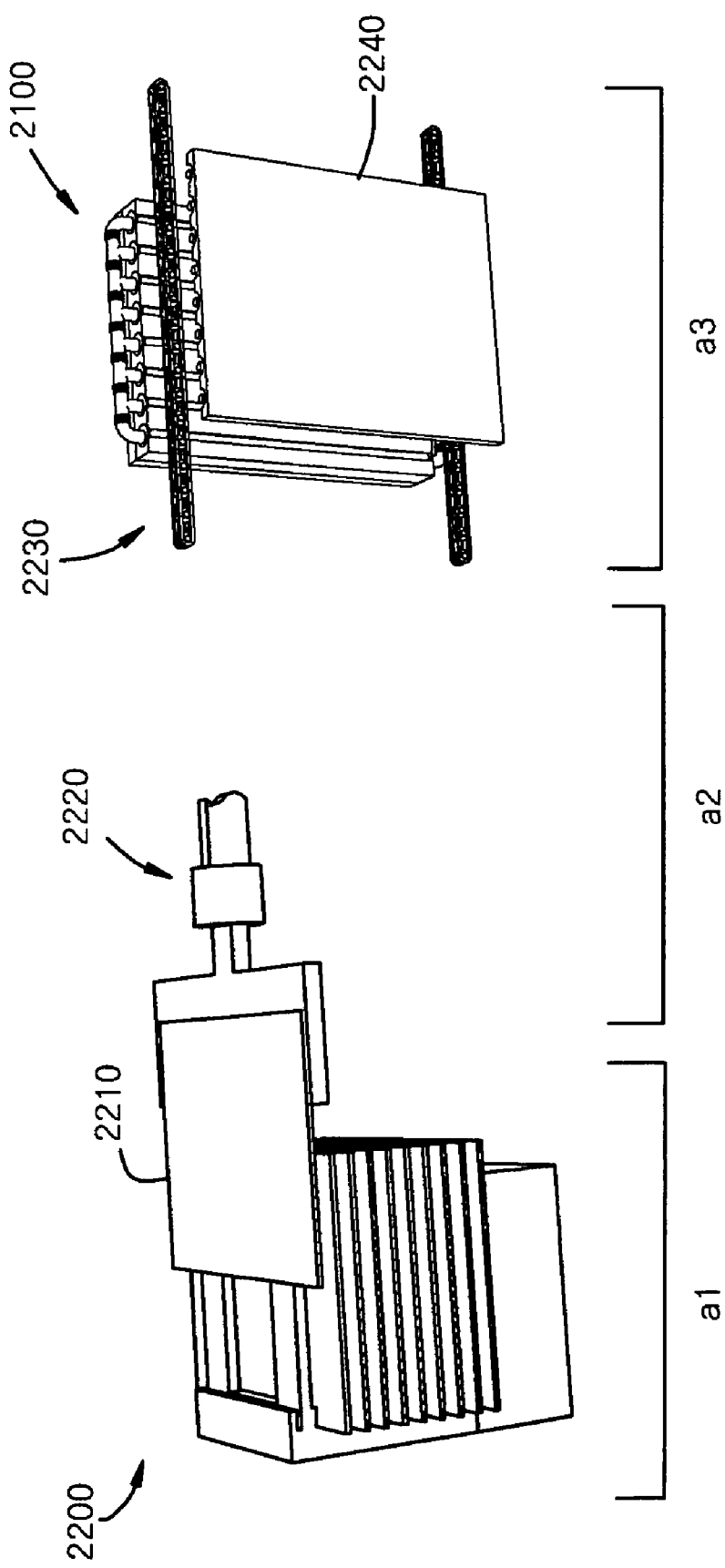
FIG. 28 is a schematic assembly view of an atmospheric pressure plasma processing system using a plasma reactor according to the fourth embodiment.
Figure 29B:
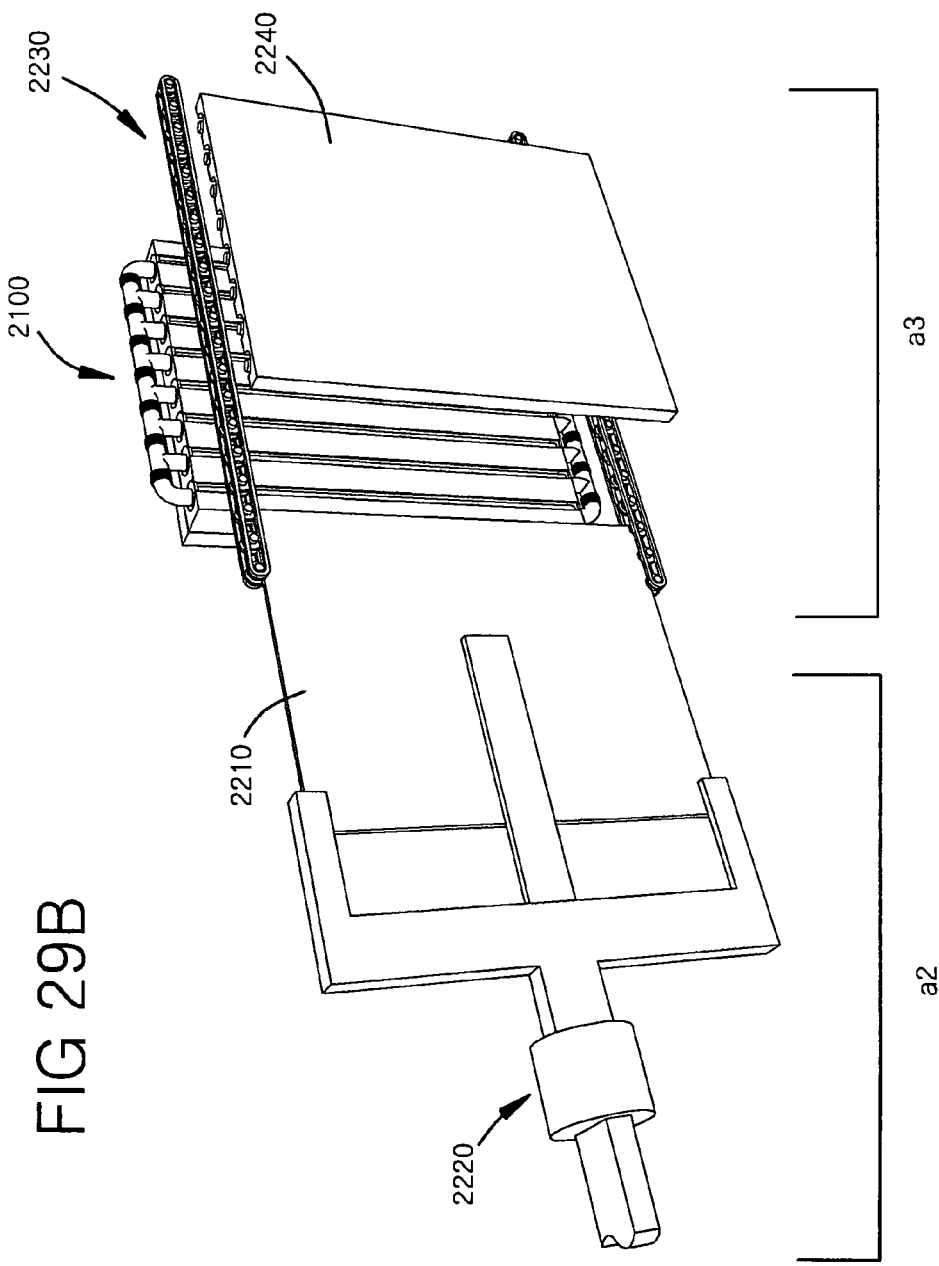

FIG. 28 is a schematic constitutional view of an atmospheric pressure plasma processing system using the plasma reactor according to the fourth embodiment, while FIGS. 29A through 29C are views sequentially illustrating a process of transferring a workpiece substrate in the atmospheric pressure plasma processing system.

Referring to the drawings, the atmospheric pressure plasma processing system performs plasma processing on a workpiece to be processed at atmospheric pressure, using plasma reactor 2100. In the atmospheric pressure plasma processing system, a first workpiece standby unit where workpiece 2210 is on standby is positioned at the front line, and atmospheric pressure processing unit a3 is positioned at the rear. First transfer unit a2 is positioned between the first workpiece standby unit a1 and atmospheric pressure processing unit a3.

The first workpiece standby unit a1 includes carrier 2200 in which workpiece 2210 is stacked and kept. Workpiece 2210 may be, for example, a glass substrate for manufacturing a liquid crystal display, or a large silicon wafer substrate. First transfer unit a2 includes first transfer robot 2220. In first transfer robot 2220, only one robot arm is simply illustrated for clarity. First transfer robot 2220 transfers workpiece 2210 between the first workpiece standby unit a1 and atmospheric pressure processing unit a3.

In atmospheric pressure processing unit a3, plasma reactor 2100 is vertically positioned and performs the plasma processing on workpiece 2210 at the atmospheric pressure by using the plasma jetting through plasma jet slits 2111. Atmospheric pressure processing unit a3 includes transfer means 2230 to vertically transfer workpiece 2210 in the front and the rear. Transfer means 2230 may be, for example, a conveyer system including a number of rollers, or any other transfer means not shown may be used.

Atmospheric pressure processing unit a3 may include preheating means 2240 to preheat workpiece 2210. Preheating means 2240 may include, for example, a number of halogen lamps and reflex shades. Preheating means 2240 may be positioned to face plasma reactor 2100, or it may be positioned between first transfer unit a2 and atmospheric pressure processing unit a3. Preheating means 2240 may act as a heater continuously heating workpiece 2210 during the plasma processing, if necessary.

Plasma reactor 2100 is vertically installed in atmospheric pressure processing unit a3. Workpiece 220 is vertically input into and output from the atmospheric pressure processing unit a3. For this purpose, first transfer robot 2220 positioned in first transfer unit a2 changes a position of workpiece 2210 from the horizontal to the vertical, as shown in FIG. 29A, and transfers workpiece 2210 to transfer means 2230 of atmospheric pressure unit a3 as shown in FIG. 29B. Transfer means 2230 then enters input workpiece 2210 to the front of plasma reactor 2100, as shown in FIG. 29C. Plasma reactor 2100 performs the plasma processing on workpiece 2210. When the plasma processing is completed, workpeice 2210 is transferred in reverse order, from atmospheric pressure processing unit a3 to first transfer unit a2. Processed workpiece 2210 is changed from its vertical position to its horizontal, by first transfer robot 2220, and is stacked in carrier 2200 of first workpiece standby unit a1.

Figure 30:
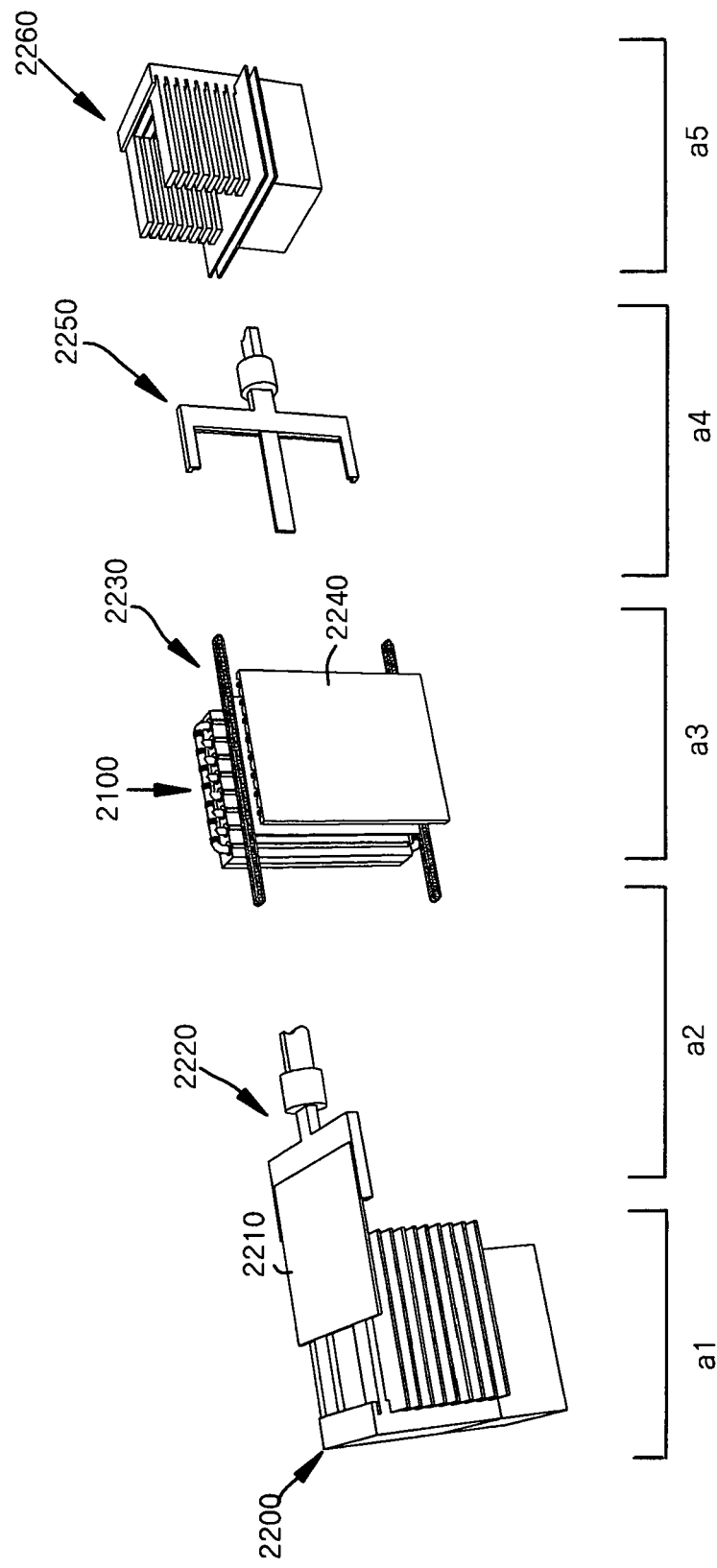
FIG. 30 is a schematic constitutional view of the atmospheric pressure plasma processing system operating on a First-In-Last-Out structure.

FIG. 30 is a schematic constitutional view of the atmospheric pressure plasma processing system in a First-In-Last-Out structure.

Referring to FIG. 30, the atmospheric pressure plasma processing system may have the First-In-Last-Out structure, by including first and second workpiece standby units a1 and a5 at the front of atmospheric pressure processing unit a3 and first and second transfer units a2 and a4 at the rear thereof. A workpiece which is not yet processed is on standby at first workpiece standby unit a1, and a workpiece which has been processed is on standby at second workpiece standby unit a5. First transfer robot 2220 positioned in first transfer unit a2 loads the workpiece to atmospheric pressure processing unit a3, and second transfer robot 2250 positioned in second transfer unit a4 unloads the workpiece from atmospheric pressure processing unit a3.

Figure 31:
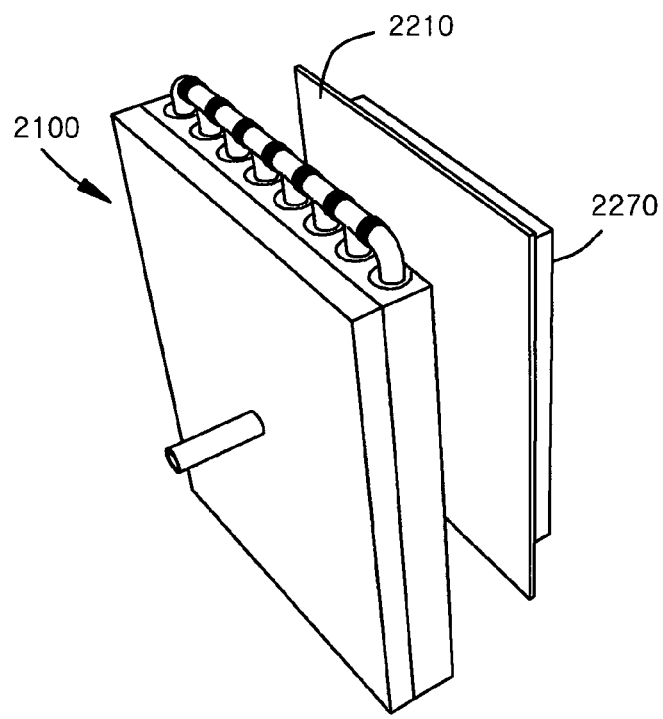
FIG. 31 is a projection view illustrating an atmospheric pressure processing unit including an electrostatic chuck.

FIG. 31 is an example of atmospheric pressure processing unit a3 including electrostatic chuck 2270.

Referring to FIG. 31, atmospheric pressure processing unit a3 may include electrostatic chuck 2270 as a fixing means to fix and support workpiece 2210 while the plasma processing is performed. Electrostatic chuck 2270 may include a heat inside.

Figure 32A:
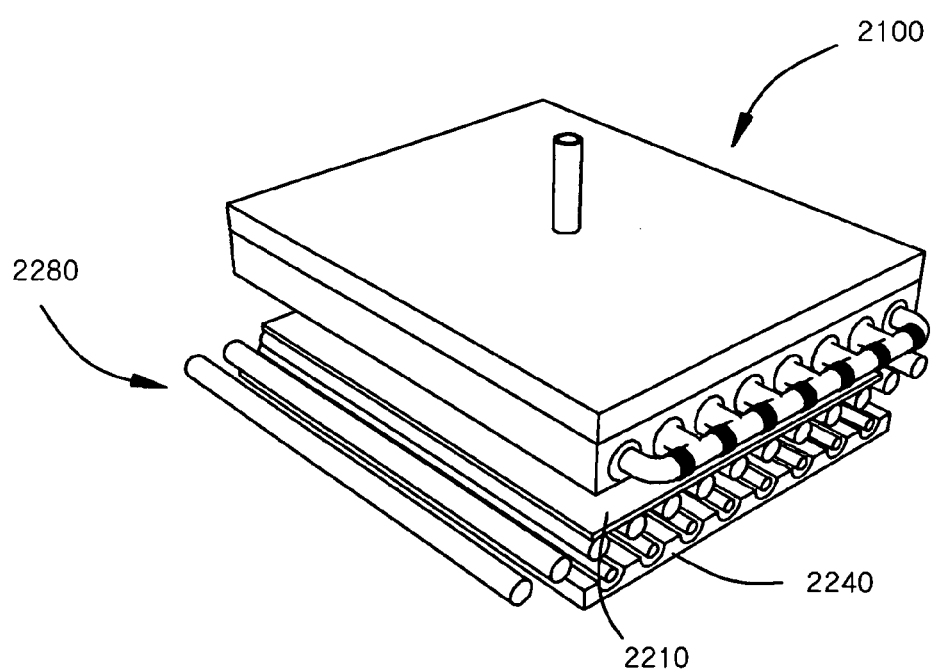
FIGS. 32A and 32B are projection views illustrating examples of a plasma reactor when horizontally positioned.
Figure 32B:
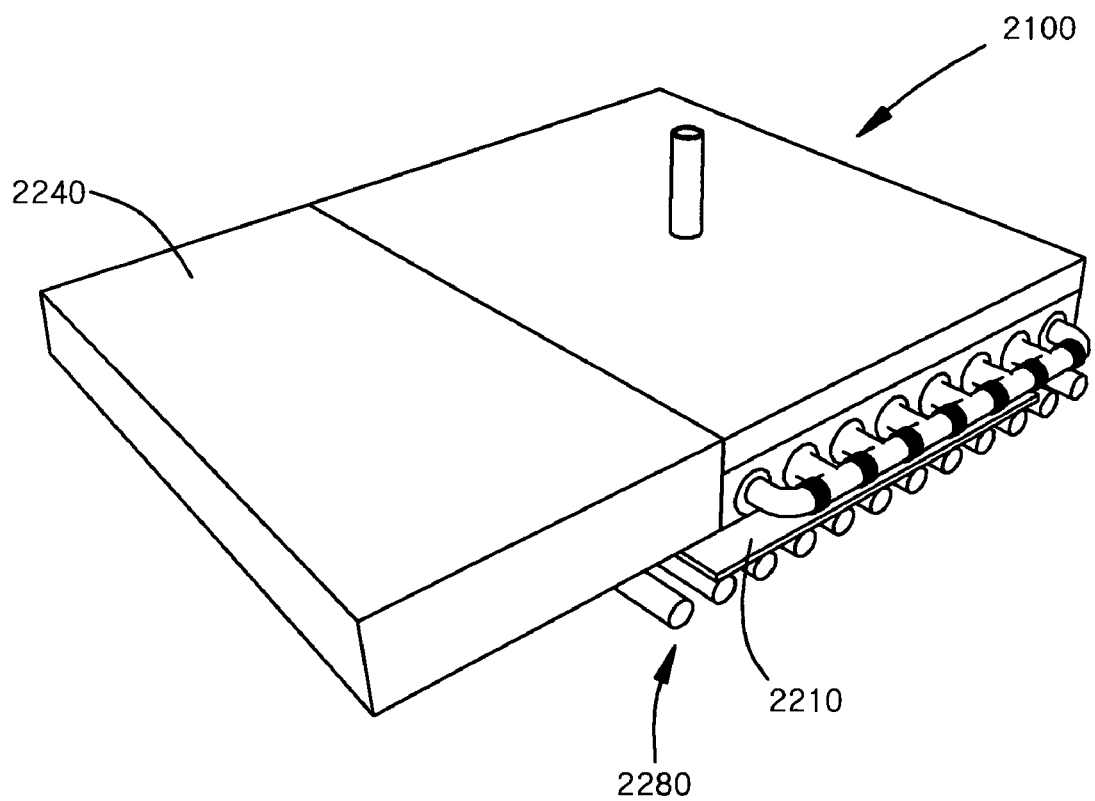

FIGS. 32A and 32B are examples of plasma reactor 2100 which is horizontally positioned.

Referring to FIGS. 32A and 32B, in atmospheric pressure plasma processing system, plasma reactor 2100 may be horizontally positioned at an atmospheric pressure processing unit a3. As shown in FIG. 32A, preheating means 2240 may be positioned to face plasma reactor 2100. Alternatively, as shown in FIG. 32B, preheating means 2240 may be positioned at the front of plasma reactor 2100. Transfer means 2280 may include a conveyer system with a number of horizontal rollers. In the atmospheric pressure plasma processing system, plasma reactor 2100 may be vertically or horizontally positioned.

Figure 33A:
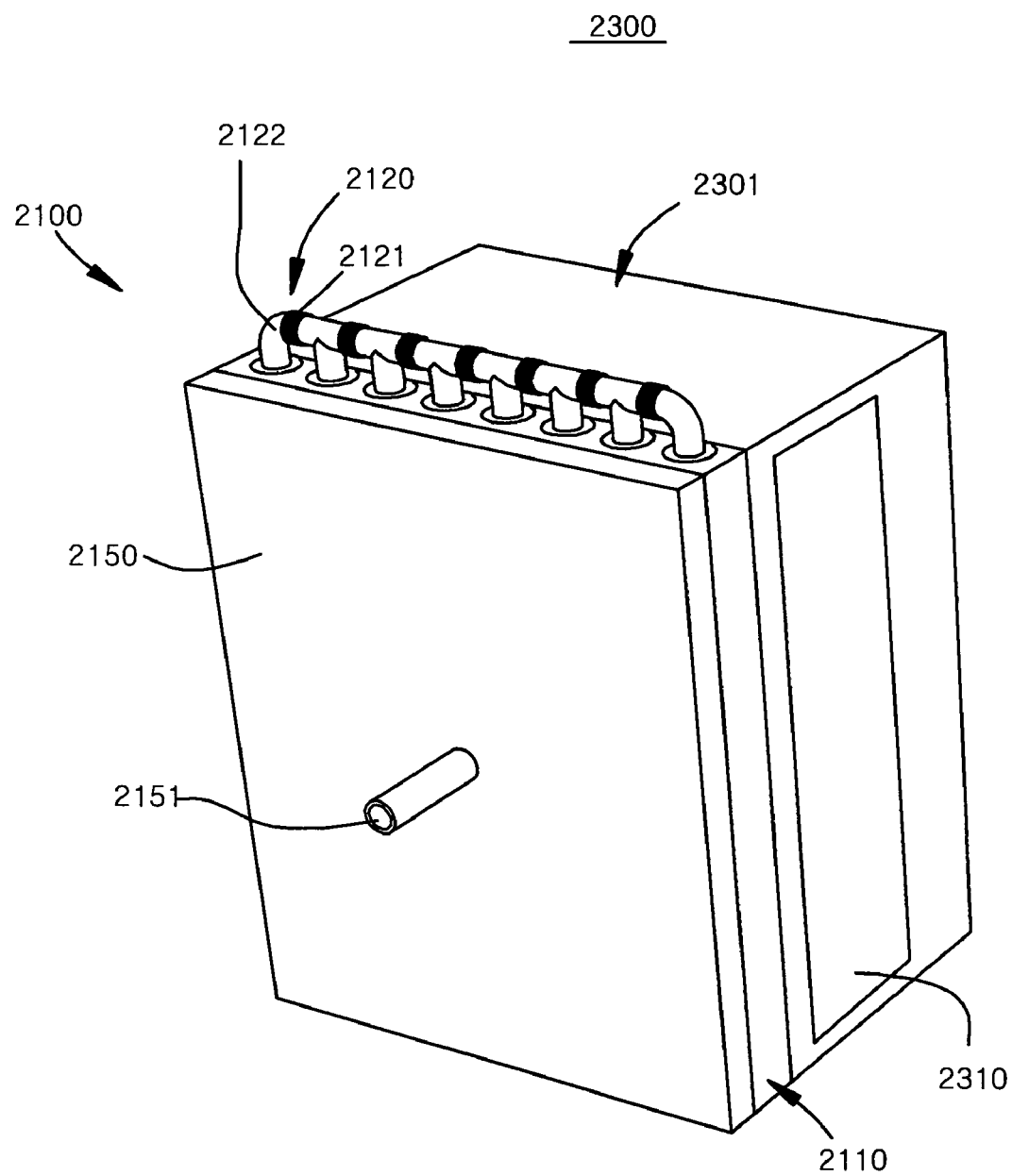
FIG. 33A is a projection view illustrating a plasma processing chamber using the plasma reactor according to the fourth embodiment.

FIG. 33A is a projection view of plasma processing chamber 2300 using the plasma reactor according to the fourth embodiment, and FIG. 33B is a cross-sectional view of the plasma processing chamber and a partial enlarged view of discharge chamber 2114.

Referring to FIGS. 33A and 33B, plasma processing chamber 2300 includes a plasma reactor 2100, gas supply unit 2150 supplying a gas to plasma reactor 2100, and chamber housing 2301 receiving plasma generated in plasma reactor 2100 and including substrate support 2320 inside.

In plasma processing chamber 2300, plasma jet slits 2111 of plasma reactor 2100 and substrate support 2320 are vertically positioned to face each other. As described below, workpiece substrate 2330 is vertically input into plasma processing chamber 2300 and is fixed to substrate support 2320, so that workpiece substrate 2330 is plasma-processed in its vertical position. Plasma processing chamber 2300 performs various plasma processes such as ashing to remove a photoresist by using the plasma, deposition of an insulation layer or metal layer, or etching, with respect to workpiece substrate 2330.

Although not specifically shown in the drawings, in plasma processing chamber 2300, plasma jet slits 2111 of plasma reactor 2100 and substrate support 2320 may be horizontally positioned to face each other. In this case, workpiece substrate 2330 is horizontally input into plasma processing chamber 2300 and fixed to substrate support 2320, so that workpiece substrate 2330 is plasma-processed in its horizontal position.

Gas supply unit 2150 is positioned at rear of a reactor body 2110. A number of discharge chambers 2114 include respective gas injection openings 2113. Although not shown in the drawings, a number of gas injection openings 2113 are formed, along the longitudinal direction of discharge chambers 2114. A gas input into gas entrance 2151 of gas supply unit 2150 is distributed along a gas distribution path with reference number 1153 marked as the arrows, and is evenly injected into discharge chambers 2114 through gas injection openings 2113. Although not specifically shown in the drawings, one or more gas separating partitions for gas distribution preferably are positioned in gas supply unit 2150.

FIG. 34 is a cross-sectional view of reactor body 2110$a$ having a separated gas supply structure.

Referring to FIG. 34, modified reactor body 2110$a$ may have a gas supply structure separated as two parts. For example, reactor body 2110$a$ includes first gas injection openings 2113 opened in plasma discharge chambers 2114, and second gas injection openings 2118 formed between two adjacent plasma discharge chambers 2114 and opened in the chamber housing.

The gas input through first gas injection openings 2113 passes through plasma discharge chambers 2114 and is exhausted through plasma jet slits 2111. The gas input through second gas injection openings 2118 is exhausted through gas jet openings 2119. The gas jetting through gas jet openings 2119 is ionized by the plasma gas output through plasma jet slits 2111. Although not shown in the drawing, gas supply unit 2150 includes separated gas supply paths which separately supply different gases to first injection opening 2113 and second gas injection opening 2118, and appropriate gas dividing partitions and gas entrance.

Figure 35:
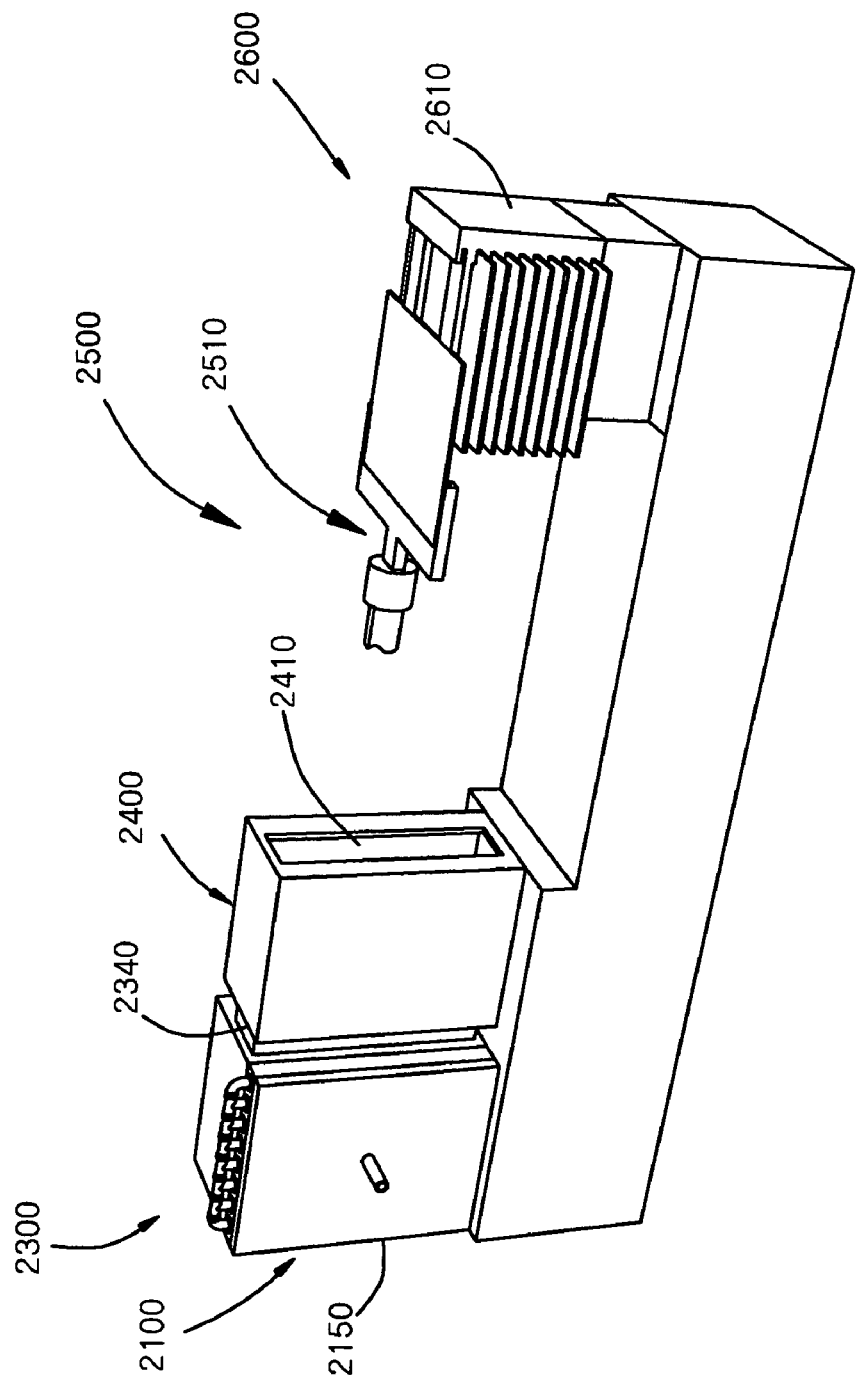
FIG. 35 is a projection view illustrating a plasma processing system.

FIG. 35 is a schematic constitutional view of a plasma processing system.

Referring to FIG. 35, the plasma processing system plasma-processes a workpiece substrate by using plasma processing chamber 2300. The plasma processing system includes loadlock chamber 2400 connected to plasma processing chamber 2300. Loadlock chamber 2400 is connected to transfer chamber 2500. Workpiece substrate standby chamber 2600 is positioned at the front of transfer chamber 2500. Workpiece substrate standby chamber 2600 includes carrier 2610 where workpiece 2210 is stacked and kept. Workpiece 2210 may be, for example, a glass substrate for manufacturing a liquid crystal display, or a large silicon wafer substrate.

Slit valve 2340 is positioned between loadlock chamber 2400 and plasma processing chamber 2300. Slit valve 2340 has a structure of opening and closing substrate entrance 2412 (not shown) of loadlock chamber 2400 and substrate entrance 2310 (not shown) of plasma processing chamber 2300. Loadlock chamber 2400 includes another substrate entrance 2410 toward transfer chamber 2500, and substrate entrance 2410 is opened and closed by another slit valve. When the workpiece substrate is transferred from and to plasma processing chamber 2300, loadlock chamber 2400 maintains the same vacuum state as the inside of plasma processing chamber 2300. When the workpiece substrate is transferred from and to transfer chamber 2500, loadlock chamber 2400 maintains the atmospheric pressure state.

Loadlock chamber 2400 includes first transfer robot 2420 transferring the workpiece substrate between the plasma processing chamber and loadlock chamber 2400. Transfer chamber 2500 includes seond transfer robot 2510 transferring the substrate between workpiece substrate standby chamber 2600 and loadlock chamber 2400.

Figure 36A:
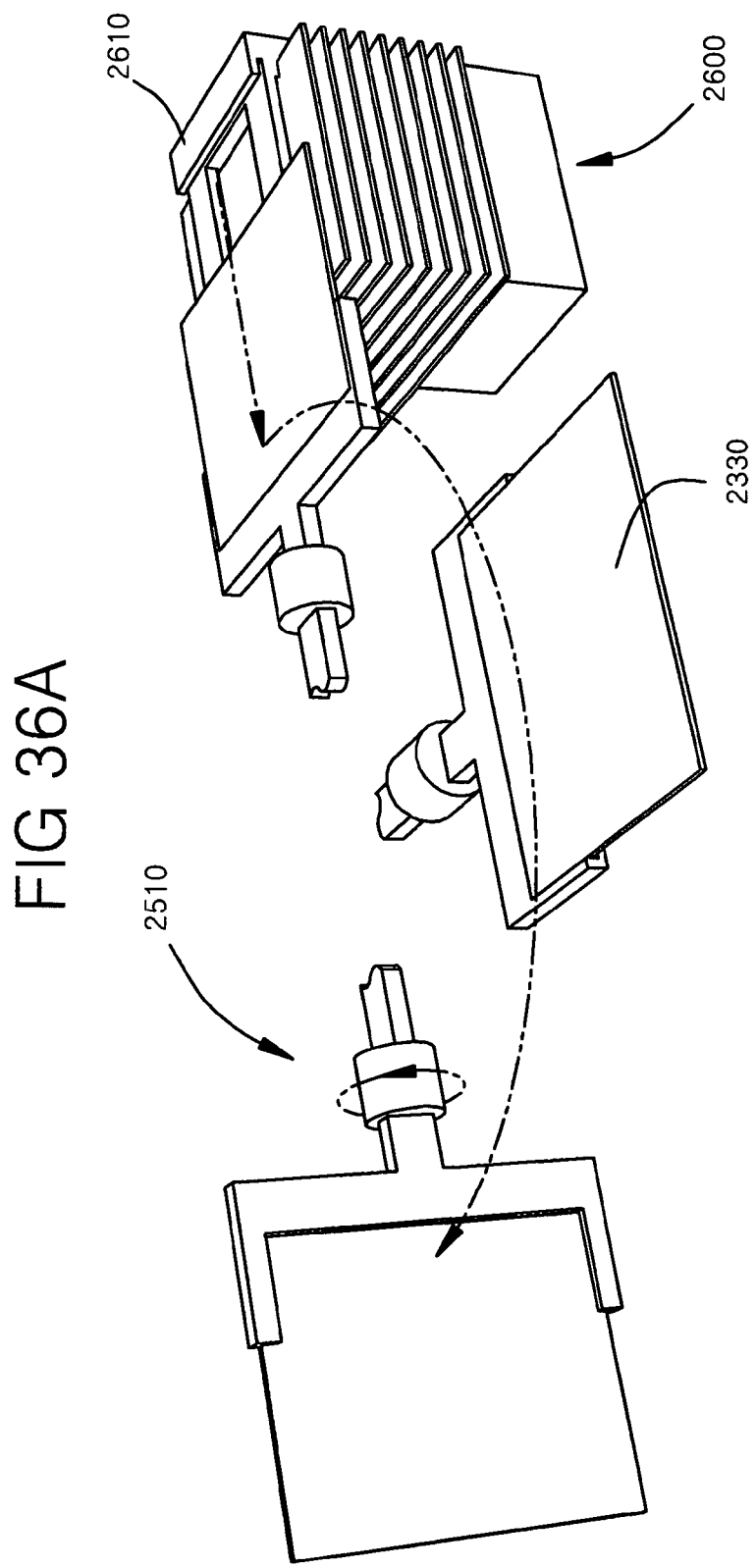
FIGS. 36A, 36B and 36C are a series of projection views sequentially illustrating a process of transferring a work substrate in a plasma processing system.
Figure 36B:
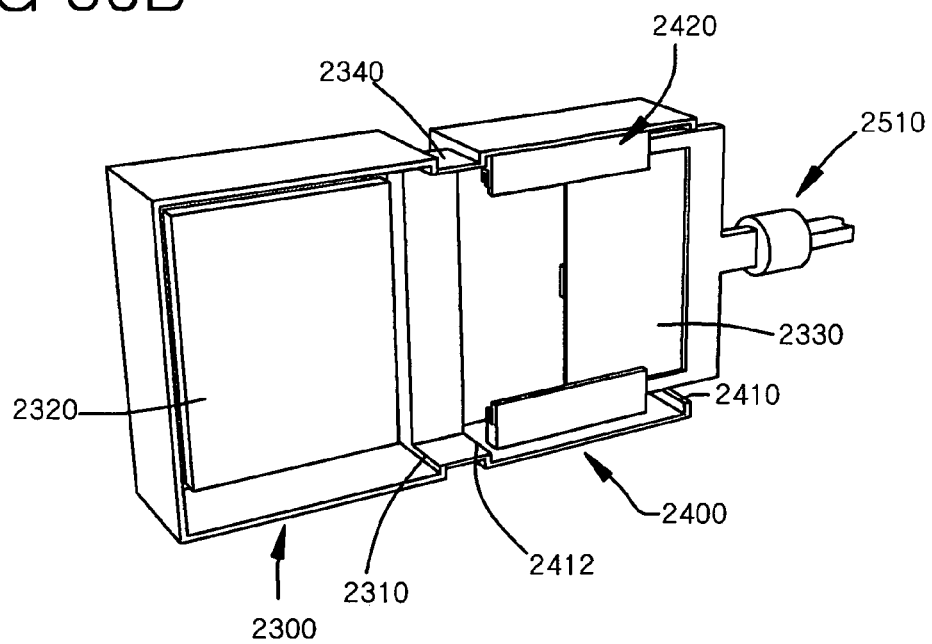
Figure 36C:
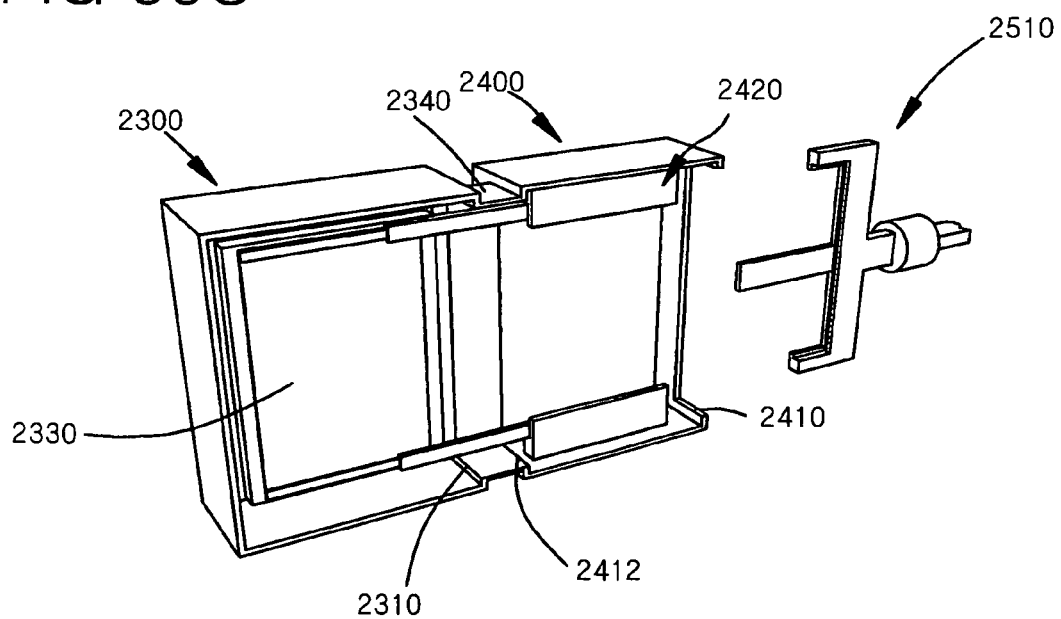

FIGS. 36A through 36C are views sequentially illustrating a process of transferring workpiece substrate 2330 in a plasma processing system.

Referring to FIGS. 36A through 36C, second transfer robot 2510 transfers workpiece substrate 2330 loaded in carrier 2610 to first transfer robot 2420. In this regard, second transfer robot 2420 changes a position of workpiece substrate 2330 from the horizontal to the vertical, and transfers it to first transfer robot 2420.

First transfer robot 2420 transfers workpiece substrate 2330 vertically positioned to substrate support 2320 of plasma processing chamber 2300. Substrate support 2320 fixes workpiece substrate 2330 during the plasma process. First transfer robot 2420 may include two double arms to exchange two sheets, i.e., the workpiece substrates before and after the plasma process. Second transfer robot 2510 may include two double arms to exchange and transfer two sheets, i.e., the workpiece substrates before and after the plasma process, to loadlock chamber 2400.

Substrate supports 2320 includes a fixing means to fix the substrate, for example, an electrostatic chuck, or any other fixing means. The substrate support may include a heater as a heating means to heat the workpiece substrate. Or a light-heating means may be positioned inside the chamber housing, so that the workpiece substrate is heated by light emission. It is apparent that plasma processing chamber 2300 may additionally include necessary components for the intended plasma processing on the workpiece substrate.

Loadlock chamber 2400 may additionally include any necessary constitution for preheating workpiece substrate 2330 before it is transferred to plasma processing chamber 2300 and/or for cooling the heated substrate after the plasma processing is completed.

The plasma processing system may include another loadlock chamber, another transfer chamber and another workpiece substrate standby chamber which are symmetrically positioned around plasma processing chamber 2300. That is, the plasma processing system may have the First-In-Last-Out structure, in which the workpiece substrate to be process is loaded to plasma processing chamber 2300 at the front of plasma processing chamber 2300, and the processed workpiece substrate is unloaded at the rear of plasma processing chamber 2300.

In the plasma processing chamber including the plasma reactor with multiple discharge chambers, and in the plasma processing system using the same according to the embodiments of the present invention, the plasma reactor uniformly generates large-area high-density plasma. Specifically, to obtain large-area plasma in a desired form, a plasma reactor can be easily expanded by increasing the number and length of discharge chambers. The plasma reactor can be constituted to be very thin so as to minimize the equipment area. For example, when the plasma reactor is vertically stood and positioned, or it is horizontally positioned to form a multiple structure, the equipment area is not expanded largely and the processing volume per equipment area is greatly increased.

The plasma source with discharge inducing bridges and the plasma processing system using the same in accordance with the embodiments of the present invention may be variously modified and have different shapes. Thus, while the present invention has been particularly shown and described with reference to exemplary embodiments thereof, it will be understood by those of ordinary skill in the art, that various changes in form and details may be made therein without departing from the spirit and scope of the present invention as defined by the following claims.

What is claimed is:

1. A plasma reactor, comprising:
    a reactor body comprising a plurality of discharge chambers;
    a plurality of plasma jet slits formed in the reactor body, along the discharge chambers;
    a transformer comprising:
        a magnetic core connected to the discharge chambers; and
        a primary winding;
    a plurality of core protecting tubes configured to surround and protect the magnetic core positioned inside the discharge chambers; and
    a primary power supply source electrically connected to the primary winding and configured to:
        provide an electrical current through the primary winding by the first power supply source;
        form inductive coupled plasma around the core protecting tubes; and
        induce an AC potential inside the discharge chambers, to complete a secondary circuit of the transform.

2. The plasma reactor according to claim 1, wherein the reactor body comprises a metal material.

3. The plasma reactor according to claim 1, wherein the reactor body comprises an electrically insulating material.

4. The plasma reactor according to claim 1, wherein the discharge chambers comprise discharge separating partitions positioned inside each discharge chamber, the discharge separating partitions being configured to divide the inside of the respective discharge chamber into two or more discharge regions.

5. The plasma reactor according to claim 1, wherein the magnetic core comprises a closed core with one or more single loops.

6. The plasma reactor according to claim 1, wherein the magnetic core comprises a closed core with a multiple loop.

7. The plasma reactor according to claim 1, wherein:
    each winding coil comprises a tube-type conductive member surrounding the magnetic core portion positioned inside each discharge chamber; and
    the tube-type conductive member comprises an electrically insulating material.

8. The plasma reactor according to claim 1, wherein the reactor body is electrically grounded.

9. The plasma reactor according to claim 1, further comprising a capacitive coupled electrode positioned inside each discharge chamber.

10. The plasma reactor according to claim 9, wherein:
    the capacitive coupled electrode comprises a tube-type conductive member surrounding the magnetic core portion on the whole; and
    the tube-type conductive member comprises an insulation region.

11. The plasma reactor according to claim 9, further comprising a second power supply source electrically connected to the capacitive coupled electrode.

12. The plasma reactor according to claim 9, further comprising a power distributor configured to supply electrical power to the primary winding and the capacitively coupled electrode by dividing power input from the primary power supply source into the primary winding and the capacitive coupled electrode.

13. The plasma reactor according to claim 1, wherein the core protecting tube comprises an electrically insulating material.

14. The plasma reactor according to claim 1, wherein the core protecting tube comprises:
    a metal material; and
    an electrically insulating material configured to form an electrical discontinuity.

15. The plasma reactor according to claim 1, wherein the reactor body comprises a cooling channel.

16. The plasma reactor according to claim 1, wherein the magnetic core comprises:
    a hollow region formed along a center of the magnetic core; and
    a cooling channel comprising the hollow region of the magnetic core.

17. The plasma reactor according to claim 1, further comprising a cooling channel positioned to surround an outside of the magnetic core.

18. The plasma reactor according to claim 1, wherein the reactor body comprises:
    a plurality of gas injection nozzles oriented toward the discharge chambers; and
    a gas supply unit configured to supply gas through the nozzles.

19. A plasma processing system, comprising:
    a plasma processing chamber, comprising:
        a plasma reactor comprising a reactor body comprising a plurality of discharge chambers;
        a plurality of plasma jet slits formed on the reactor body, along the discharge chambers;
        a transformer comprising:
            a magnetic core connected to the discharge chambers; and
            a primary winding;
        a core protecting tube configured to surround and protect the magnetic core, the core being positioned inside the discharge chamber;
        a primary power supply source electrically connected to the primary winding; and
        a chamber housing configured to receive a plasma output through the plasma jet slits, the chamber housing comprising a substrate support disposed to receive bias power;

a loadlock chamber connected to the plasma processing chamber;

a first transfer robot positioned in the loadlock chamber and configured to transfer the workpiece substrate between the plasma processing chamber and the loadlock chamber;

a transfer chamber connected to the loadlock chamber;

a workpiece substrate standby chamber configured to maintain the workpiece substrate during standby, the workpiece substrate being connected to the transfer chamber; and a second transfer robot positioned and configured to transfer the substrate between the workpiece substrate standby chamber and the loadlock chamber.

20. The plasma processing system according to claim 19, wherein:

the plasma processing chamber is vertically positioned such that the plasma jet slits of the plasma reactor are directed toward the substrate support; and the workpiece substrate is configured to be vertically input to the loadlock chamber and the plasma processing chamber.

21. The plasma processing system according to claim 19, wherein:

the plasma processing chamber is horizontally positioned such that the plasma jet slits of the plasma reactor are directed toward the substrate support; and the workpiece substrate is configured to be horizontally input to the loadlock chamber and the plasma processing chamber.

22. The plasma processing system according to claim 19, wherein the second transfer robot is disposed to convert a position of the workpiece from horizontal to vertical, and from vertical to horizontal.

* * * * *